US006731343B2

(12) United States Patent
Yoneno

(10) Patent No.: US 6,731,343 B2
(45) Date of Patent: May 4, 2004

(54) METHOD AND APPARATUS FOR ADJUSTING DOT CLOCK SIGNAL

(75) Inventor: Kunio Yoneno, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/975,150

(22) Filed: Oct. 12, 2001

(65) Prior Publication Data

US 2002/0054238 A1 May 9, 2002

Related U.S. Application Data

(62) Division of application No. 09/166,421, filed on Oct. 5, 1998, now Pat. No. 6,304,296, which is a division of application No. 08/804,069, filed on Feb. 21, 1997, now Pat. No. 6,115,075.

(30) Foreign Application Priority Data

| Feb. 22, 1996 | (JP) | ............................................. | 8-035247 |
| Aug. 23, 1996 | (JP) | ............................................. | 8-222564 |
| Sep. 5, 1996 | (JP) | ............................................. | 8-235617 |
| Feb. 14, 1997 | (JP) | ............................................. | 9-047327 |

(51) Int. Cl.[7] ................................................. H03L 7/00
(52) U.S. Cl. ...................................... 348/537; 348/538
(58) Field of Search ................................ 348/536, 537, 348/538, 540, 542, 543, 558, 556, 555, 554, 539, 571, 572, 914

(56) References Cited

U.S. PATENT DOCUMENTS

| 4,291,332 A | * | 9/1981 | Kato et al. ................... 348/539 |
| 4,635,097 A | * | 1/1987 | Tatami ........................ 348/539 |
| 4,780,759 A | * | 10/1988 | Matsushima et al. ....... 348/537 |

(List continued on next page.)

FOREIGN PATENT DOCUMENTS

| EP | 0 303 494 | 2/1989 |
| EP | 0 522 181 A1 | 1/1993 |
| EP | 0 577 841 A1 | 1/1994 |

(List continued on next page.)

OTHER PUBLICATIONS

IBM Technical Disclosure bulletin, "Automatic Phase Adjustment", Vol 37, No. 5, May 1994, pp. 203–204.*
IBM Technical Disclosure bulletin, "Automatic Horizontal Centering Adjustment", Vol 37, No. 5, May 1994, pp. 551–552.*
IBM Technical Disclosure Bulletin, vol. 37, No. 05, pp. 203 to 204, "Automatic Phase Adjustment", May 1994.
IBM Technical Disclosure Bulletin, "Automatic Phase Adjustment," vol. 37, No. 5, May, 1994, p. 203.
IBM Technical Disclosure Bulletin, "Automatic Horizontal Centering Adjustment," vol. 37, No. 5, May, 1994, p. 551.

*Primary Examiner*—Victor R. Kostak
(74) *Attorney, Agent, or Firm*—Oblon, Spivak, McClelland, Maier & Neustadt, P.C.

(57) ABSTRACT

The present invention provides a technique for appropriately adjusting a dot clock for video signals by a simple process. A process of adjusting a phase of the dot clock first obtains two image data by two dot clocks having different phases, carries out a certain operation for the two image data to calculate a phase-related index representing the relative phase of the dot clock to a video signal with respect to the two image data, and determines a delay that gives a desirable phase to the dot clock based on these phase-related indexes. A first process of adjusting the frequency of the dot clock first obtains image data by a dot clock that has been generated with a provisional factor, calculates a length of an effective signal area on one line of the image data, and determines a desirable factor based on the ratio of a known length to the measured length of the effective signal area. A second process of adjusting the frequency of the dot clock extracts a beat component included in the sampled image data to determine the difference between a provisional factor and a desirable factor.

33 Claims, 42 Drawing Sheets

U.S. PATENT DOCUMENTS

| | | | | |
|---|---|---|---|---|
| 4,922,118 A | * | 5/1990 | Maeshima | 348/458 |
| 4,998,169 A | * | 3/1991 | Yoshioka | 348/537 |
| 5,223,930 A | * | 6/1993 | Zato | 348/478 |
| 5,396,295 A | * | 3/1995 | Furuta | 348/537 |
| 5,404,173 A | * | 4/1995 | Parrish et al. | 348/537 |
| 5,539,473 A | * | 7/1996 | Kommrusch et al. | 348/537 |
| 5,657,089 A | * | 8/1997 | Onagawa | 348/537 |
| 5,717,469 A | * | 2/1998 | Jennes et al. | 348/571 |
| 5,731,843 A | * | 3/1998 | Cappels, Sr. | 348/537 |
| 5,764,299 A | * | 6/1998 | Jennes et al. | 348/500 |
| 5,786,866 A | * | 7/1998 | Sani et al. | 348/520 |
| 5,940,136 A | * | 8/1999 | Abe et al. | 348/537 |
| 5,959,691 A | * | 9/1999 | Koh | 348/581 |
| 5,978,040 A | * | 11/1999 | Diamant | 348/556 |
| 5,990,968 A | * | 11/1999 | Naka et al. | 348/537 |
| 6,005,557 A | * | 12/1999 | Wong | 345/204 |
| 6,097,440 A | * | 8/2000 | Omori et al. | 348/542 |

FOREIGN PATENT DOCUMENTS

| | | |
|---|---|---|
| EP | 0 577 841 | 1/1994 |
| EP | 0662 680 A1 | 7/1995 |
| JP | 1-237689 | 9/1989 |
| JP | 1-270470 | 10/1989 |
| JP | 2-124691 | 5/1990 |
| JP | 3-295367 | 12/1991 |
| JP | 4-96093 | 3/1992 |
| JP | 4-276791 | 10/1992 |
| JP | 4-291390 | 10/1992 |
| JP | 5-66752 | 3/1993 |
| JP | 5-199481 | 8/1993 |
| JP | 5-204329 | 8/1993 |
| JP | 5-347768 | 12/1993 |
| JP | 6-282349 | 10/1994 |
| JP | 7-56553 | 3/1995 |
| JP | 7-135633 | 5/1995 |
| JP | 7-175437 | 7/1995 |
| JP | 7-212616 | 8/1995 |
| JP | 7-219485 | 8/1995 |

* cited by examiner

Fig. 17

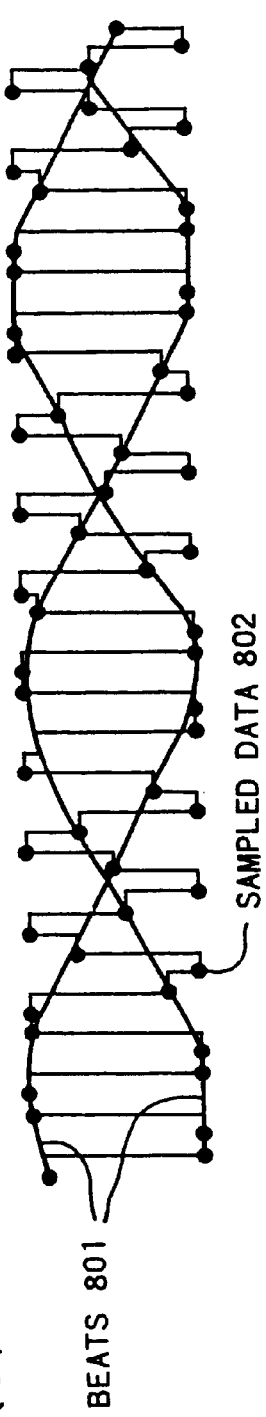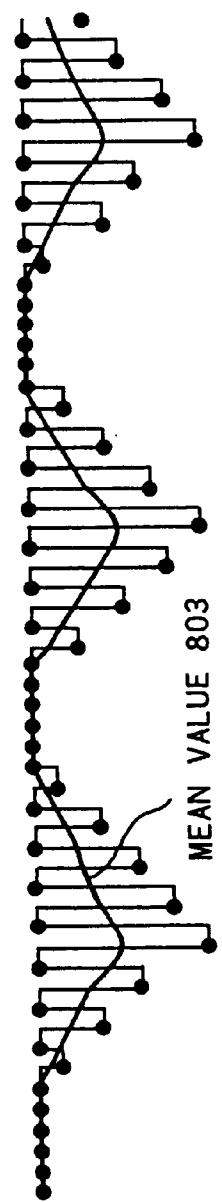
Fig. 25(a)
Fig. 25(b)

Fig. 34(a)  PD (AD)  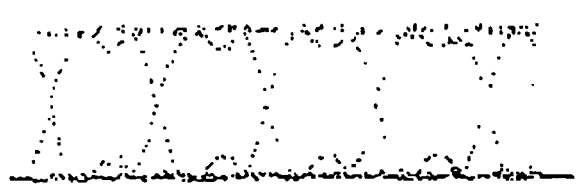
Fig. 34(b)  PE (AD)  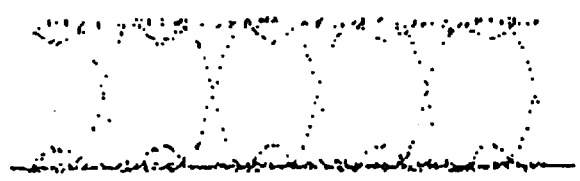
Fig. 34(c)  A (AD)  
Fig. 34(d)  B (AD)  
Fig. 34(e)  C (AD)  
Fig. 34(f)  Q1 (AD)  
Fig. 34(g)  Q2 (AD)  

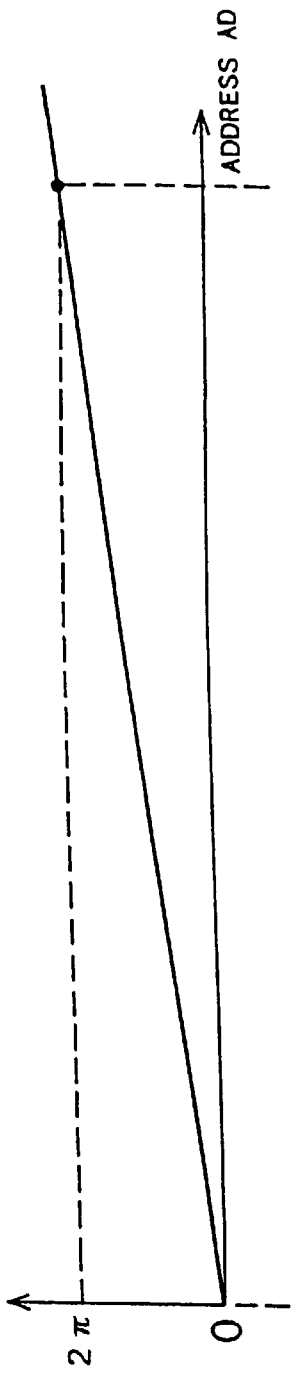
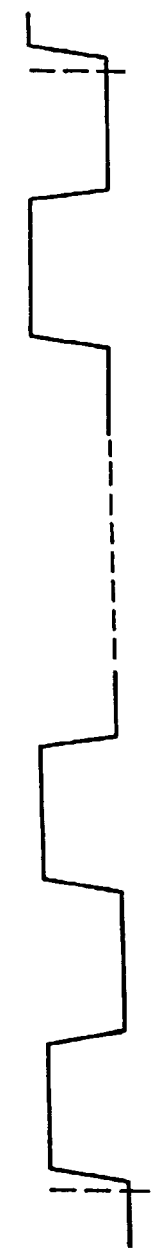
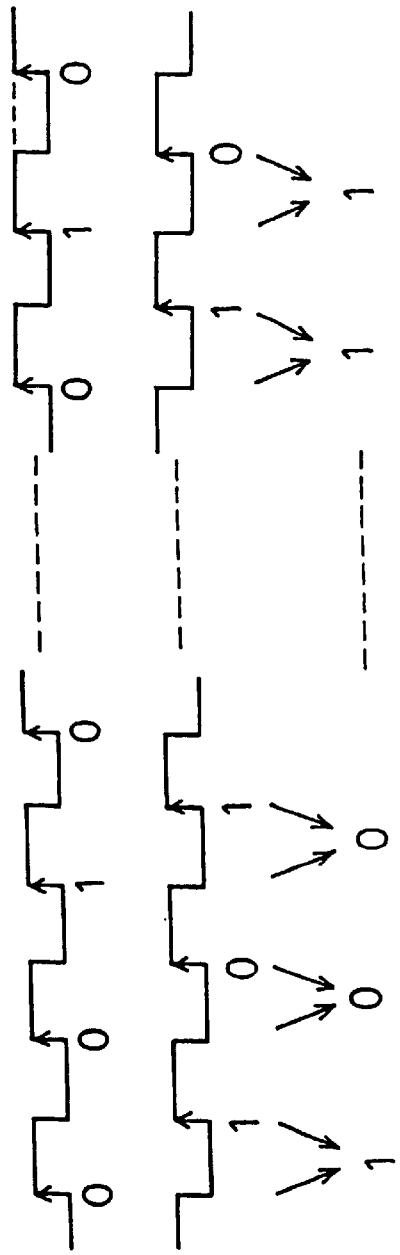
FIG. 37A PHASE DEVIATION
FIG. 37B VIDEO SIGNAL 101
FIG. 37C SAMPLING OF BINARY DATA PF(AD)
FIG. 37D SAMPLING OF BINARY DATA PG(AD)
FIG. 37E EX-OR

Fig. 38

INVERTING POINTS OF Q2 (AD)

| NUMBER | INVERTING ADDRESS |
|--------|-------------------|
| #1     | 62                |
| #2     | 87                |
| #3     | 173               |
| #4     | 264               |
| #5     | 348               |
| #6     | 430               |
| #7     | 511               |
| #8     | 605               |
| #9     | 680               |
| #10    | 779               |
| #11    | 853               |

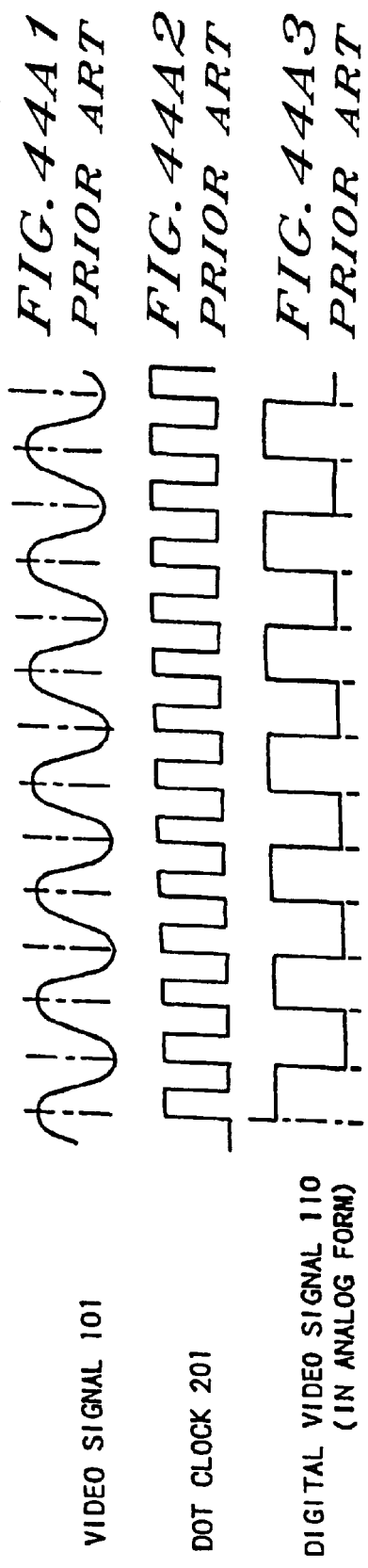
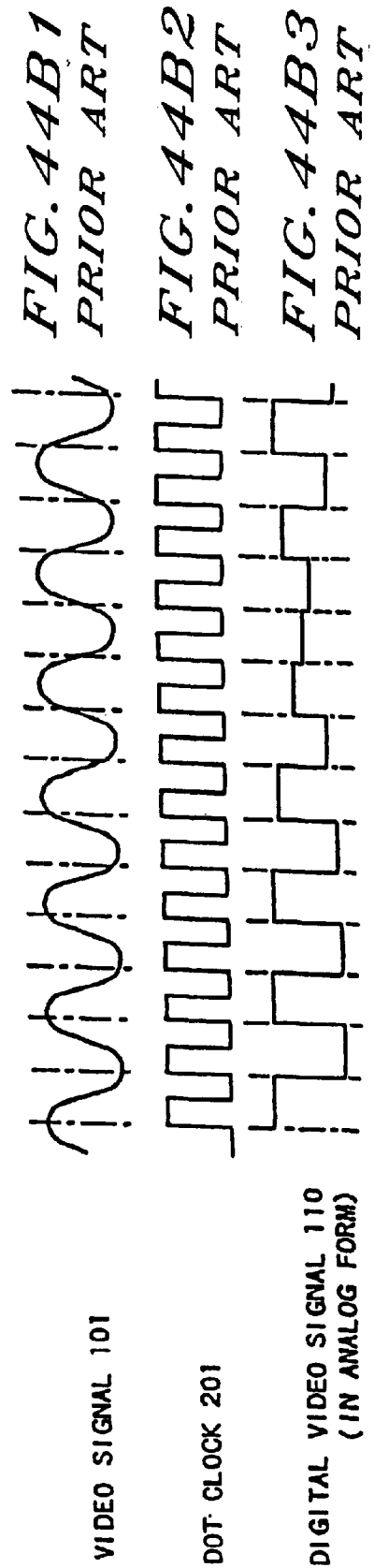

METHOD AND APPARATUS FOR ADJUSTING DOT CLOCK SIGNAL

This application is a Division of application Ser. No 09/166,421 filed on Oct. 5, 1998 now U.S. Pat. No. 6,304,296, which is a division of application Ser. No. 08/804,06 filed Feb. 21, 1997, now U.S. Pat. No. 6,115,075.

BACKGROUND OF THE INVENTION

1. Field of the Invention

The present invention relates to a technique of adjusting a dot clock signal for processing a video signal. Especially the invention pertains to a technique of adjusting the phase of a dot clock signal as well as to a technique of adjusting the frequency of the dot clock signal. The video signal in the present invention denotes an image signal supplied from an image signal output device such as a personal computer.

2. Description of the Related Art

FIG. 40 is a block diagram illustrating a video image display apparatus utilizing a conventional technique. The video image display apparatus includes an A-D converter 1, a driving circuit 2, a display device 3, a display timing control circuit 5, a PLL (Phase Locked Loop) circuit 7, and a delay circuit 10. The PLL circuit 7 multiplies the frequency of a horizontal synchronizing signal 102 for an analog video signal 101, by a predetermined factor Nd to generate a reference clock signal 200. The delay circuit 10 gives a delay $\phi$ to the reference clock signal 200 to generate a dot clock 201. The analog video signal 101 is sampled by an A-D converter 1 at a rise of the dot clock 201 land converted to a digital video signal 110. The driving circuit 2 executes a signal processing on the digital video signal 110 to make it suitable for the display device 3, and supplies the processed video signal to the display device 3 for display of an image. The dot clock 201 is also given to the driving circuit 2, the display device 3, and the display timing control circuit 5. The display timing control circuit 5 further receives the horizontal synchronizing signal 102. The display timing control circuit 5 controls the display timing of the display device 3 according to the horizontal synchronizing signal 102 and the dot clock 201.

The PLL circuit 7 and the delay circuit 10 constitute a dot clock regeneration circuit for regenerating a dot clock signal (dot clock) suitable for the processing of the analog video signal 101, from the horizontal synchronizing signal 102. The factor Nd in the PLL circuit 7 and the delay $\phi$ in the delay circuit 10 are adjustable parameters in generating the dot clock 201. In other words, it is desirable to set appropriate values to both the delay $\phi$ and the factor Nd, in order to regenerate the dot clock signal suitable for the analog video signal 101. The delay $\phi$ of the dot clock signal relates to the phase of the dot clock signal, whereas the factor Nd relates to the frequency of the dot clock signal. There are some problems regarding the adjustment of the delay $\phi$ (that is, the adjustment of the phase) and the adjustment of the factor Nd (that is, the adjustment of the frequency) as described below.

The analog video signal 101 output from a video image output apparatus, such as a personal computer, was generated in synchronism with an internal video clock of the video image output apparatus. The signal level thus varies at the cycles of the internal video clock. A dot clock (also referred to a sampling clock) having the same frequency as that of the internal video clock of the video image output apparatus is required in order to carry out appropriate signal processing for displaying a video image corresponding to the analog video signal 101 on the display device 3 or the signal processing for writing the analog video signal 101 into a memory. In the computer system, such as a personal computer, however, no video clock is output to an output terminal of video signals. In the conventional system shown in FIG. 40, the PLL circuit 7 multiplies the frequency of the horizontal synchronizing signal 102 by the factor Nd to generate the reference clock signal 200, and the delay circuit 10 further gives a delay to the reference clock signal 200 to regenerate the dot clock 201. Here the factor Nd in the PLL circuit 7 is set to coincide with a demultiplication factor, or frequency division ratio, used for generating the horizontal synchronizing signal 102 from the video clock in the video image output apparatus. This makes the dot clock 201 to have the same frequency as that of the original video clock.

FIGS. 41(a)–41(c) are timing charts showing the relationship between the video signal 101 and the dot clock 201. The video signal 101 has a stable range 121 having image information proper to the video signal 101 and a transient range 122 including ringing and rounding generated by the effects of an output circuit of the video image output apparatus and a connection cable. When a dot clock rising in the stable range 121 such as a dot clock 201A shown in FIG. 41(b) is used, a normal video image is displayed on the display device 3. When a dot clock rising in the transient range 122 such as a dot clock 201B shown in FIG. 41(c) is used, on the other hand, the A-D converter 1 samples image information that is not proper to the video signal 101, and the resulting video image displayed on the display device 3 accordingly has undesirable noises or poor sharpness.

FIGS. 42(a)–42(c) are timing charts showing the relationship between the horizontal synchronizing signal 102, the reference clock 200, and the dot clock 201. The reference clock 200 output from the PLL circuit 7 is in phase with the horizontal synchronizing signal 102. Since the relationship between the phase of the horizontal synchronizing signal 102 and that of the video signal 101 is not specifically defined, the phase at a rise of the reference clock 200 may deviate from the phase of the video signal 101. A rise of the dot clock 201 may accordingly exist in the transient range 122 (FIG. 41(a)).

In the conventional system, a user manually adjusts the delay time $\phi$ (that is, the phase) of the dot clock 201 shown in FIG. 42(c) to an optimum state while checking a video image on the display device 3 so that the displayed video image has no noise and sufficient sharpness. This manual operation is, however, rather troublesome, and little understanding of the requirement for the adjustment may lead to some misunderstanding that the display device has poor performance or even malfunctions.

A method of automatically adjusting the phase of the dot clock 201 is, for example, disclosed in JAPANESE PATENT LAID-OPEN GAZETTE No. 4-276791. This method comprises the steps of: sampling two sets of image data in synchronism with dot clocks having different phases; storing them into two different memories; and determining an optimum phase of the dot clock so that the two sets of image data read out of the memories coincide with each other. When the video signal includes ringing and rounding and has a narrow stable range, only a little shift of the phase causes a difference in the resulting image data. Potential noise also slightly changes the image data. The two sets of image data obtained with the dot clocks with different phases thus hardly coincide with each other actually, and it is rather difficult to determine the optimum phase of the dot clock. This method also requires two high-speed line memories to process high-speed video signals, thereby undesirably raising the equipment cost.

The adjustment of the factor Nd in the PLL circuit 7 (FIG. 40), that is, the adjustment of the frequency of the dot clock, also has the following problem. FIG. 43 shows timing of the video signal 101 in a two-dimensional manner. A standard video signal is a one-dimensional signal representing a video image on each scanning line. One page image is constructed by scanning each line from left to right in the horizontal direction and repeating the scanning procedure for all the lines in one page from an upper left end to a lower right end. A horizontal synchronizing signal 102 adjusts the scanning timing of the video signal 101 in the horizontal direction, whereas a vertical synchronizing signal 103 adjusts the scanning timing of the video signal 101 in the vertical direction. A CRT display requires a time period for returning the electron beam from right to left and from bottom to top, so that blanking areas 302 are set both in the horizontal direction and in the vertical direction. An effective signal area 301 other than the blanking area 302 is the area in which a video image is actually displayed. The timing of the blanking area 302 and the effective signal area 301 in the horizontal direction is expressed by the number of pixels corresponding to the number of pulses of the dot clock. Although the timing in the vertical direction should be expressed by the number of scanning lines, it is often expressed by the number of pixels instead.

In personal computers, there are several standard sizes for the effective signal area 301. Typical standards include VGA (640 pixels (dots) in the horizontal direction×480 pixels in the vertical direction), SVGA (800 pixels×600 pixels), XGA (1024 pixels×768 pixels), and SXGA (1280 pixels×1024 pixels). The specific standard applied to the video signal can be identified from the frequencies of the horizontal synchronizing signal and the vertical synchronizing signal of the video signal.

These standard sizes represent the number of pixels included in the effective signal area 301 of FIG. 43 and do not define the total number of pixels in one scanning line including both the blanking area 302 and the effective signal area 301. A variety of arbitrary values are actually used as the total number of pixels for one line. While the number of pixels in the effective signal area 301 can be determined from the synchronizing signals, the total number of pixels for one line is unknown, and therefore the optimum factor Nd to be set in the PLL circuit is unknown.

FIGS. 44(a-1)–44(a-3) and FIGS. 44(b-1)–44(b-3) are timing charts showing the relationship between the analog video signal 101, the dot clock 201, and the digital video signal 110. The digital video signal 110 is shown in the analog form for the clarity of explanation. FIGS. 44(a-1) through 44(a-3) show the case in which the factor Nd in the PLL circuit 7 is equal to a frequency division ratio used for generating the horizontal synchronizing signal from the video clock in the video image output apparatus that generates the video signal 101. In this case, the phase of the dot clock 201 relative to the variation points of the video signal 101 is fixed. The resulting digital video signal 110 appropriately reproduces the video signal 101 and enables a proper video image to be displayed on the display device 3.

If the factor Nd in the PLL circuit 7 is different from the frequency division ratio in the video image output apparatus, on the other hand, the phase of the dot clock 201 relative to the video signal 101 varies with respect to each position in the horizontal direction as shown in FIGS. 44(b-1) through 44(b-3). In this case, the amplitude of the digital video signal 110 varies according to the pixel position, and thus shows "beats". A resulting video image displayed on the display device 3 shows vertical lines due to the small amplitude portion of the beats and may suffer from a loss of some image information.

In the conventional video image display apparatus, appropriate factors Nd for the commercially-available popular personal computers may be registered in advance. The type of the video image output apparatus is identified according to the frequencies and the polarities of the horizontal synchronizing signal 102 and the vertical synchronizing signal 103. The optimum factor Nd for the video image output apparatus is then selected from the preset alternatives and set in the PLL circuit 7. In case that the appropriate factor Nd has not been registered for a specific video image output apparatus, the user has to manually set the optimum factor Nd while monitoring the screen of the display device.

Known methods for automatically determining the unknown factor Nd are, for example, disclosed in JAPANESE PATENT LAID-OPEN GAZETTE No. 3-295367 and No. 5-66752.

The method disclosed in JAPANESE PATENT LAID-OPEN GAZETTE No. 3-295367 stores the sampled video signals in a compressed form and checks whether or not the data are stable with respect to a plurality of inputs, thereby detecting a deviation of the factor.

This method only detects whether the factor is deviated or not, and cannot determine the degree of the deviation. This method would repeat the comparison while varying the factor and thus requires a relatively long time for determining the optimum factor. Further, if the phase of the dot clock (that is, the delay φ in the delay circuit 10) is improper, this conventional method cannot determine the optimum factor.

Another known method disclosed in JAPANESE PATENT LAID-OPEN GAZETTE No. 5-66752 detects a dot cycle from the edge component of the video signals: detects a scanning cycle from the horizontal synchronizing signal; and compares the dot cycle with the scanning cycle to determine the factor in the PLL circuit.

This method, however, requires another clock signal having a significantly higher frequency than that of the dot clock to measure the dot cycle. An extremely high dot clock frequency would be required for signals having a large total number of pixels. This method is accordingly not practical.

SUMMARY OF THE INVENTION

An object of the present invention is thus to provide a technique for appropriately adjusting a dot clock for video signals by a simple process.

The present invention is directed to a method of adjusting a phase of a dot clock signal for a video signal. The method comprises the steps of (a) sampling the video signal by a plurality of dot clock signals that are expected to have different phase relationships to the video signal, thereby obtaining plural sets of image data; (b) carrying out a prescribed operation for each set of image data to obtain a phase-related index representing the phase relationship of the each set of image data, and determining a desirable phase for the dot clock signal based on the phase-related indexes of the plural sets of image data; and (c) applying an optimum delay to the dot clock signal to have the desirable phase.

Since the phase-related index indicates whether the phase relationship between the dot clock signal and the video signal is appropriate or not, a desirable phase can be determined on the basis of the phase-related index. The delay of the dot clock can be adjusted so that the dot clock has the desirable phase accordingly.

According to one embodiment of the present invention, the step (a) comprises the step of: applying a plurality of different delays to a reference clock to generate the plurality of dot clock signals, and sampling the video signal by each dot clock signal to obtain the plural sets of image data respectively representing images at an identical position on a screen; and wherein the step (b) comprises the steps of: (1) calculating values of a function representing sharpness of the plural sets of image data as the phase-related indexes corresponding to the plurality of delays; (2) determining an extreme of the values of the function against the plurality of delays; and (3) selecting a delay among the plurality of delays as the optimum delay to attain the desirable phase, the selected delay corresponding to the extreme of the values of the function.

Whether the phase relationship between the video signal and the dot clock signal is appropriate or not can be judged on the basis of sharpness of the image data to be sampled by the dot clock. Therefore, a value of a function representing sharpness of image data may be used as the phase-related index. The value of the function will become different for a plurality of dot clock signals which are generated by different delay times and which have different phase relationship with the video signal accordingly. Further, the value of the function should have a maximum at a specific delay corresponding to a desired phase relationship. An appropriate delay for attaining the desirable phase relationship can be obtained by determining a maximum of the value of the function.

In another preferred embodiment of the present invention, the step (a) comprises the steps of: multiplying a frequency of a horizontal synchronizing signal of the video signal by a first factor to generate a first dot clock signal, the first factor being different from an appropriate second factor that is to be used for multiplying the frequency of the horizontal synchronizing signal to generate the dot clock signal having the desirable phase, the first dot signal including a plurality of signal phases which can be considered as the plurality of dot signals; and sampling the video signal by the first dot clock signal to obtain first image data on a specific line of the screen. Further, the step (b) comprises the steps of: dividing the first image data into a plurality of first image data blocks; calculating values of the function representing sharpness of the plurality of first image data blocks as the phase-related indexes of the plurality of first image data blocks, respectively; determining the extreme of the values of the function with respect to the plurality of first image data blocks; and selecting a delay corresponding to a specific first image data block related to the extreme of the values of the function as the optimum delay to attain the desirable phase.

The image data sampled by the first dot clock signal will includes a portion whose phase matches with the video signal and other portion whose phase does not. A desirable delay can be determined from the value of the function representing sharpness for a plurality of image data blocks which are divided from the image data for at lease one line.

The present invention is also directed to an apparatus for adjusting a phase of a dot clock signal for a video signal. The apparatus comprises: sampling means for sampling the video signal by a plurality of dot clock signals that are expected to have different phase relationships to the video signal, thereby obtaining plural sets of image data; phase determining means for carrying out a prescribed operation for each set of image data to obtain a phase-related index representing the phase relationship of the each set of image data, and determining a desirable phase for the dot clock signal based on the phase-related indexes of the plural sets of image data; and delay setting means for applying an optimum delay to the dot clock signal to have the desirable phase.

The present invention is further directed to a method of adjusting a frequency of a dot clock signal for a video signal. The method comprises the steps of: (a) multiplying a frequency of a horizontal synchronizing signal of the video signal by a first factor to generate a first dot clock signal; (b) sampling the video signal by the first dot clock signal to obtain image data: (c) analyzing the image data to determine a first value representing a length of an effective signal area on one line of the image data; (d) carrying out an operation using the first value representing the length of the effective signal area and a known second value representing a true length of the effective signal area, thereby determining a desirable second factor; and (e) multiplying the frequency of the horizontal synchronizing signal by the second factor to generate a desirable second dot clock signal.

The first value of the effective signal area of the image data can be determined by analyzing the image data. If a true length of the effective signal area, or the second value, is known, a desirable second factor can be determined so that the effective signal area has the second value. The desirable second dot clock will be generated with the second factor.

The present invention is also directed to an apparatus for adjusting a frequency of a dot clock signal for a video signal. The apparatus comprises: dot clock generation means for multiplying a frequency of a horizontal synchronizing signal of the video signal by a first factor to generate a first dot clock signal; sampling means for sampling the video signal by the first dot clock signal to obtain image data; first operation means for analyzing the image data to determine a first value representing a length of an effective signal area on one line of the image data; second operation means for carrying out an operation using the first value representing the length of the effective signal area and a known second value representing a true length of the effective signal area, thereby determining a desirable second factor; and factor setting unit for setting the desirable second factor in the dot clock generation means and thereby enabling the dot clock generation means to multiply the frequency of the horizontal synchronizing signal by the second factor to generate a desirable second dot clock signal.

According to an aspect of the present invention, the method of adjusting a frequency of a dot clock signal for a video signal comprises the steps of: (a) multiplying a frequency of a horizontal synchronizing signal of the video signal by a first factor to generate a first dot clock signal; (b) sampling the video signal by the first dot clock signal to obtain image data; (c) obtaining a number of beats over one line of the image data; (d) correcting the first factor with the number of beats, thereby obtaining a desirable second factor; and (e) multiplying the frequency of the horizontal synchronizing signal by the second factor to generate a second dot clock signal that can be used to sample image data without beats.

Image data will include some beats if sampled by the first dot clock having a non-appropriate frequency. A desirable second factor can be obtained by measuring the number of beats over one line of the image data and by correcting the first factor with the number of beats. Using the second factor, the second dot clock signal will be generated to sample image data without any beats. It should be noted that the second dot clock signal can be used in various purposes other than sampling a video signal.

According to another aspect of the present invention, the apparatus for adjusting a frequency of a dot clock signal for a video signal comprises: dot clock generation means for multiplying a frequency of a horizontal synchronizing signal of the video signal by a first factor to generate a first dot clock signal; sampling means for sampling the video signal by the first dot clock signal to obtain image data; first operation means for obtaining a number of beats over one line of the image data; second operation means for correcting the first factor with the number of beats, thereby obtaining a desirable second factor; and factor setting means for setting the second factor in the dot clock generation means and thereby enabling the dot clock generation means to multiply the frequency of the horizontal synchronizing signal by the second factor to generate a second dot clock signal that can be used to sample image data without beats.

The present invention is further directed to a dot clock regeneration circuit for regenerating a dot clock signal to be supplied to a sampling circuit for sampling a video signal. The dot clock regeneration circuit comprises: a PLL circuit for multiplying a frequency of a horizontal synchronizing signal of the video signal by a predetermined factor to generate a reference clock signal; a delay circuit for delaying the reference clock signal by a predetermined time to generate the dot clock signal; memory means for storing at least one line of image data supplied from the sampling circuit; and delay time setting means for controlling a writing process of the image data into the memory means, reading one line of the image data stored in the memory means to carry out a prescribed operation, and setting a delay time in the delay circuit based on the result of the prescribed operation to attain a desirable phase relationship between the video signal and the dot clock signal.

The present invention is further directed to a video signal display apparatus. The video signal display apparatus comprises: sampling means for sampling a video signal; clock generation means for multiplying a horizontal synchronizing signal by a predetermined frequency division factor to generate a dot clock; driving means for processing an output of the sampling means; a display device for displaying an image in response to an output of the driving means; display timing means for controlling a display timing of the display device; memory means for storing one line of data output from the sampling means; write timing means for outputting a write enable signal to the memory means; and control means for outputting a write arm signal to the write timing means to cause the memory means to store data of a specific line, reading out the data of the specific line stored in the memory means, carrying out a prescribed operation, and setting a factor in the clock generation means based on the result of the prescribed operation.

The present invention is also directed to a method of regenerating a dot clock in a video signal display apparatus. The method comprises the steps of: setting a provisional factor in the PLL circuit and storing data into the memory means; comparing a difference between the data read out of the memory means at adjoining addresses with a predetermined threshold value to determine a starting address and a terminal address of an effective signal area of the video signal stored in the memory means; determining a number of dot clocks corresponding to one line of the video signal from a difference between the starting address and the terminal address and the provisional factor; and setting the number of dot clocks as the frequency division factor in the clock generation means.

According to an aspect of the present invention, the method of regenerating a dot clock signal comprises the steps of: processing the data read out from the memory means with a high-pass filter; carrying out a non-linear operation and subsequently performing fast Fourier transform on the data after the high-pass filter processing; obtaining a peak in the result of the fast Fourier transform to determine a frequency of a beat component; and setting a factor in the clock generation means so that a frequency of the beat component becomes equal to zero.

According to another aspect of the present invention, the method of regenerating a dot clock signal comprises the steps of: processing the data read out from the memory means with a high-pass filter; carrying out a non-linear operation on the data after the high-pass filter processing and subsequently performing an operation with a plurality of comb filters; determining a frequency of a beat component based on a combination of integral values of the result of the operation with the plurality of comb filters; and setting a factor in the clock generation means so that a frequency of the beat component becomes equal to zero.

These and other objects, features, aspects, and advantages of the present invention will become more apparent from the following detailed description of the preferred embodiments with the accompanying drawings.

BRIEF DESCRIPTION OF THE DRAWINGS

FIG. 17 is a block diagram illustrating the structure of a video image display apparatus for carrying out adjustment of the frequency of a dot clock, as a third embodiment according to the present invention;

FIGS. 25(a) and 25(b) show the contents of a non-linear operation in the fourth embodiment;

FIGS. 34(a)–34(g) show a variety of image data processed in the sixth embodiment;

FIGS. 37(a)–37(e) show the relationship between level changes of the two binary data PF(AD) and PG(AD) and the output of the exclusive OR operation in the sixth embodiment;

FIG. 38 shows addresses at which the level of the second register output Q2(AD) is inverted in the sixth embodiment;

FIGS. 44(a-1)–44(a-3) and 44(b-1)–44(b-3) are timing charts showing the relationship between the analog video signal 101, the dot clock 201, and the digital video signal 110.

DESCRIPTION OF THE PREFERRED EMBODIMENTS

A. First Embodiment

Figure 1:
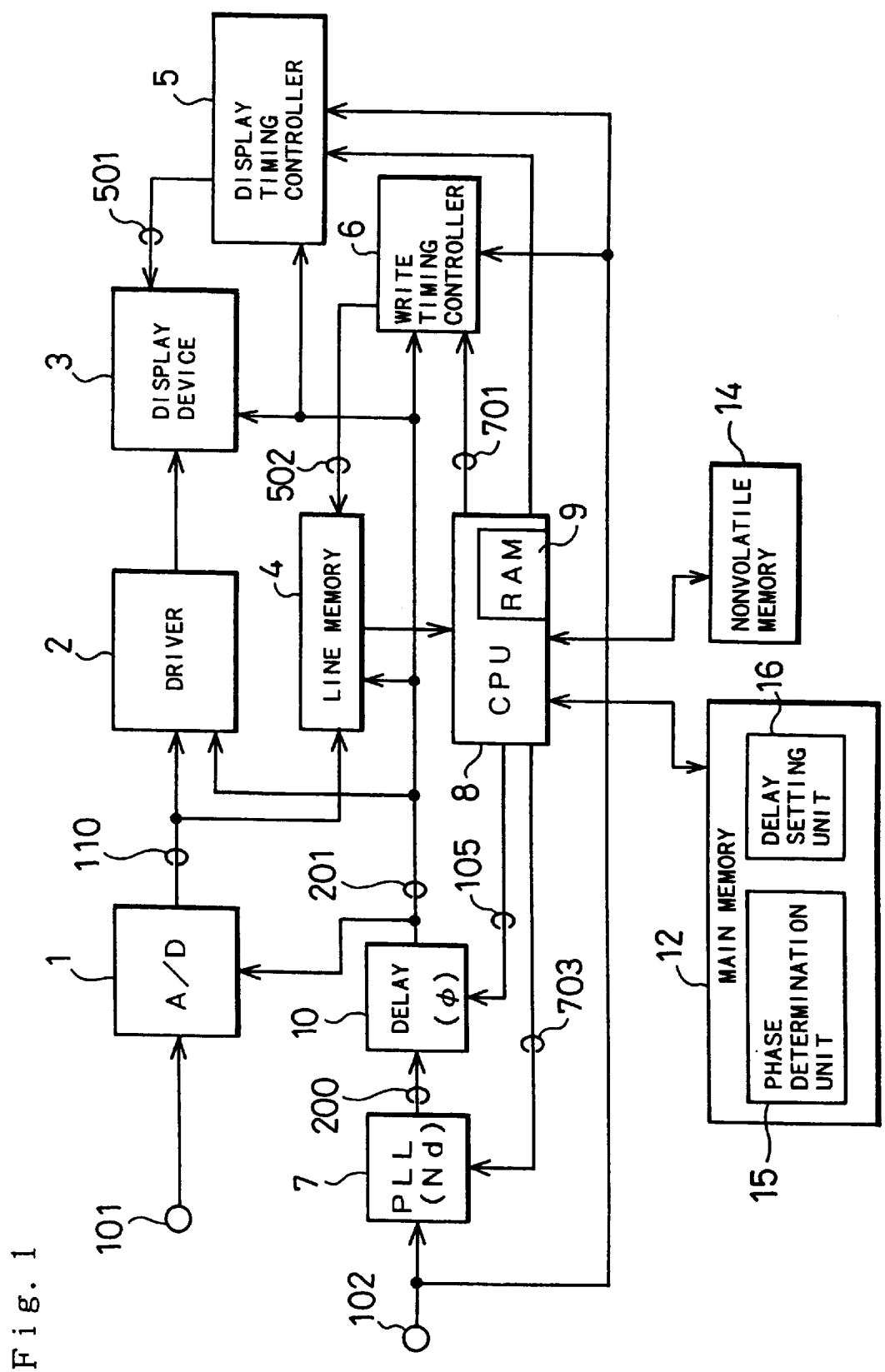
FIG. 1 is a block diagram illustrating the structure of a video image display apparatus for carrying out adjustment of the phase of a dot clock, as a first embodiment according to the present invention.

FIG. 1 is a block diagram illustrating the structure of a video image display apparatus for carrying out adjustment of the phase of a dot clock, as a first embodiment according to the present invention.

The video image display apparatus includes an A-D converter 1, a driving circuit 2, a display device 3, a line memory 4, a display timing control circuit 5, a write timing control circuit 6, a PLL circuit 7, a CPU 8, a RAM 9, a delay circuit 10, a main memory 12, and a nonvolatile memory 14.

The PLL circuit 7 multiplies the frequency of a horizontal synchronizing signal 102 for an analog video signal 101 by a predetermined factor Nd to generate a reference clock signal 200. The delay circuit 10 gives a delay φ to the reference clock signal 200 to generate a dot clock (or dot clock signal) 201. The analog video signal 101 is sampled by an A-D converter 1 at a rise of the dot clock 201 and converted to a digital video signal 110. The driving circuit 2 executes a signal processing on the digital video signal 110 to make it suitable for the display device 3, and supplies a processed video signal to the display device 3 for display of a resulting video image. The dot clock signal 201 is also given to the driving circuit 2, the display device 3, the line memory 4, the display timing control circuit 5, and the write timing control circuit 6. The display timing control circuit 5 and the write timing control circuit 6 further receive the horizontal synchronizing signal 102. The display timing control circuit 5 controls the display timing of the display device 3 in response to the horizontal synchronizing signal 102 and the dot clock 201. The write timing control circuit 6 controls the timing of writing image data into the line memory 4 in response to the horizontal synchronizing signal 102 and the dot clock 201.

The CPU 8 executes a computer program stored in the main memory 12 to implement functions of a phase determination unit 15 and a delay setting unit 16. The phase determination unit 15 carries out a prescribed operation on the image data stored in the line memory 4 and determines a delay φ that gives a desirable phase to the dot clock 201. The delay setting unit 16 then sets the delay φ determined by the phase determination unit 15 in the delay circuit 10. Detailed functions of the phase determination unit 15 and the delay setting unit 16 will be described later.

A matrix-type display device such as a liquid-crystal display or a plasma display is applicable for the display device 3. The driving circuit 2 carries out a variety of processes, such as gamma correction, amplification, multiplexing, and alternate-current inversion.

An output 110 of the A-D converter 1 is given to the line memory 4. The line memory 4 is connected to the CPU 8 and has a capacity for storing image data of at least one scanning line. Digital video signals of at least one scanning line are stored in the line memory 4, and the CPU 8 reads out the image data from the line memory 4.

The nonvolatile memory 14 stores various standard values and default values to be used in the adjustment of the dot clock signal. The nonvolatile memory 14 can be implemented by various solid memory elements, such as a flash memory, EEPROM, and a memory card.

Figure 2:
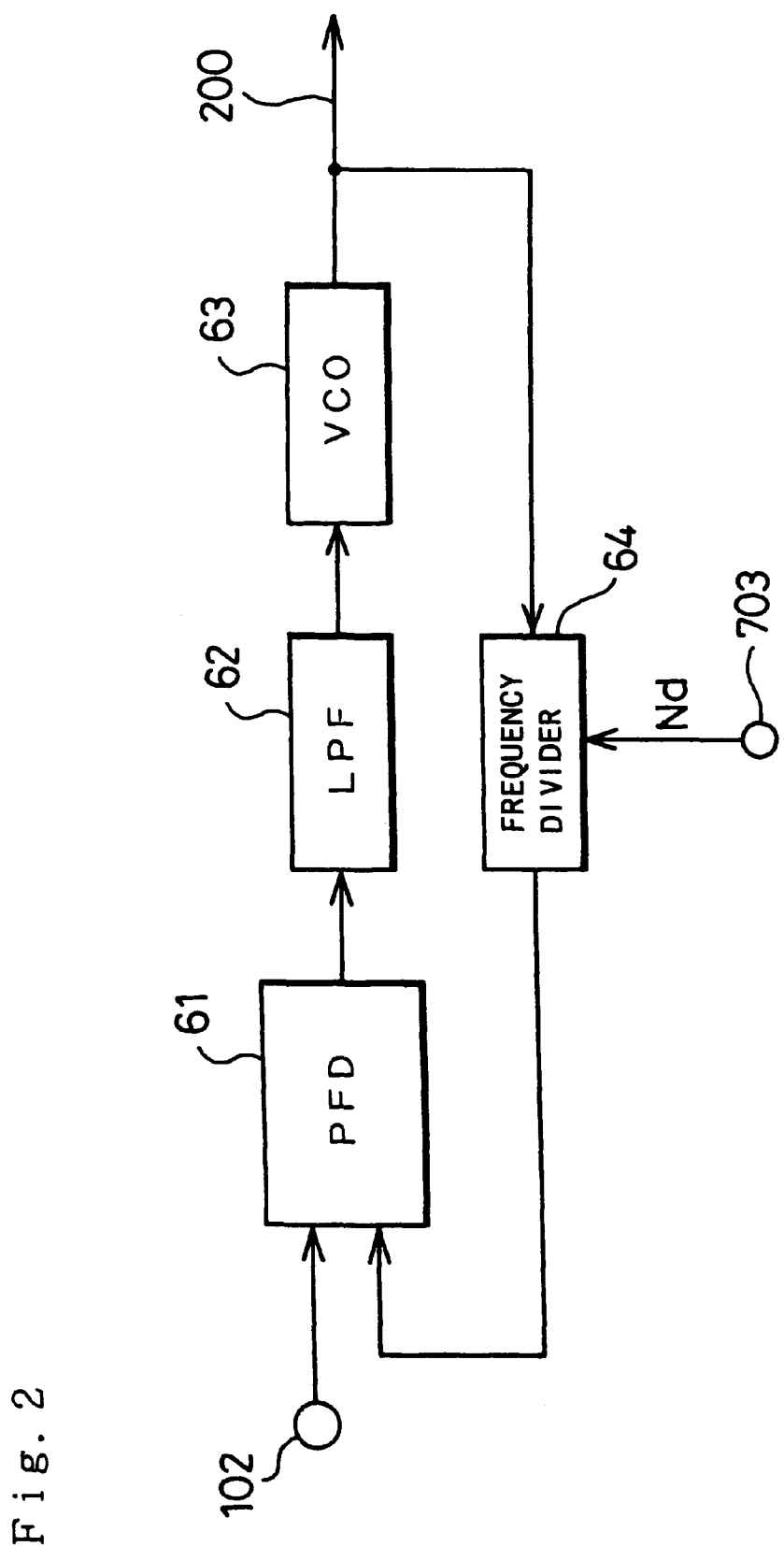
FIG. 2 is a block diagram illustrating the structure of the PLL circuit 7 used in the first embodiment.

FIG. 2 is a block diagram illustrating the structure of the PLL circuit 7. The PLL circuit 7 includes a phase frequency comparator circuit (PFD or phase frequency detector) 61, a low pass filter (LPF) 62, a voltage controlled oscillator (VCO) 63, and a frequency divider 64. The phase frequency comparator circuit 61 receives the horizontal synchronizing signal 102 and an output of the frequency divider 64, compares the phase and the frequency of the output of the frequency divider 64 with those of the horizontal synchronizing signal 102, and generates a signal having a voltage level corresponding to these differences. The output of the phase frequency comparator circuit 61 is supplied to the low pass filter 62 and then to the VCO 63. The VCO 63 generates the reference clock 200 as an output while supplying the reference clock to the frequency divider 64. The frequency divider 64 is a counter that counts the number of pulses of the reference clock up to the factor Nd which is preset according to a factor setting signal 703, thereby dividing the frequency of the reference clock 200 by the preset factor Nd. The VCO 63 accordingly outputs the reference clock 200 whose frequency is obtained by multiplying the frequency of the horizontal synchronizing signal 102 by the factor Nd preset in the frequency divider 64. The factor Nd is the reciprocal of the frequency division ratio 1/Nd in the frequency divider 64.

In the first embodiment, it is assumed that the appropriate factor Nd for obtaining the reference clock 200 and the dot clock 201 having a proper frequency is a known value. An appropriate dot clock 201 having a desirable phase is accordingly obtained simply by adjusting the delay $\phi$ in the delay circuit 10 (FIG. 1).

Figure 3:
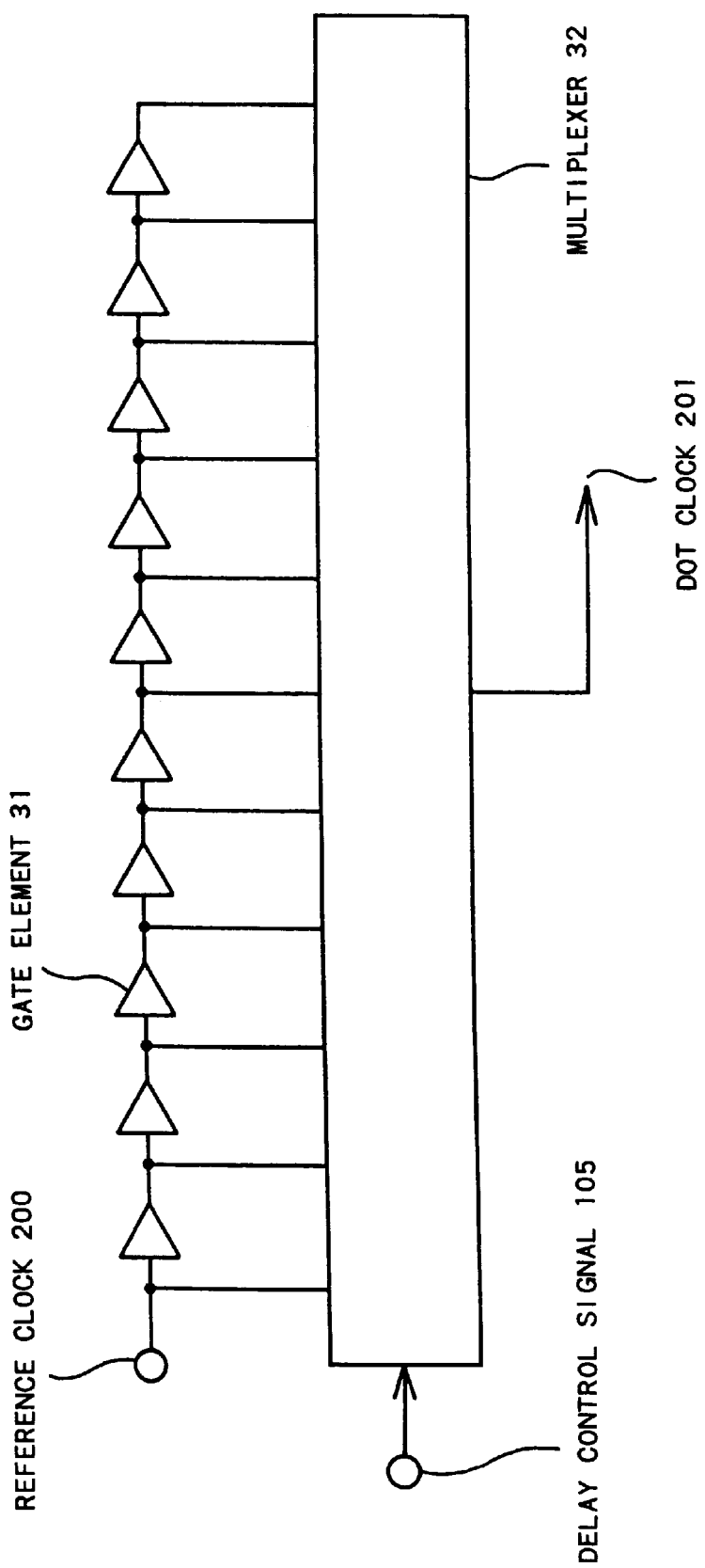
FIG. 3 is a block diagram illustrating the structure of the delay circuit 10.

FIG. 3 is a block diagram illustrating the structure of the delay circuit 10. The reference clock 200 is input into a plurality of gate elements 31 that are connected to one another in series. Outputs of the respective gate elements 31 are given to a multiplexer 32. The multiplexer 32 selects one of the plurality of inputs in response to a delay control signal 105 given by the CPU 8 (FIG. 1) and outputs the selected one as the dot clock 201.

Figure 4:
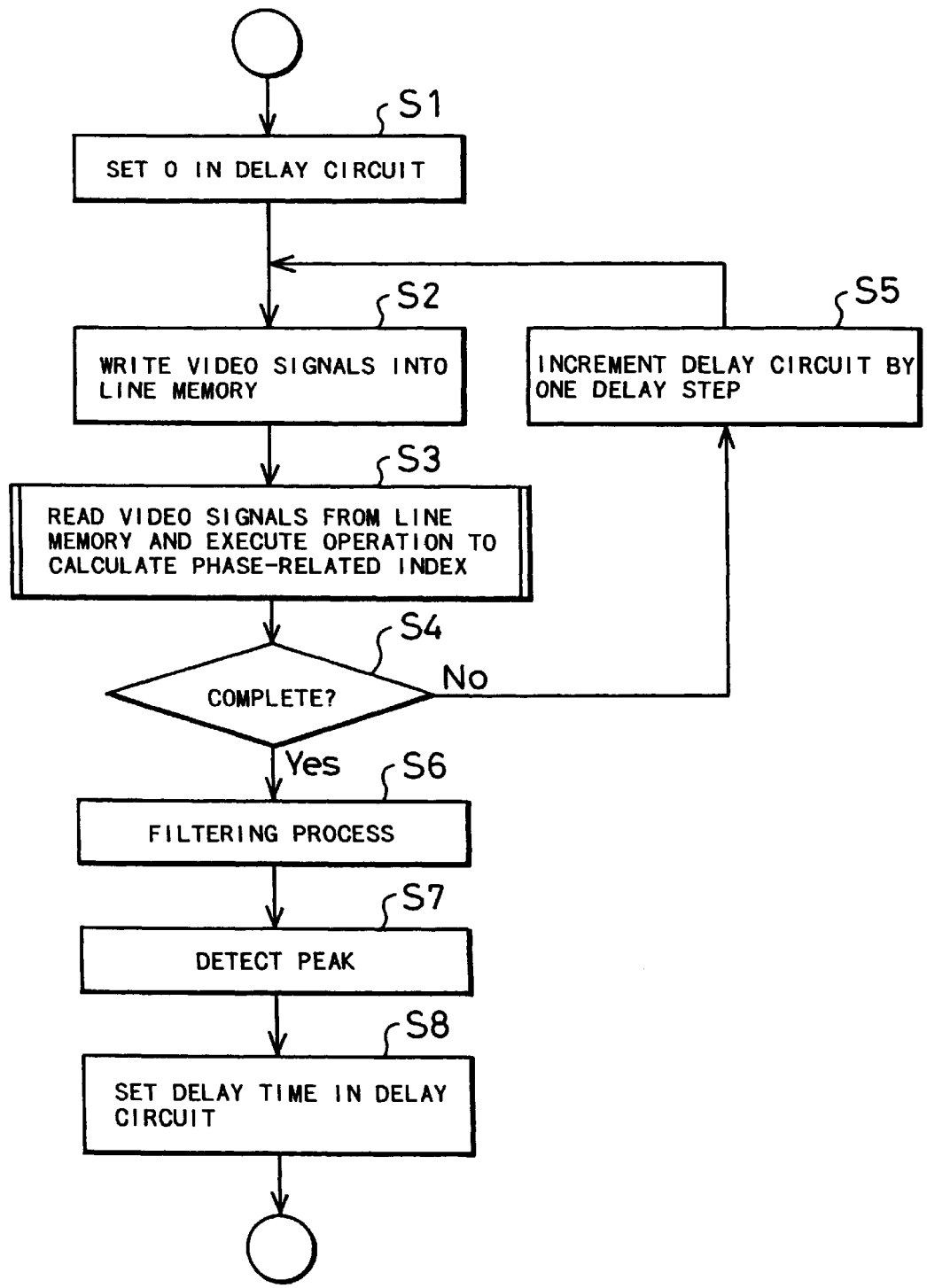
FIG. 4 is a flowchart showing a processing routine executed by the phase determination unit 15 and the delay setting unit 16 in the first embodiment.

FIG. 4 is a flowchart showing a processing routine executed by the phase determination unit 15 and the delay setting unit 16 in the first embodiment. In the embodiments of the present invention, images are displayed as a function of a video signal according to the SVGA standard that is typically used in the personal computer. In the video signals of SVGA, the number of display pixels in a horizontal direction is equal to 800, and the total number of pixels included in each horizontal line, which is the sum of the number of display pixels and the number of pixels in a blanking area, is equal to 1040. An internal video clock of a video image output apparatus for generating the video signal 101 is equal to about 50 MHz. In the first embodiment, the total number of pixels in the horizontal direction, or 1040, is preset to the factor Nd in the PLL circuit 7. The frequency of the reference clock 200 is accordingly equal to about 50 MHz, which is identical with the frequency of the internal video clock of the video image output apparatus for generating the analog video signal 101.

When the program enters the processing routine of FIG. 4, at step S1, the CPU 8 outputs the delay control signal 105 to the delay circuit 10 and sets the delay time $\phi$ equal to zero in the delay circuit 10.

At subsequent step S2, the CPU 8 sends a write arm signal 701 to instruct the write timing control circuit 6 to write image data for one scanning line into the line memory 4. The write timing control circuit 6 and the line memory 4 fall in a write wait state in response to the write arm signal 701. The write timing control circuit 6 counts the number of pulses (that is, the number of lines) of the horizontal synchronizing signal 102 using an internal line counter (not shown). A specific line position to enable a write process is set in advance in the write timing control circuit 6. The write timing control circuit 6 enables a write process in the line memory 4 when the line position of the video signal reaches the specific line position. The digital video signals 110 for one scanning line are then written into the line memory 4 at the rise timing of the dot clock 201. The line memory 4 should have the capacity for storing image data of at least one line, but may have the capacity for storing image data of plural lines.

The program then proceeds to step S3, at which the CPU 8 reads out the image data written in the line memory 4, temporarily registers the image data into the RAM 9 included in the CPU 8, and carries out an operation defined by Equation 1 given below to determine a phase-related index $V_1(\phi)$:

$$V_1(\phi) = \sum_{i=0}^{Nd-2} \{PD(i+1) - PD(i)\}^2 \quad (1)$$

wherein PD(i) denotes image data (also referred to as pixel data) at an i-th address (or pixel position); Nd denotes the factor in the PLL circuit 7 (that is, the total number of pixels included in one line); and $\phi$ denotes a delay in the delay circuit 10. It should be noted that PD(i+1) and PD(i) depend on the delay $\phi$ in the delay circuit 10. Namely the phase-related index $V_1(\phi)$ defined by Equation 1 is the sum of the squared differences between image data at adjoining pixel positions on the same line. This value indicates the relationship between the phase of the analog video signal 101 and the phase of the dot clock 201 and is thereby called 'phase-related index'. The value of the phase-related index $V_1(\phi)$ depends upon the delay $\phi$ in the delay circuit 10.

Figure 5:
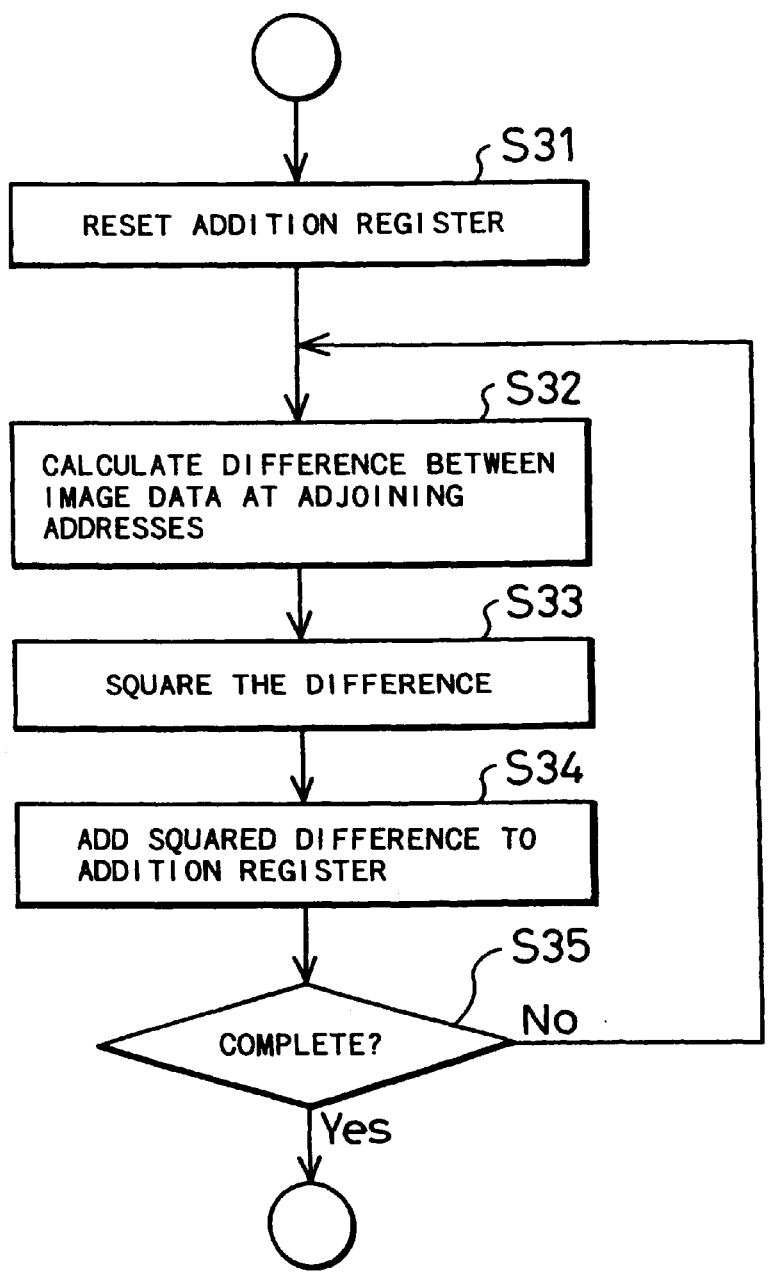
FIG. 5 is a flowchart showing a process of determining a phase-related index $V_1$ defined by Equation 1.

FIG. 5 is a flowchart showing a process of determining the phase-related index $V_1$ defined by Equation 1. When the program enters the routine, The CPU8 resets an addition register in the CPU 8 at step S31, and calculates a difference between image data PD(i) at a current address i in the RAM 9 and another image data PD(i+1) at a next address (i+1) at step S32. The CPU 8 subsequently squares the difference at step S33 and adds the squared difference to the addition register at step S34. The program repeats the processing of steps S32 through S34 for the image data PD(i) for one line until the processing is completed at step S35, and eventually outputs the final value in the addition register as the phase-related index $V_1$.

Figure 6:
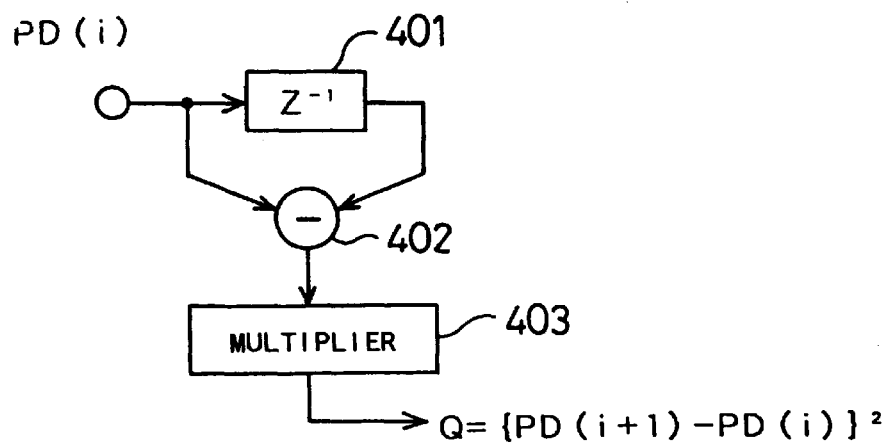
FIG. 6 is a block diagram illustrating an equivalent circuit for realizing the processing of steps S32 through S34 in the flowchart of FIG. 5 by the hardware.

FIG. 6 is a block diagram illustrating an equivalent circuit for realizing the processing of steps S32 through S34 in the flowchart of FIG. 5. The equivalent circuit includes a delay element 401 for giving a delay of one clock (that is, one pixel), an adder 402 for carrying out subtraction, and a multiplier 403 for squaring the result of subtraction. In case that such an equivalent circuit is realized by the hardware, the line memory 4 may be omitted from the structure of FIG. 1.

Another phase-related index $V_2$ may be calculated according to Equation 2 given below, in place of Equation 1:

$$V_2(\phi) = \sum_{i=0}^{Nd-2} |PD(i+1) - PD(i)| \quad (2)$$

The phase-related index $V_2(\phi)$ is the sum of the absolute values of the differences between image data at adjoining pixel positions on the same line. In general, the function expressing the phase-related index is an unequivocal, monotone function with respect to the sum of the squared differences between image data at adjoining pixel positions. When Equation 2 is used to determine the phase-related index, the multiplier 403 in the circuit of FIG. 6 is replaced by a sign converter for giving the absolute values of the differences.

Figure 7:
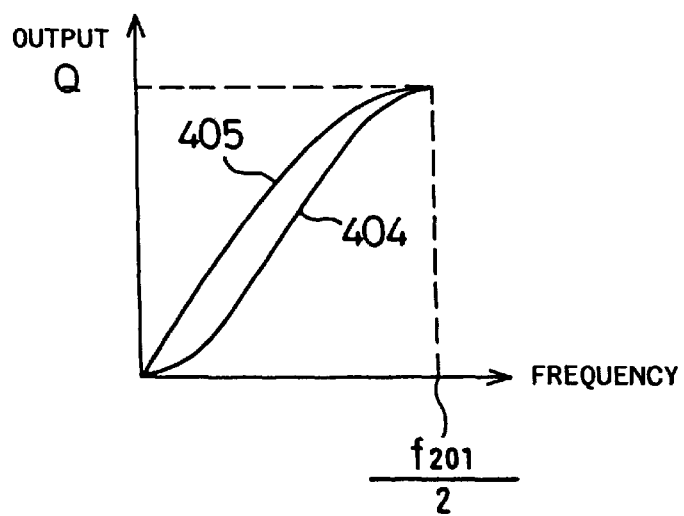
FIG. 7 is a graph showing the frequency characteristics of the equivalent circuit shown in FIG. 6.

FIG. 7 is a graph showing the frequency dependence characteristics of the equivalent circuit shown in FIG. 6. A first characteristic curve 404 represents the characteristics of the squared value $\{PD(i+1)-PD(i)\}^2$, whereas a second characteristic curve 405 represents the characteristics of the absolute value $|PD(i+1)-PD(i)|$. These characteristic curves 404 and 405 show a kind of high-pass filter characteristics having a maximum passing band at half a frequency $f_{201}$ of the dot clock 201, that is, at a maximum frequency of the analog video signal 101.

Figure 8:
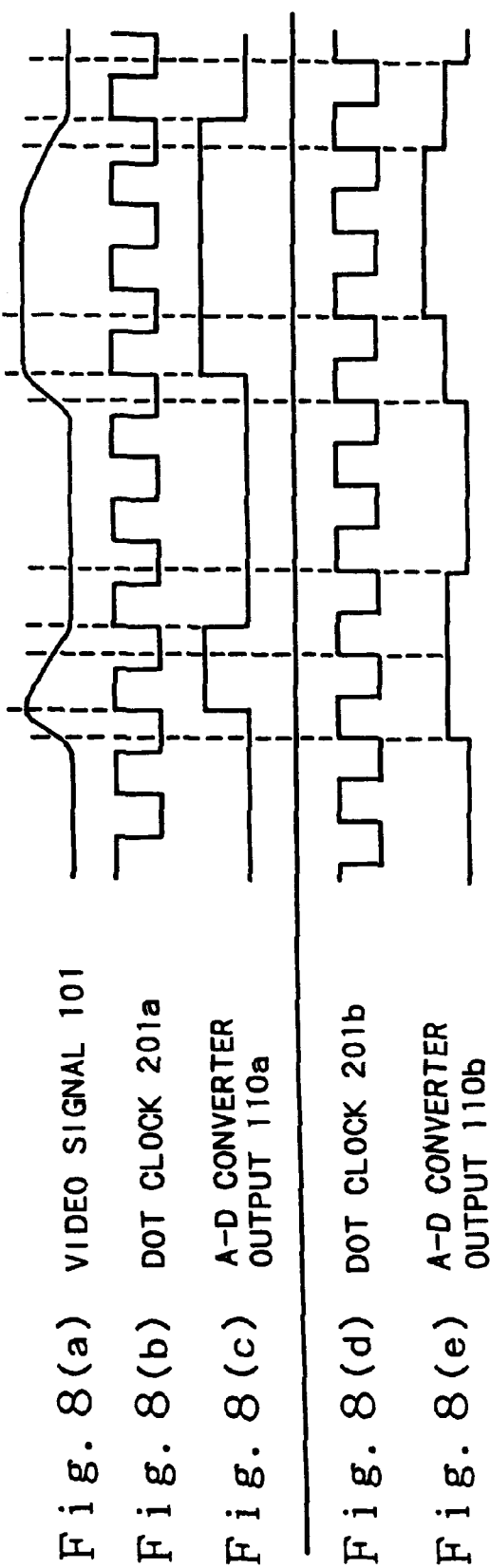
FIGS. 8(a)–8(e) are timing charts showing the process of determining the phase-related index $V_1$ at step S3 in the flowchart of FIG. 4 according to the actual waveform.

FIGS. 8(a)–8(e) and 9(a)–9(h) are timing charts showing the process of determining the phase-related index $V_1$ at step S3 in the flowchart of FIG. 4 for the actual waveforms. FIGS. 8(a)–8(e) show the relationship between the phase of the dot clock signal 201 and the output 110 of the A-D converter 1 (that is, the digital video signal). When a dot clock 201a rises in stable ranges of the video signal 101 as shown in FIG. 8(b), the A-D converter 1 generates an output 110a shown in FIG. 8(c) and the data of this waveform are stored into the line memory 4. Although the actual input and output into and from the line memory 4 are digital signals, they are shown as analog signals for the better understanding. When a dot clock 201b rises in transient ranges of the video signal 101 as shown in FIG. 8(d), on the other hand, the A-D converter 1 generates an output 110b shown in FIG. 8(e) and the data of this waveform is stored into the line memory 4.

Figure 9:
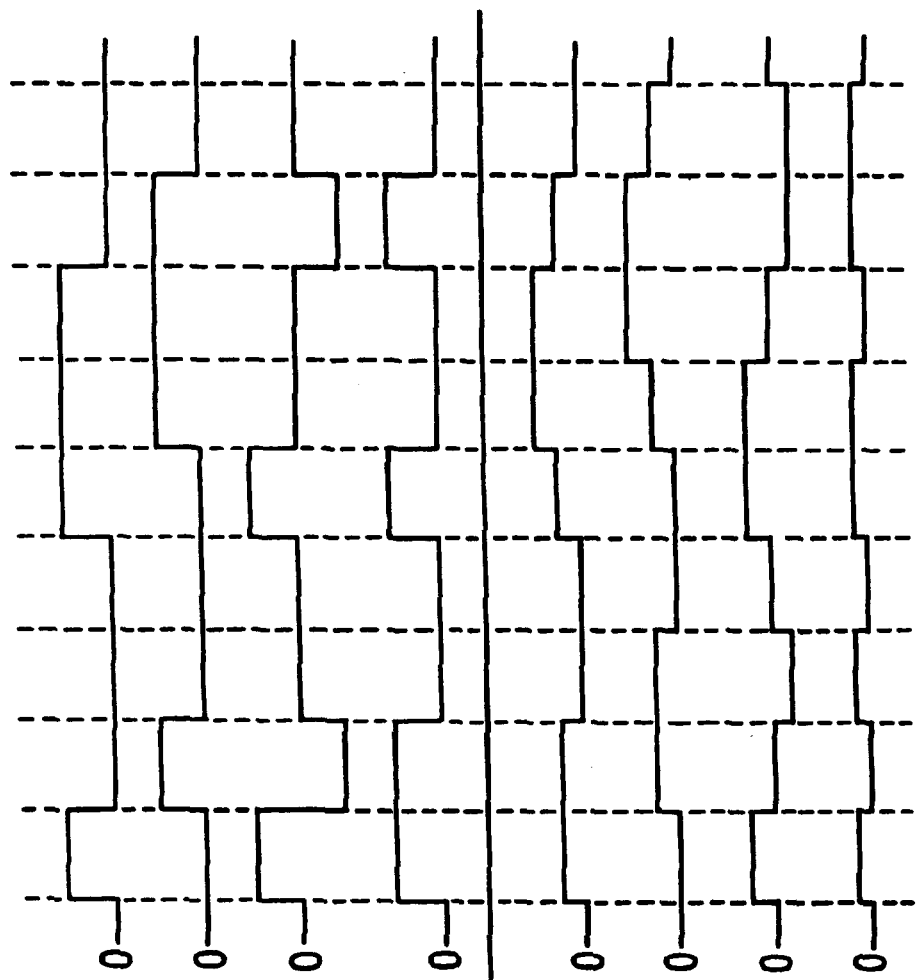
FIGS. 9(a)–9(h) are timing charts showing the process of determining the phase-related index $V_1$ at step S3 in the flowchart of FIG. 4 according to the actual waveform.

FIGS. 9(a)–9(h) show the operation on the image data thus stored. A line memory output 110a of FIG. 9(a) represents the A-D converter output 110a of FIG. 8(c) that has been written once into the line memory 4 and then read out from the line memory 4. A signal 221a of FIG. 9(b) is obtained by giving a delay of one clock to the signal of FIG. 9(a). A signal 222a of FIG. 9(c) represents a difference between the signals of FIGS. 9(a) and 9(b), and a signal 223a of FIG. 9(d) shows the square of the signal 222a. Calculating the difference between the line memory output 110a and the signal 221a delayed by one clock is equivalent to calculating the difference between the data at the current address i and the data at the next address (i+1) at step S32 in the flowchart of FIG. 5.

A line memory output 110b of FIG. 9(e) represents the A-D converter output 110b of FIG. 8(e) that has been written once into the line memory 4 and then read out from the line memory 4. The signals of FIGS. 9(f) through 9(h) are obtained from the signal 110b and respectively correspond to those of FIGS. 9(b) through 9(d).

In the time range shown in FIGS. 9(a)–9(h), the sum of the values of the signal 223a shown in FIG. 9(d) is equal to 4, whereas the sum of the values of the signal 223b shown in FIG. 9(h) is equal to 1.5. This means that the A-D converter output 110a obtained by sampling the video signal 101 in the stable ranges gives a greater value as the sum of the squared differences between adjacent pixel data (that is, a greater value for the phase-related index $V_1$).

Figure 10:
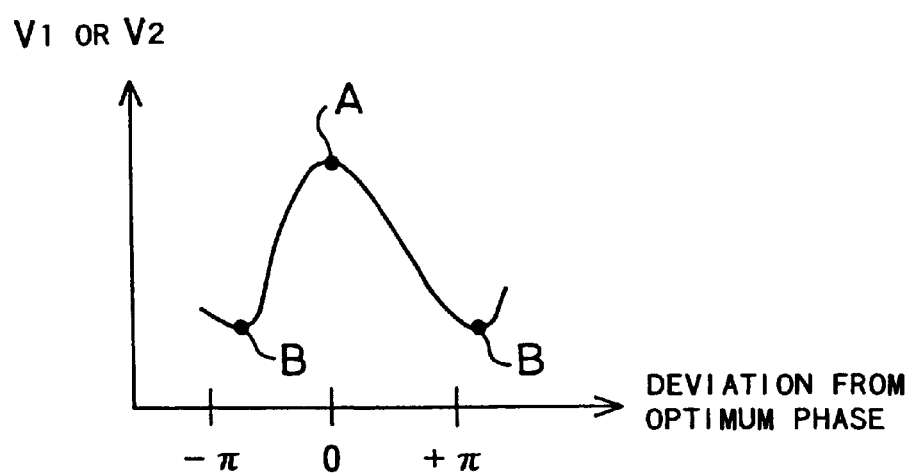
FIG. 10 is a graph showing the relationship between the phase of the dot clock 201 and the phase-related index $V_1$ (or $V_2$)

FIG. 10 is a graph showing the relationship between the phase of the dot clock 201 and the phase-related index $V_1$ (or $V_2$). The phase of the dot clock 201 for carrying out the sampling operation at the peak of each stable range of the video signal is defined as an optimum phase. The deviation of the actual phase from the optimum phase is plotted as abscissa and the phase-related index $V_1$ (or $V_2$) as ordinate. The characteristic curve shown in FIG. 10 is slightly varied, for example, by rounding of the video signal 101, and the absolute level of the phase-related index $V_1$ (or $V_2$) depends upon the frequency of the level change of the video signal 101. The characteristic curve shown in FIG. 10 shows a peak (or maximum or local maximum) and a bottom (or minimum or local minimum). The sampling phase at the peak is optimum. Image data representing video images having the highest sharpness and the least noise can be sampled using the dot clock 201 having the optimum phase.

Comparison between the line memory outputs 110a and 110b of FIGS. 9(a) and 9(e) indicates that the output 110a of FIG. 9(a) clearly has a greater edge component, which results in a greater phase-related index $V_1$ (or $V_2$). Namely the processing for determining the phase-related index $V_1$ (or $V_2$) has the high-pass filter characteristics as shown in FIG. 6. The edge component of the line memory output 110 increases with an increase in sharpness of the sampled video image. The phase-related index $V_1$ (or $V_2$) can thus be regarded as an index indicating sharpness of the sampled video image.

The phase-related index $V_1(\phi)$ (or $V_2(\phi)$) determined for each delay $\phi$ using the image data for one line is stored in the RAM 9 of the CPU 8.

Referring back to the flowchart of FIG. 4, it is determined at step S4 whether or not the processing for determining the phase-related index $V_1$ (or $V_2$) for all the delay times $\phi$ has been completed. When not completed, the program goes to step S5, at which the CPU 8 sends the delay control signal 105 to the delay circuit 10 and increments the delay time $\phi$ by one delay step (that is, a unit delay corresponding to each gate element 31 of FIG. 3), and then repeats the processing of steps S2 through S4. The processing of steps S2 through S4 is repeated for a specific range of the delay $\phi$, which corresponds to a range of not less than one cycle of the dot clock 201 (that is, a phase range of $2\pi$ or greater). In this embodiment, it is assumed that the dot clock 201 has the frequency of 50 MHz and the cycle period of 20 ns. If one delay step in the delay circuit 10 is equal to 1 ns, the processing of steps S2 through S4 is repeated at least 20 times.

Figure 11A:
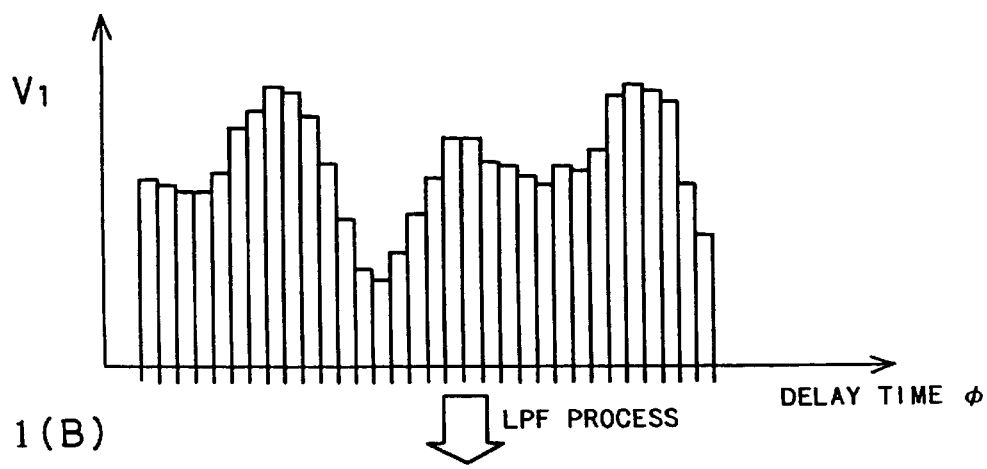
FIGS. 11(A) and 11(B) are graphs showing a result of the operation for calculating the phase-related index $V_1$ with a variation in delay time $\phi$ of the dot clock 201.
Figure 11B:
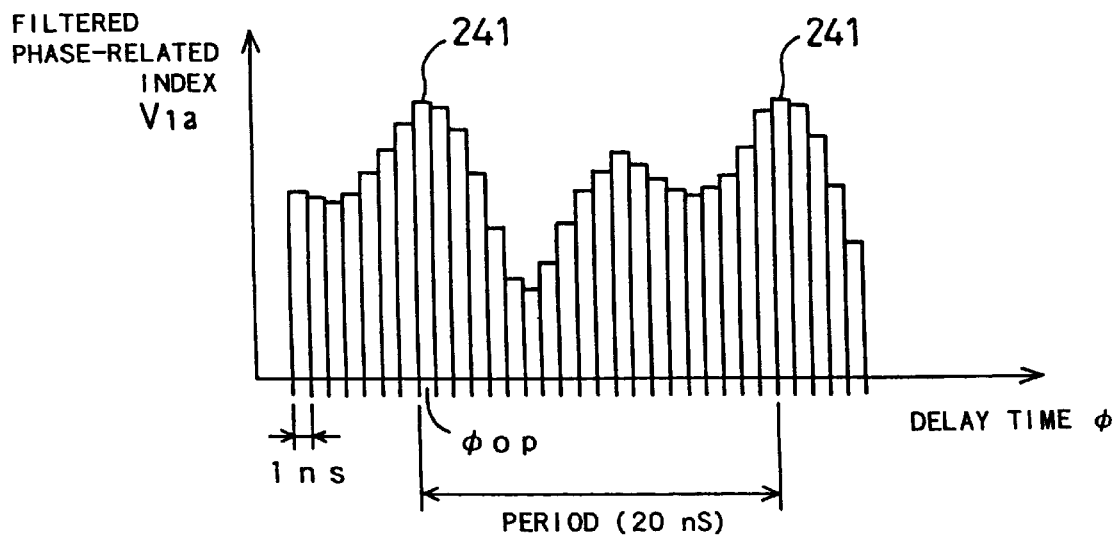

FIG. 11(A) is a graph showing the relationship between the delay time $\phi$ of the dot clock 201 and the phase-related index $V_1$. The delay time $\phi$ is plotted as abscissa and the phase-related index $V_1$ as ordinate. The phase related index $V_1$ of FIG. 11(A) includes a noise due to the contents of the video signal. Referring back again to the flowchart of FIG. 4, the CPU 8 carries out a filtering process to take out only a low-band component at step S6. The filtering process is realized by a convolution operation using a one-dimensional low-pass filter. FIG. 11(B) shows a filtered phase-related index $V_{1a}$ thus obtained. The filtering process of step S6 may be omitted in some cases. The filtering process, however, determines the delay time giving the optimum phase of the dot clock 201 with a higher accuracy.

At step S7 in the flowchart of FIG. 4, the CPU 8 finds a maximum position 241 (that is, the position of a maximum value) in the graph of FIG. 11(B). The video signals 101 can thus be sampled at the optimum phase by the dot clock 201, which is delayed by a delay time $\phi_{op}$ corresponding to the maximum position 241. The CPU 8 sends the delay control signal 105 to the delay circuit 10 to set the delay time $\phi_{op}$ at step S8.

As shown in FIG. 11(B), the maximum position 241 repeatedly appears at plural delay times $\phi$, which are separated by one cycle of the dot clock 201. Since these delay times give an equivalent phase to the dot clock 201, the shortest delay time can be selected among the delay times of these maximum positions.

The above first embodiment automatically adjusts the delay $\phi$ of the dot clock 201 so that the dot clock 201 has an optimum phase for obtaining the most stable sampling results even when the video signal 101 has rounding or distortion.

If the driving circuit 2 has an internal memory, the line memory 4 may be replaced by this memory and thereby omitted. The line memory 4 works at the frequency of the dot clock 201 and is thus required to have the cycle time of not greater than 20 ns in this embodiment. The speed of the operations executed by the CPU 8 is, however, totally independent of the frequency of the dot clock, and a low-speed CPU can be sufficiently applied for the CPU 8.

The CPU 8 is not required to be specifically used for the controls and the operations described above, but its functions may be implemented by any suitable microprocessors, such as those for adjusting the screen conditions of the display device.

In the first embodiment, the maximum position is determined after the calculation of the phase-related index is completed for all of the plurality of delays $\phi$. In accordance with another preferable embodiment, the processing for finding the maximum may be carried out every time when the phase-related index is obtained for each delay $\phi$, and is stopped when the maximum is obtained. This alternative method does not require the processing for all of the delays, thereby shortening the overall processing time.

Not all of the image data for one line are required to be processed to obtain the phase-related index, but image data for only part of one line may be subjected to the processing. This shortens the processing time. On the contrary, image data for a plurality of lines may be subjected to the processing. This improves the accuracy of the phase adjustment of a dot clock signal.

B. Second Embodiment

Figure 12:
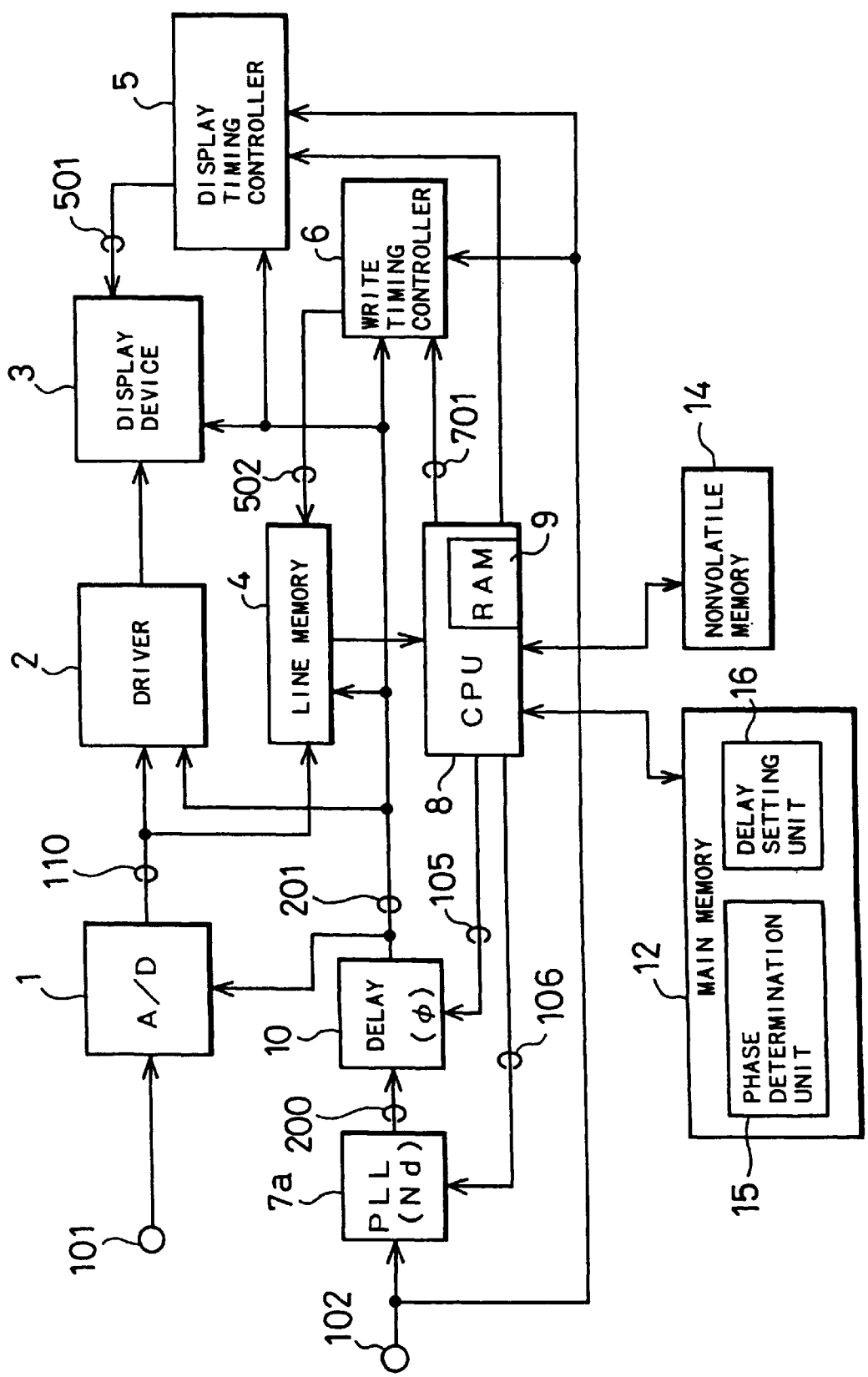
FIG. 12 is a block diagram illustrating the structure of a video image display apparatus for carrying out adjustment of the frequency of a dot clock, as a second embodiment according to the present invention.

FIG. 12 is a block diagram illustrating the structure of a video image display apparatus for carrying out adjustment of the frequency of a dot clock, as a second embodiment according to the present invention. The identical constituents as those of FIG. 1 are shown by the like numerals. The video image display apparatus of the second embodiment shown in FIG. 12 includes a PLL circuit 7a, which has structure different from that of the PLL circuit 7 of the first embodiment shown in FIG. 1. The CPU 8 sends an addition signal 106 to instruct either addition or subtraction of the factor Nd to the PLL circuit 7a.

Figure 13:
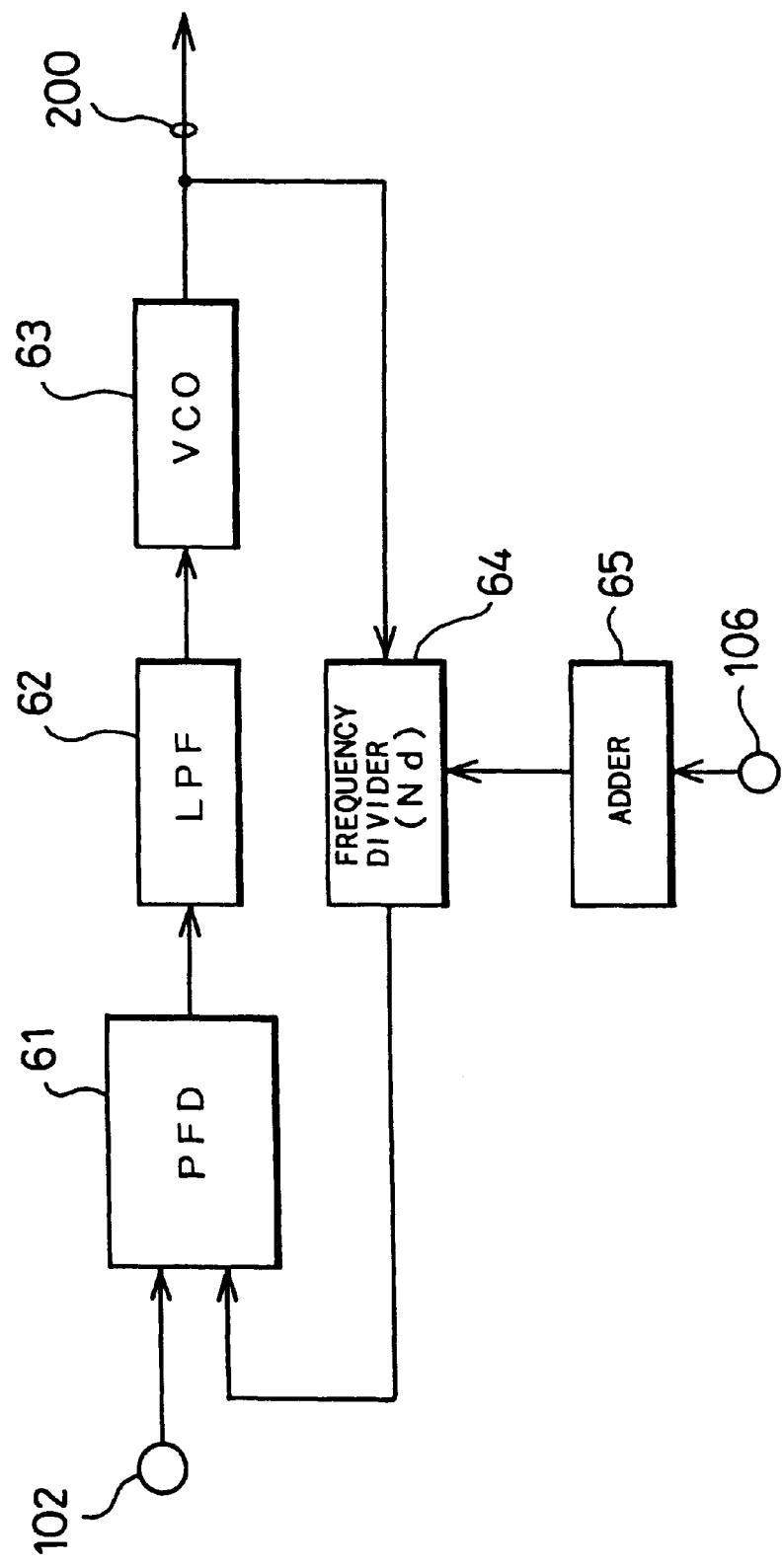
FIG. 13 is a block diagram illustrating the structure of the PLL circuit 7a used in the second embodiment.

FIG. 13 shows structure of the PLL circuit 7a used in the second embodiment. The PLL circuit 7a has an adder circuit 65 in addition to the constituents of the PLL circuit 7 shown in FIG. 2. When the adder circuit 65 receives the addition signal 106, a predetermined offset value Noff is either added to or subtracted from the value of the frequency division factor Nd in the frequency divider 64.

Figure 14:
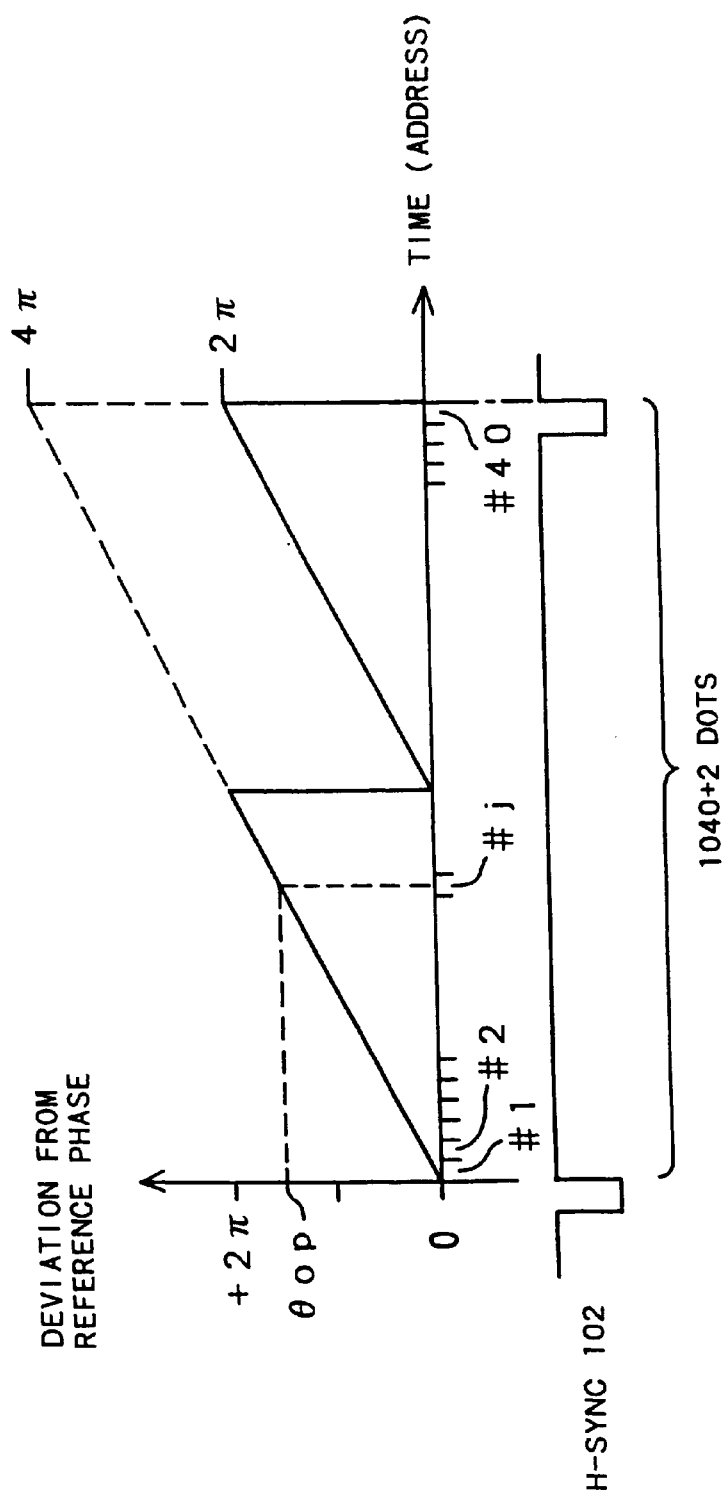
FIG. 14 shows a process of determining the optimum phase of the dot clock in the second embodiment.

FIG. 14 shows a process of determining the optimum phase of the dot clock in the second embodiment. In the graph of FIG. 14, the time period (or address) corresponding to one line is plotted as abscissa, and the phase deviation of the dot clock that is obtained using the factor calculated by adding the offset value Noff to an appropriate factor Nd as ordinate. In the second embodiment, it is assumed that the appropriate factor Nd is 1040, the offset value Noff is 2, and the factor with the offset value is 1042 accordingly. A first dot clock is obtained using the appropriate factor Nd (=1040). The first dot clock has the same frequency as that of an internal video clock of a video image output apparatus for generating the analog video signal 101. The phase of the respective pulses of the first dot clock is not defined but fixed relative to the video signal; a reference phase whose phase deviation is zero in the graph of FIG. 14 represents such a phase relationship between the first dot clock and the video signal. The respective pulses of a second dot clock that is obtained using the factor of (Nd+2), on the other hand, have the phase relationship which varies gradually relative to the video signal along one horizontal line. One clock pulse corresponds to the phase of $2\pi$, and two clock pulses the phase of $4\pi$. As to the second dot clock, the phase deviation from the reference phase varies gradually in the range of 0 to $4\pi$ on one horizontal line. The range of $2\pi$ to $4\pi$ is equivalent to the range of 0 to $2\pi$, and the solid line in the graph of FIG. 14 indicates that the phase deviation in the range of 0 to $2\pi$ is repeated twice.

In case that the offset value Noff added to the factor Nd is equal to +1, the phase deviation varies in the range of 0 to $2\pi$, which corresponds to one cycle of the clock. When the offset value Noff is negative, the resulting waveform has a slope reversed to that shown in FIG. 14.

The abscissa of FIG. 14 corresponds to one line in the horizontal direction. The phase relationship between the video signal and the second dot clock linearly varies from position to position on the same line. In the second embodiment, image data for one line are divided into a plurality of blocks (40 blocks of #1 to #40 in FIG. 14), and the phase-related index used in the first embodiment is calculated for each block. The respective blocks have different phase relationships between the video signal and the second dot clock and thereby different phase-related indexes. It is accordingly thought that the second dot clock has an optimum phase in the block which has the maximum value of the phase-related index (for example, a block #j). A phase deviation of the block #j from the reference phase (or the initial phase of the line) is readily calculated from the position of the block #j according to the linear relationship of FIG. 14. The delay for giving the optimum phase to the dot clock can thus be determined according to the position of the block #j.

Figure 15:
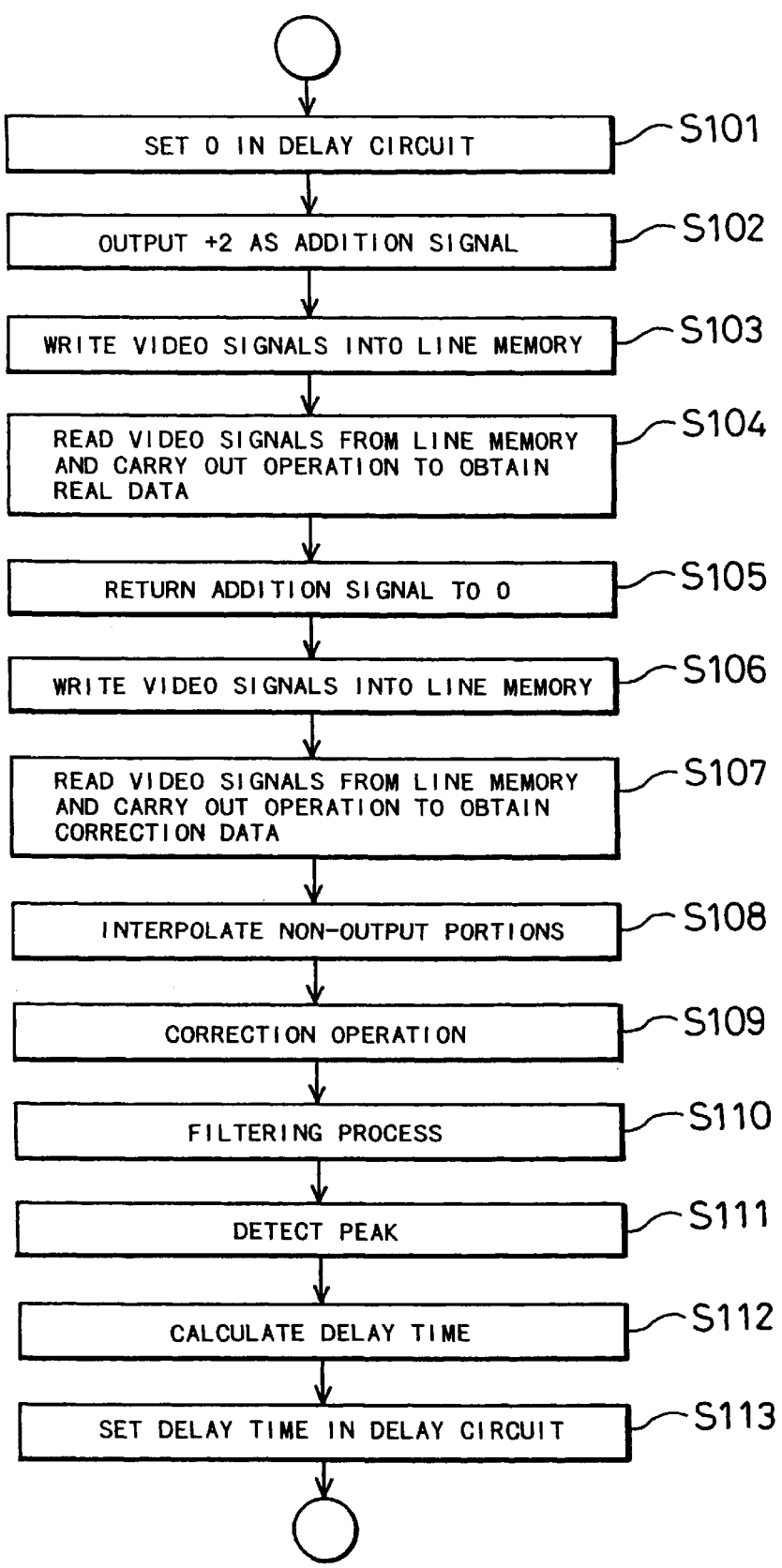
FIG. 15 is a flowchart showing a processing routine executed by the phase determination unit 15 and the delay setting unit 16 in the second embodiment.

FIG. 15 is a flowchart showing a processing routine executed by the phase determination unit 15 and the delay setting unit 16 in the second embodiment. When the program enters the routine, the CPU 8 generates the delay control signal 105 and sets the delay time $\phi$ in the delay circuit 10 equal to zero at step S101. Any value other than zero may be set as the initial delay time $\phi$. At step S102, the CPU 8 supplies the addition signal 106 to the adder circuit 65 (FIG. 13), and adds the offset value of 2 to the factor Nd. As mentioned above, the appropriate frequency Nd for generating the dot clock 201 is equal to 1040, and the initial value of frequency division factor is also set to 1040 in the frequency divider 64. The adder circuit 65 changes the value of frequency division factor Nd in the frequency divider 64 to 1042 at step S102. The PLL circuit 7a accordingly generates the dot clock 201 (or reference clock 200) having the frequency higher than the appropriate frequency.

At subsequent step S103, the CPU 8 sends the write arm signal 701 to the write timing control circuit 6 to store image data for one line into the line memory 4. The graph of FIG. 14 represents the phase deviation in the image data for one line thus sampled. The abscissa of FIG. 14, which is the time axis, also corresponds to the address in the line memory 4. The image data written into the line memory 4 are thus obtained by sampling the video signals while the phase of the dot clock 201 varies with an increase in address.

Referring back to the flowchart of FIG. 15, at step S104, the CPU 8 successively reads out the image data from the line memory 4, temporarily registers the image data into the RAM 9 of the CPU 8, and carries out an operation described below.

This operation first divides the image data obtained for the known total number of pixels Nd (=1040) for one line into a plurality of blocks, based on a minimum resolving power required for the phase adjustment. The minimum resolving power required for the phase adjustment corresponds to one delay step (or minimum delay difference) in the delay circuit 10. When one delay step in the delay circuit 10 is equal to 1 ns, for example, the resolving power for the phase adjustment can be set to 1 ns or one-to-an integer of 1 ns. The dot clock has the frequency of 50 MHz and the period of 20 ns as mentioned above. In the second embodiment, the total number of cycles of the dot clock for one line is increased by two, and the phase deviation over one line (the deviation of $4\pi$ shown in FIG. 14) thereby corresponds to 40 ns. When one line is divided into 40 blocks, each block corresponds to 1 ns, which is the required minimum revolving power. In this case, the number of pixels included in each block is equal to 26 (=1040/40). When one line is divided into an integral multiple of 40 (for example, 80 or 120), each block corresponds to one-to-an integer of the required minimum revolving power.

Namely it is preferable that the divisor of one line is set equal to an integral multiple of a rounded quotient obtained by dividing the offset value Noff (for example, 2), which is added to the factor Nd, by the product of the clock frequency (for example, 50 MHz) and the minimum delay step (for example, 1 ns) in the delay circuit 10. One or more blocks are mapped to the minimum delay step in the delay circuit 10 accordingly.

At step S104 in the flowchart of FIG. 15, a phase-related index $V_3$ for each block is calculated according to Equation 3 given below:

$$V_3(\#k) = \sum_{j=0}^{Mb-2} \{PD(j+1) - PD(j)\}^2 \quad (3)$$

wherein #k denote a block number, PD(j) denotes image data at a j-th pixel position in the k-th block, and Mb denotes the number of pixels included in the k-th block. In the above example, since one line is divided into 40 blocks, k ranges 1 to 40 and Mb is about 26. The phase-related index $V_3$ corresponds to the phase-related index $V_1$ obtained for each block according to Equation 1 in the first embodiment. The process of determining the phase-related index $V_3$ accordingly follows the routine shown in the flowchart of FIG. 4.

In accordance with an alternative application, Equation 4 given below may be used, in place of Equation 3, to calculate a phase-related index $V_4$ that corresponds to the second phase-related index $V_2$ in the first embodiment:

$$V_4(\#k) = \sum_{j=0}^{Mb-2} |PD(j+1) - PD(j)| \quad (4)$$

The phase-related index $V_3$ (or $V_4$) thus obtained for each block is hereinafter also referred to as 'real data'. The phase-related index $V_3$ for each block is stored in the RAM 9 of the CPU 8.

Figure 16A:
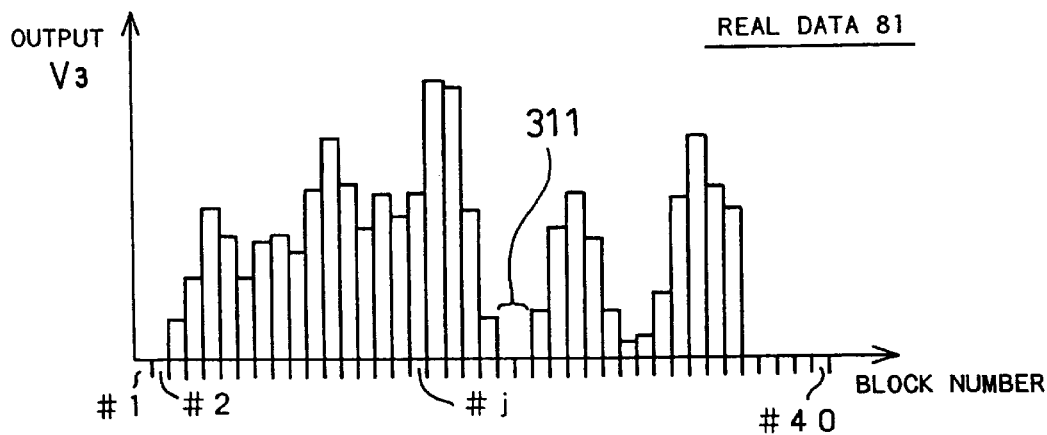
FIGS. 16(A)–16(C) are graphs showing the phase-related index $V_3$ obtained for the forty blocks #1 through #40 on one line.

FIG. 16(A) is a graph showing the phase-related index $V_3$ obtained for the forty blocks #1 to #40 on one line. As shown on the abscissa of FIG. 14, the block numbers #1 to #40 on the abscissa of FIG. 16(A) correspond to the address range of 0 to 1041 in the line memory 4. The phase-related index $V_3$ (or real data 81) for each block shown in FIG. 16(A) accordingly represents the data having information on the phase deviation for each video image portion when a video image of one line having a linearly varying phase is divided into 40 video image portions as shown in FIG. 14.

In case that the video signal 101 represents a striped image, wherein two different image levels (for example, black and white) periodically alternate with each other, the difference in phase-related index $V_3$ between the respective blocks in FIG. 16(A) depends upon only the phase deviation in the video image portions of the respective blocks. If the video signal 101 does not represent such a striped image, on the other hand, the phase-related index $V_3$ for each block includes an effect due to the contents of the video signal 101. Taking into account this fact, the second embodiment utilizes correction data shown in FIG. 16(B), in order to correct the real data shown in FIG. 16(A) and remove the effect due to the contents of the video signal 101, as described below. In case that the analog video signal 101 represents a striped image, wherein two different image levels periodically alternate with each other, the following correction process with the correction data may not be required. In this case, the delay φ for giving the optimum phase can be directly determined from the phase-related index $V_3$.

Referring back to the flowchart of FIG. 15, at step S105, the CPU 8 returns the addition signal 106 shown in FIG. 13 to zero and thereby returns the factor in the frequency divider 64 to the original appropriate value Nd (=1040). At subsequent step S106, the video signals are written into the line memory 4, in the same manner as in step S103. The program then proceeds to step S107, at which the phase-related index $V_3$ is calculated for each block in the same manner as in step S104. This procedure provides the correction data 82 shown in FIG. 16(B).

Figure 16B:
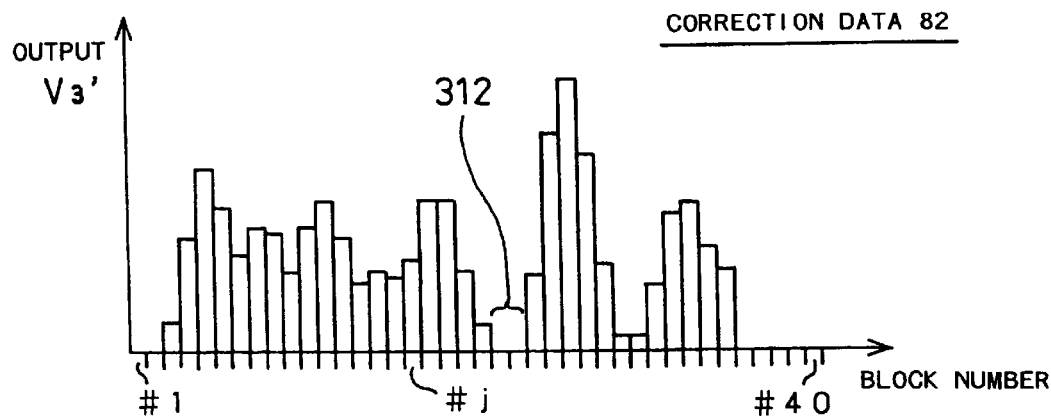

In the correction data 82 (or phase-related index $V_3'$) shown in FIG. 16(B), the frequency of the dot clock signal or dot clock 201 coincides with the frequency of the video clock used for generating video signals. While the phase relationship between the video signal 101 and the dot clock 201 is not defined, the phase of the dot clock 201 and its deviation from the optimum phase are fixed for one line. The correction data 82 accordingly includes a component caused by a variation in the contents of a video image expressed by the video signal 101 and another component caused by the fixed phase deviation. The component caused by the phase deviation is constant for one line and can thus be neglected. Namely the correction data 82 can be regarded to include only the component caused by the variation in contents of the video image over the line.

In case that the video signal 101 includes a solid image portion which shows no variation in signal level, both the real data 81 and the correction data 82 have the output levels substantially equal to zero, such as non-output portions 311 and 312 shown in FIGS. 16(A) and 16(B). The correcting operation with the correction data 82 cannot be carried out for these portions. Referring back to the flowchart of FIG. 15, at step S108, the CPU 8 detects the non-output portion 312 in the correction data 82 whose level is no more than a predetermined threshold value, and interpolates the non-output portion 312 of the correction data 82 and the non-output portion 311 of the real data 81 respectively with the prior and subsequent data, thereby obtaining data not equal to zero. A linear interpolation or an arbitrary non-linear interpolation may be carried out for the interpolating operation.

At subsequent step S109, the CPU 8 divides the interpolated real data by the interpolated correction data, thereby to generate corrected data which includes only the information on the phase deviation from the optimum phase.

Figure 16C:
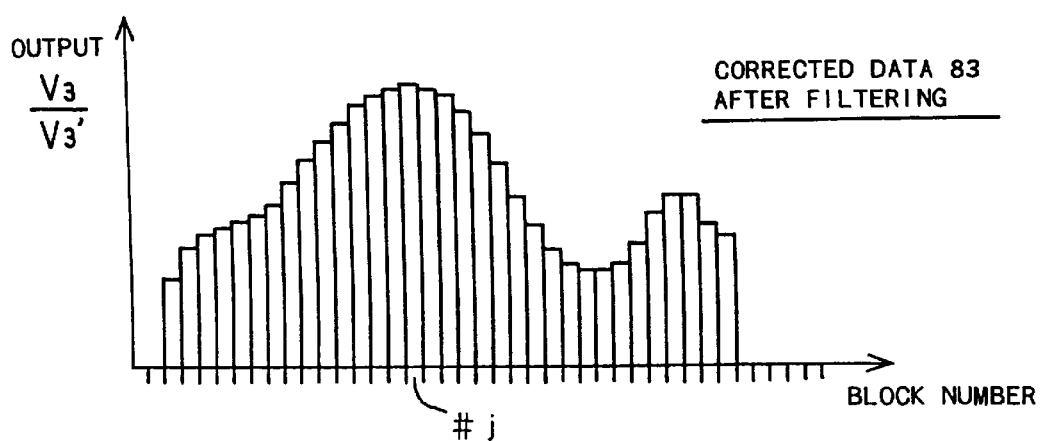

Since the corrected data thus obtained may include a noise component, the filtering process is executed at step S110 to remove the noise component and take out only a low-band component of the corrected data. The filtering process is realized by a convolution operation using a conventional low-pass filter. FIG. 16(C) shows corrected data 83 after the filtering. The corrected data 83 shown in FIG. 16(C) can be used as the phase-related index showing the degree of the phase deviation in each block. The filtering process of step S110 may be omitted in some cases. The filtering process, however, determines the delay time giving the optimum phase of the dot clock 201 with a higher accuracy.

At step S111 in the flowchart of FIG. 15, the CPU 8 selects the block in which the corrected data 83 has a maximum value. Since a linear relationship is held between the block number and the phase as shown in FIG. 14, a phase deviation $\theta_{op}$ giving the optimum phase is determined according to the block number. When the maximum exists in j-th block as shown in FIG. 16(C), for example, the phase deviation $\theta_{op}$ giving the optimum phase is calculated from the block number #j in the graph of FIG. 14 according to Equation 5 given below:

$$\theta_{op} = \frac{4\pi \times j}{40} \quad (5)$$

At subsequent step S112, a delay $\phi_{op}$ [ns] to be set in the delay circuit 10 is calculated from the phase deviation $\theta_{op}$ thus obtained. For example, when one period of the dot clock, that is, the phase of $2\pi$, corresponds to 20 ns, the delay $\phi_{op}$ is given by Equation 6 below:

$$\phi_{op} = \frac{\theta_{op} \times 20}{2\pi} \quad (6)$$

The delay $\phi_{op}$ given by Equations 5 and 6 may be calculated directly from the block number j of the block in which the phase-related index has the maximum value. The video signals 101 can be sampled at the optimum phase with the dot clock 201 delayed by the delay time $\phi_{op}$. The program subsequently proceeds to step S113, at which the CPU 8 outputs the delay control signal 105 to set the delay $\phi_{op}$ in the delay circuit 10. The delay circuit 10 accordingly generates the dot clock 201 having the optimum phase.

Since the offset value Noff added to the factor Nd in response to the addition signal 106 is equal to +2 in the second embodiment, the corrected data 83 shown in FIG. 16(C) potentially has two peaks. Even when one of the peaks exists in the blanking area of the video signal, the other peak always exists outside the blanking area. This enables the delay time giving the optimum phase to be always determined.

Although the offset value Noff added to the factor Nd is equal to +2 in the above embodiment, the offset value may be set at any integer such as −2, +1, and −1; the delay time giving the optimum phase can also be determined in the same manner regardless of the offset value. When the offset value is set equal to either +1 or −1, the peak may exist in the blanking area and cannot be detected in some cases. In this case, the peak position is specified by giving a predetermined bias to the delay time and shifting the peak position. The delay time giving the optimum phase is then determined by removing the bias from the delay time corresponding to the specified peak position.

When the absolute value of the offset Noff added to the factor Nd is two or more, the corrected data 83 always has at least one peak outside the blanking area. The above adjustment with a bias is accordingly not required in these cases. From that point of view, it is preferable that the absolute value of the offset is at lease two. When the offset value is set equal to +2 or −2, a relatively large number of pixels are included in each block, and the corrected data 83 (that is, the phase-related index) can thus be determined with a relatively high accuracy. Based on these facts, the most preferable offset value is either +2 or −2. If the corrected data 83 has two or more peaks, the shortest delay time can be selected, for example.

Even when the video signal has rounding or distortion, the second embodiment can automatically adjust the phase of the dot clock to obtain the most stable sampling results.

The following describes some possible modifications of the first and the second embodiments described above.

The phase-related index is not restricted to those defined by Equations 1 through 4, but may by any index representing the sharpness of the sampled image data. By way of example, a statistic variance or a standard deviation of the sampled image data may be used as the phase-related index, in place of those specified by Equations 1 through 4.

When the appropriate factor Nd used for generating the dot clock 201 is unknown, the appropriate factor Nd can be determined first according to one of the embodiments described below before the adjustment of the phase is carried out according to either the first embodiment or the second embodiment. This procedure automatically adjusts both the frequency and the phase of the dot clock.

C. Third Embodiment

Figure 17:
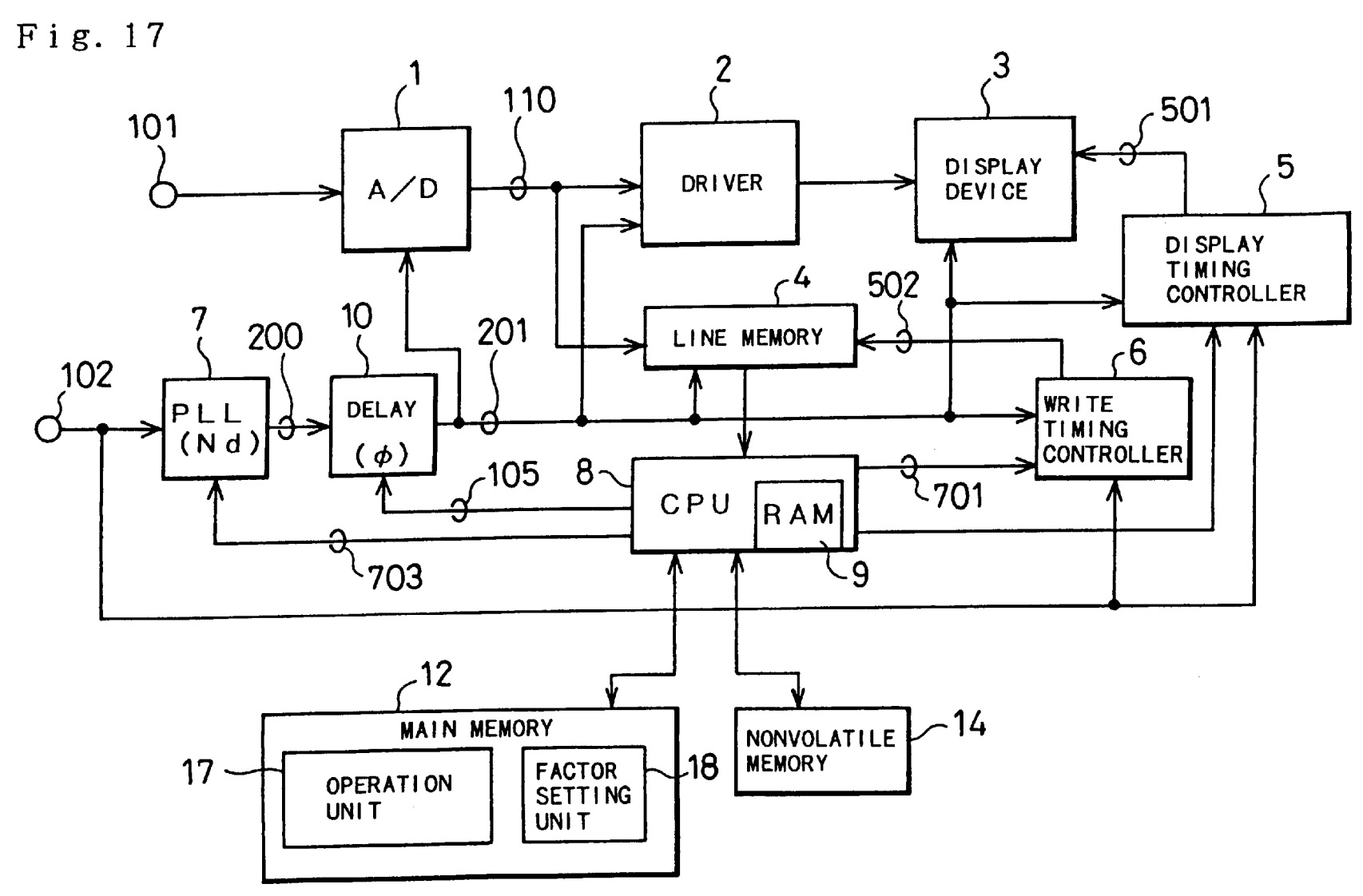

FIG. 17 is a block diagram illustrating the structure of a video image display apparatus for carrying out adjustment of the frequency of a dot clock, as a third embodiment according to the present invention. The video image display apparatus of the third embodiment shown in FIG. 17 has a similar structure to that of the first embodiment shown in FIG. 1, except that the phase determination unit 15 and the delay setting unit 16 of the first embodiment are replaced by an operation unit 17 and a factor setting unit 18. The CPU 8 executes the computer programs stored in the main memory 12 to implement the functions of the operation unit 17 and the factor setting unit 18.

Figure 18:
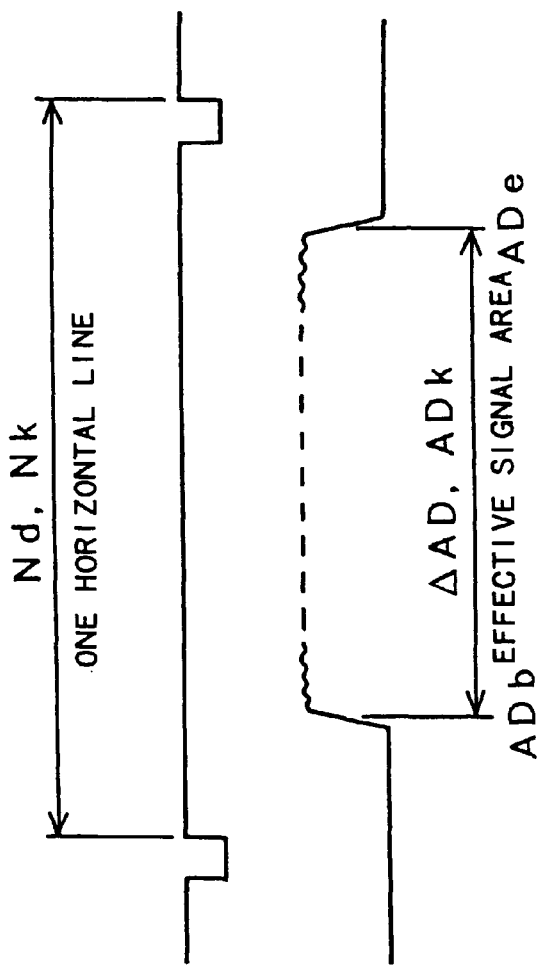
FIGS. 18(a) and 18(b) shows a process of determining the appropriate factor Nd to be set in the PLL circuit 7 in the third embodiment.

The purpose of the third embodiment is to set the frequency of the dot clock 201 (that is, the factor Nd in the PLL circuit 7) automatically to an appropriate value. FIGS. 18(a) and 18(b) show a process of determining the appropriate factor Nd in the third embodiment. FIG. 18(a) shows a horizontal synchronizing signal 102, and FIG. 18(b) shows a video signal 101 for one line in the horizontal direction.

The object here is to determine a desirable factor Nd (or the total number of pixels for one line in the horizontal direction) that is used for multiplying the frequency of the horizontal synchronizing signal 102. The process first sets a provisional factor Nk in the PLL circuit 7 and samples the video signals 101 using a dot clock generated with the factor Nk. The process then analyzes the sampled video signals and determines a length or a width ΔADk of an effective signal area. The length ΔADk is calculated as a difference between an address ADs at a starting position of the effective signal area and an address ADt at a terminal position thereof The starting position and the terminal position of the effective signal area are detected as the positions where a level of the video signal changes by no less than a predetermined threshold value.

The provisional factor Nk and the length ΔADk of the effective signal area are related to a desirable factor Nd and a true length ΔAD of the effective signal area as shown in Equation 7 given below:

$$\frac{Nd}{Nk} = \frac{\Delta AD}{\Delta ADk} \quad (7)$$

wherein the true length ΔAD of the effective signal area is a known value. For example, ΔAD=640 [pixels] for VGA, ΔAD=800 [pixels] for SVGA, ΔAD=1024 [pixels] for XGA, and ΔAD=1280 [pixels] for SXGA. Equation 7 can be written as Equation 8 to give the desirable factor Nd:

$$Nd = \frac{\Delta AD}{\Delta ADk} \times Nk \quad (8)$$

The desirable factor Nd is obtained by multiplying the provisional factor Nk by the ratio of the known length ΔAD of the effective signal area to the measured length ΔADk.

Figure 19:
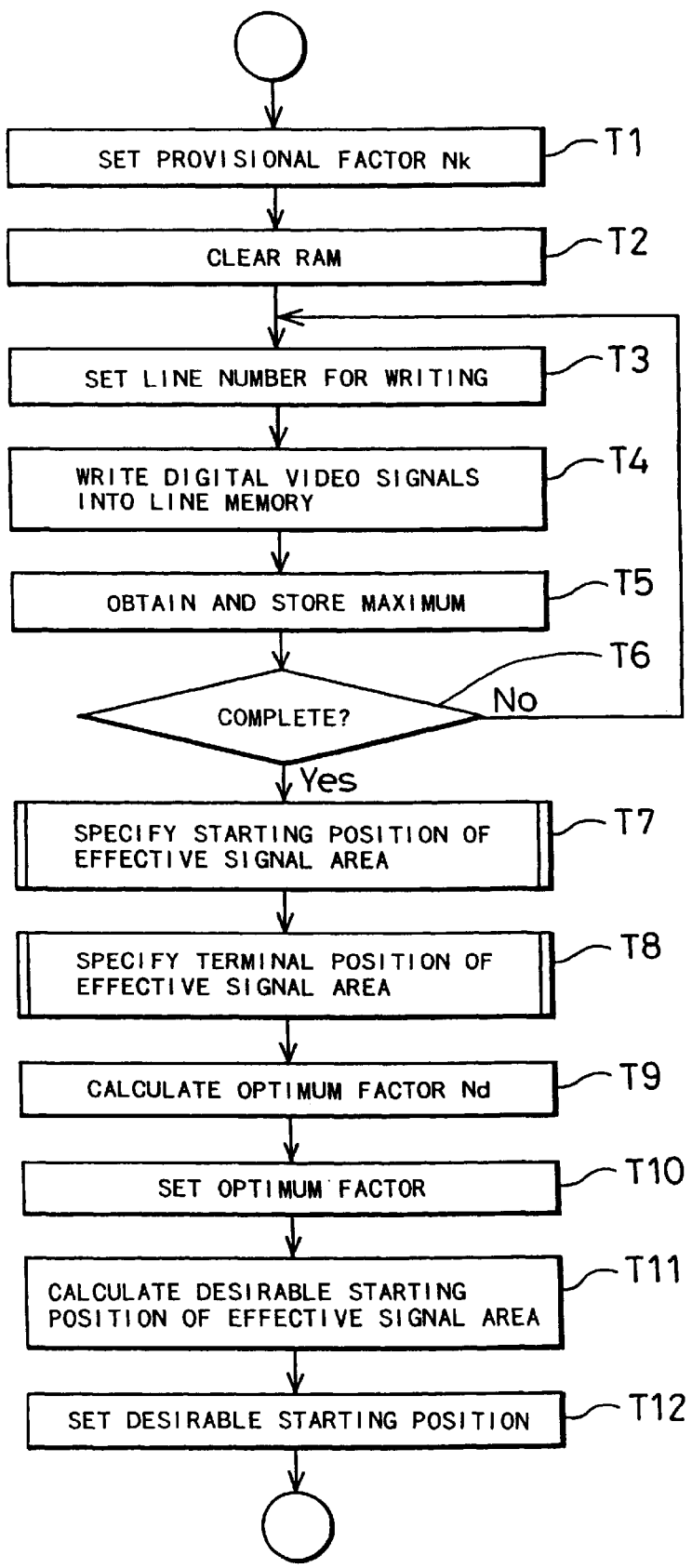
FIG. 19 is a flowchart showing a processing routine executed by the operation unit 17 and the factor setting unit 18 in the third embodiment.

FIG. 19 is a flowchart showing a processing routine executed by the operation unit 17 and the factor setting unit 18 in the third embodiment. When the program enters the routine, the CPU 8 supplies a factor setting signal 703 to the PLL circuit 7, in order to set a provisional factor Nk at step T1. A plurality of factors corresponding to a variety of video image output apparatuses, such as commercially-available popular personal computers, are registered in advance in the nonvolatile memory 14. An appropriate factor corresponding to the type of the video image output apparatus connected to the video image display apparatus is selected among the registered factors and used as the provisional factor Nk. The type of the video image output apparatus connected to the video image display apparatus can be identified by analyzing the frequencies and polarities of the horizontal synchronizing signal and the vertical synchronizing signal.

At step T2, the CPU 8 clears the contents of the internal RAM 9. The addresses in the RAM 9 are one-to-one mapped to the addresses in the line memory 4.

At subsequent step T3, the CPU 8 instructs the write timing control circuit 6 to set the line number of the digital video signals 110 to be written into the line memory 4.

At step T4, the CPU 8 sends the write arm signal 701 to the write timing control circuit 6. The write timing control circuit 6 outputs a write enable signal 502 at the timing when the line position of the digital video signals 110 coincides with the line number set at step T3, so as to start the writing operation into the line memory 4. Image data at the scanning line of the line number are thereby stored into the line memory 4.

The CPU 8 obtains and stores a maximum value at each pixel position with respect to image data for a plurality of lines at step T5, and determines whether the processing of steps T3 through T5 has been completed for a predetermined number of lines at step T6. When not completed, the program returns to step T3.

FIGS. 20(a)–20(d) show the details of the processing executed at steps T3 through T6 in the flowchart of FIG. 19. The processing of steps T3 through T6 obtains a maximum value of image data at each position of identical ordinal number from the starting end of each line over a plurality of lines (that is, at each address position over a plurality of lines). The maximum values are to be obtained for two range in the horizontal direction: a first range of address ADa to ADb including a starting address ADs of an effective signal area, and a second range of address ADc to ADd including a terminal address ADt of the effective signal area as shown in FIG. 20(b). The reasons why the ranges of interest for the operation of obtaining the maximum values are specified are that the final objects are only the starting address ADs and the terminal address Adt, and that the processing only in the vicinities of these positions is required and sufficient for the purpose. The starting address ADs and the terminal address ADt of the effective signal area are not precisely known in advance, but can be estimated from the known length ΔAD of the effective signal area. The processing of steps T3 through T6 determines the first range of ADa to ADb and the second range of ADc to ADd respectively including the estimated positions of the starting address ADs and the terminal address ADt.

In this third embodiment, the image data for a plurality of lines are used for the processing. In principle, the effective signal area can be identified from a level change of image data for one line. If there is no distinct level change in the vicinities of the starting address ADs and the terminal address ADt of the effective signal area, however, it may be rather difficult to determine the starting address ADs and the terminal address ADt with a high accuracy based on the image data for only one line. Referring to FIGS. 20(c) and 20(d), the third embodiment accordingly obtains the maximum value at each pixel position for the image data of a plurality of lines. This procedures gives data that can readily identify the level changes at the starting address ADs and the terminal address ADt of the effective signal area.

If the image data for one line is sufficient for identifying the starting address ADs and the terminal address ADt of the effective signal area, the process of determining the maximum value at each pixel for the image data of a plurality of lines may be omitted.

Figure 21:
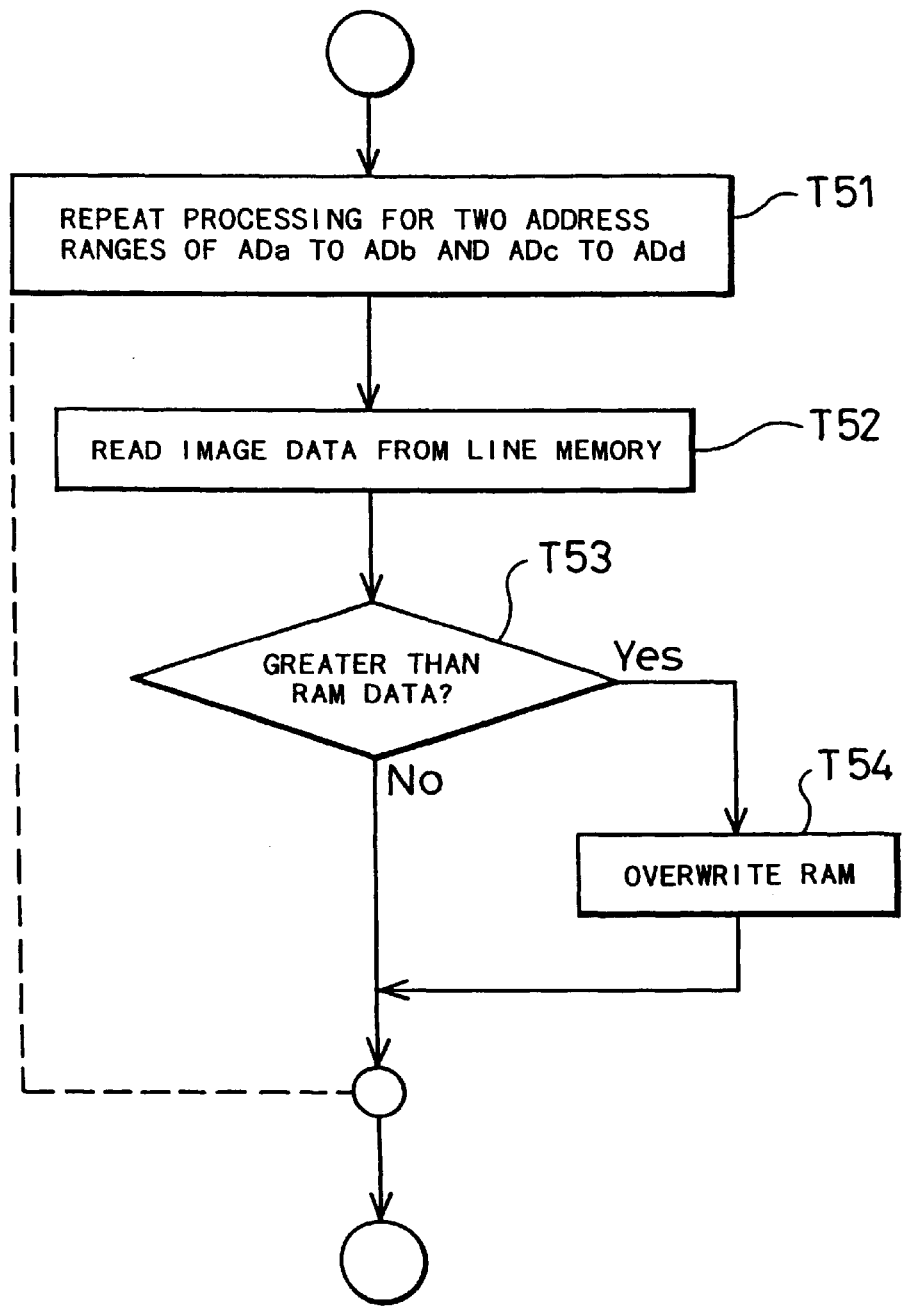
FIG. 21 is a flowchart showing details of the processing executed at steps T3 through T6 in the flowchart of FIG. 19.

FIG. 21 is a flowchart showing details of the processing executed at steps T3 through T6 in the flowchart of FIG. 19. The broken line in FIG. 21 represents the range of repetition.

When the program enters the routine of FIG. 21, the CPU 8 first sets the addresses ADa, ADb, ADc, and ADd that define the two ranges of interest for determining the starting address ADs and the terminal address ADt, and instructs to repeat the processing for the two ranges defined by these addresses at step T51. By way of example, it is assumed that the pixel numbers of the video signal 101 for one line range from 0 to 1039 and that the address in the line memory 4 starts from 0. In this case, for example, the range of 0 to 250 is specified as the first range of ADa to ADb and the range of 800 to 1040 as the second range of ADc to ADd. The appropriate addresses ADa, ADb, ADc, and ADd for the known lengths ΔAD of the effective signal area are registered in advance in the nonvolatile memory 14. The operation unit 17 specifies the display standard (for example, VGA, SVGA), which the video signal 101 follows, based on the horizontal synchronizing signal and the vertical synchronizing signal of the video signal 101, and reads the values of the addresses ADa, ADb, ADc, and ADd for the specified standard from the nonvolatile memory 14.

The CPU 8 successively reads out the image data of each pixel stored in the line memory 4 at step T52, and compares the maximum data stored in the RAM 9 of the CPU 8 with the image data at the corresponding address in the line memory 4 at step T53. The CPU 8 then overwrites the maximum data into the same address in the RAM 9 at step T54. This procedure is repeatedly executed for a predetermined number of lines (for example, 5 lines), so as to obtain the maximum value for each pixel.

Referring back to the flowchart of FIG. 19, at step TG, it is determined whether the processing has been completed for the predetermined number of lines. When the number of processed lines meets the predetermined number, the answer becomes affirmative at step T6. When not completed, the program returns to step T3 and repeats the processing of steps T3 through T6.

The processing of steps T3 through T6 is repeated a plurality of times, while the different line numbers are sequentially set at step T3. This procedures gives the data from which the starting address ADs and the terminal address ADt can be determined with a high accuracy. For example, in a video signal representing a black and white video image having a checker flag pattern, the positions of white levels and black levels differ from line to line. The maximum data eventually stored in the RAM 9 for such an image are accordingly those data in which most pixels in the effective signal area represent white levels. As to another video signal which displays a specific video image in a window against a background of a geometric pattern, one or more pixels in the vicinity of a left end (starting position) or a right end (terminal position) of the effective signal area may represent black levels in some lines. In this case, however, if some of the plurality of lines have a non-black level at the left end, and others at the right end of the effective signal area, the maximum data eventually stored in the RAM 9 have non-black levels at the left end and the right end of the effective signal area. The starting address ADs and the terminal address ADt of the effective signal area can thus be readily specified from these maximum data according to the steps described below.

Figure 22:
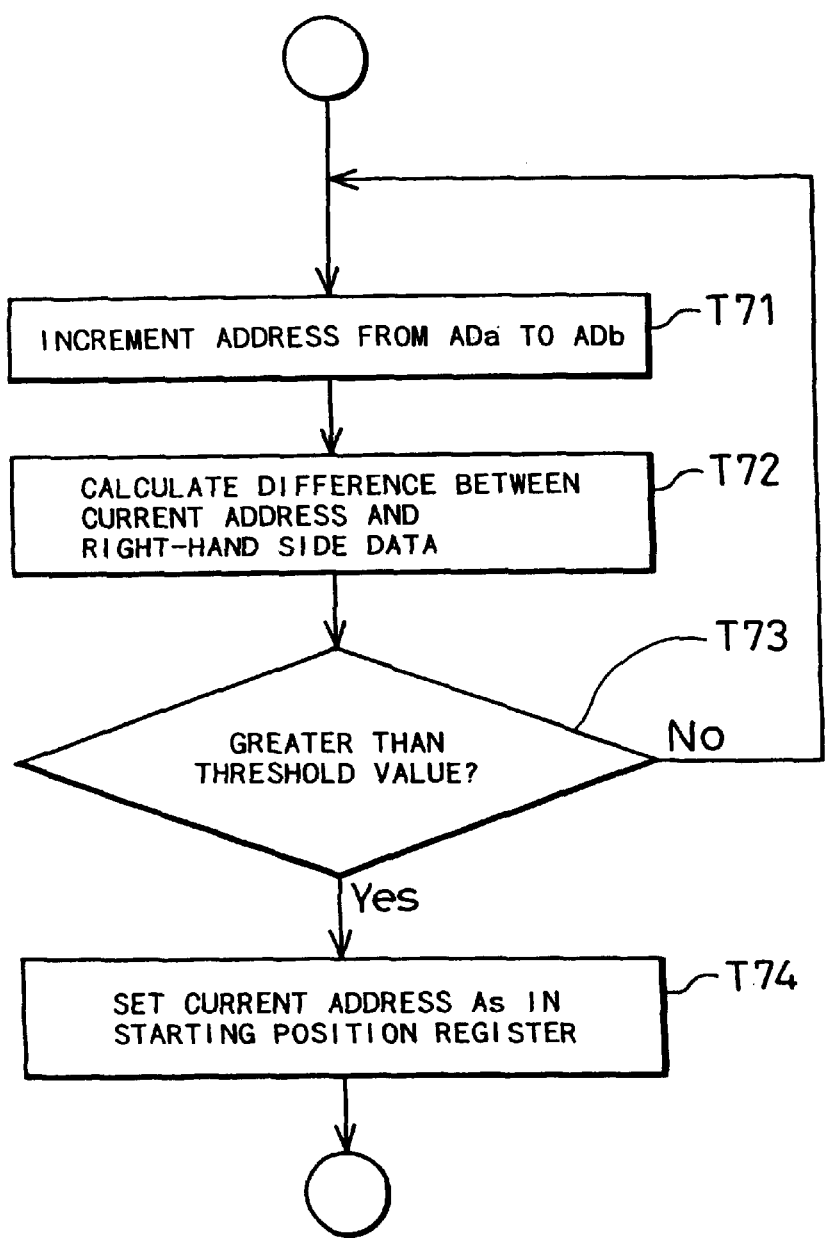
FIG. 22 is a flowchart showing the details of the processing executed at step T7 in the flowchart of FIG. 19.

Referring back to the flowchart of FIG. 19, at step T7, the CPU 8 identified the starting position (or starting address ADs) of the effective signal area in the horizontal direction from the maximum data read out from the RAM 9. FIG. 22 is a flowchart showing the details of the processing executed at step T7 in the flowchart of FIG. 19.

Figure 20:
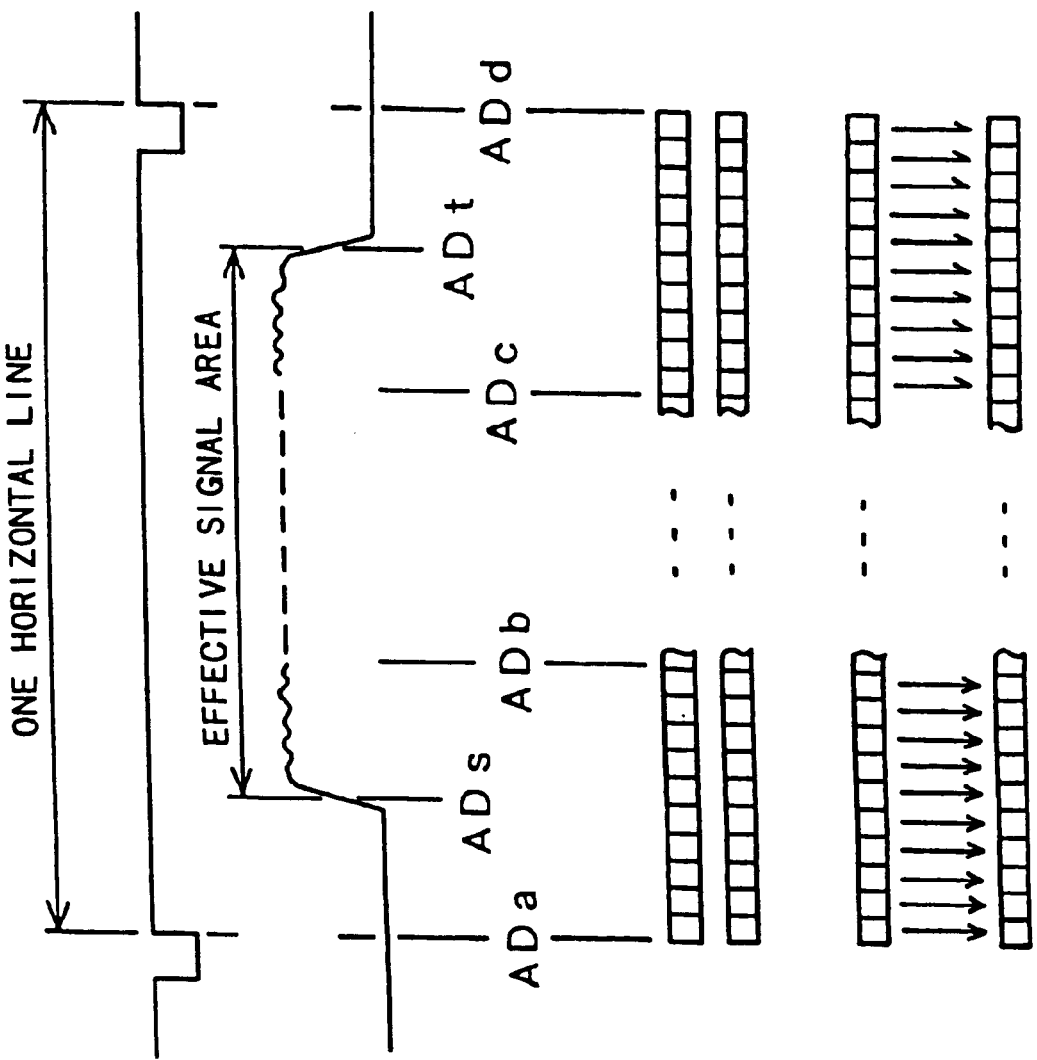
FIGS. 20(a)–20(d) show the details of the processing executed at steps T3 through T6 in the flowchart of FIG. 19.

At step T71, the CPU 8 successively increases the address of the RAM 9 by one from the starting point ADa to the terminal point ADb of the first range (FIG. 20(*b*)), in which the starting address is to be identified. For example, the starting point ADa is equal to zero and the terminal point ADb is equal to 250. As mentioned above, the addresses in the RAM 9 coincide with the addresses in the line memory 4.

At subsequent step T72, the CPU 8 subtracts the data at a current address from another data at the next address to the right-hand side to obtain their difference. When the data at the next address is greater than that at the current address, the difference is positive. A greater variation in data results in a larger difference.

Figure 43:
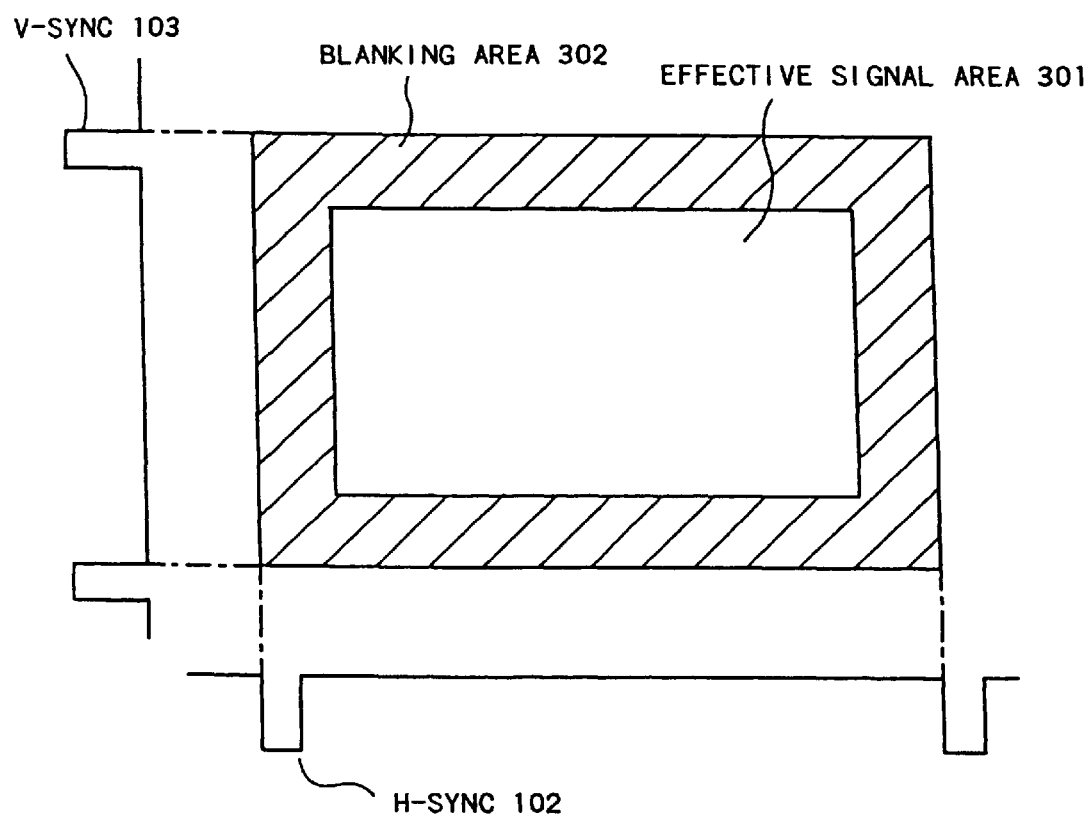
FIG. 43 shows timing of the video signal 101 in a two-dimensional manner.

The program then proceeds to step T73, at which the difference is compared with a predetermined threshold value. When the difference is smaller than the threshold value, the program determines that the difference represents a blanking area 302 of the video signal 101 (FIG. 43) or a noise and returns to step T71. When the difference is equal to or larger than the threshold value, on the contrary, the program detects a start of the effective signal area 301 (FIG. 43) and proceeds to step T74, at which a current address As is stored as the starting address ADs into a starting position register (not shown) of the CPU 8. The routine of FIG. 22 detects the starting position of the effective signal area as the position at which the difference between adjoining pixels in the maximum data stored in the RAM 9 becomes no less than a predetermined threshold value. In other words, the starting position of the effective signal area is detected as the position at which the level change of the image data becomes no less than a predetermined threshold value.

Figure 23:
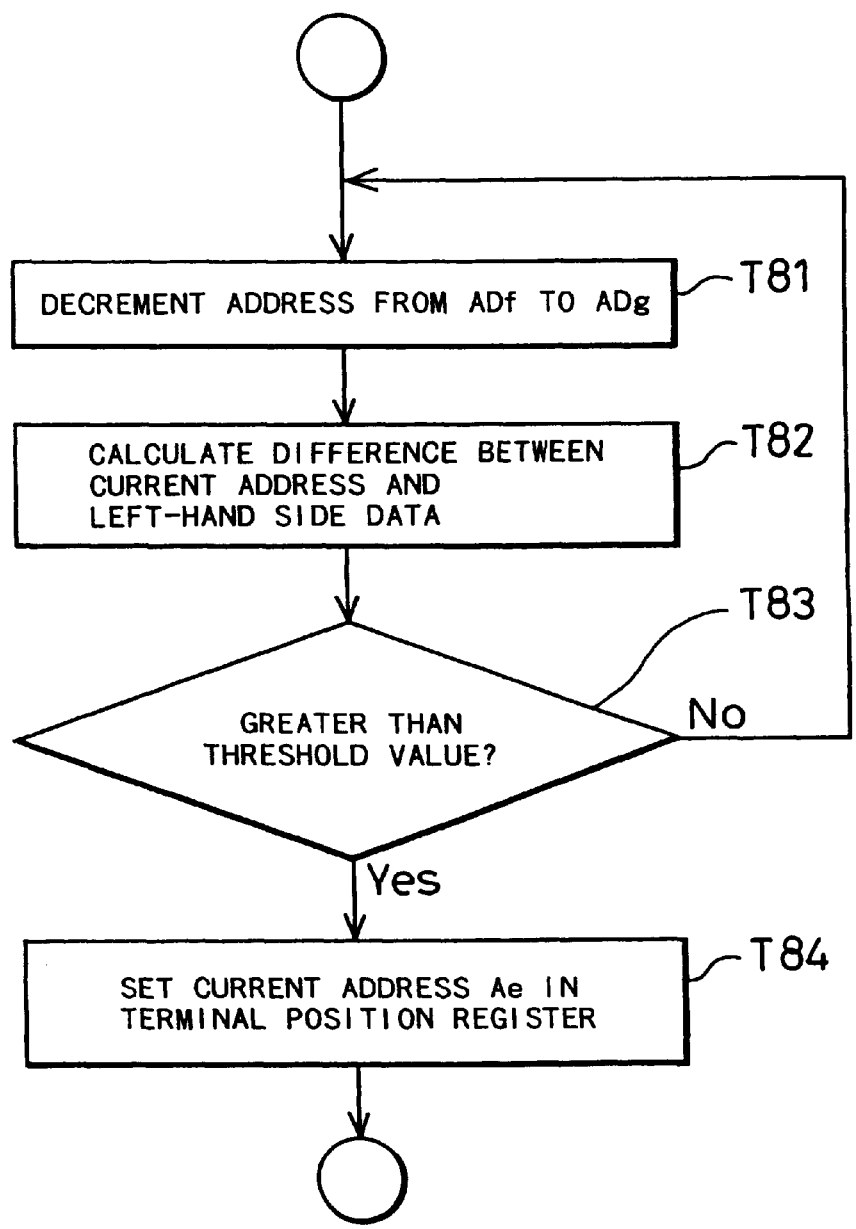
FIG. 23 is a flowchart showing the details of the processing executed at step T8 in the flowchart of FIG. 19.

At step T8 of FIG. 19, the CPU 8 identifies the terminal position (or terminal address ADt) of the effective signal area in the horizontal direction based on the maximum data read out from the RAM 9 in a similar manner to step T7,. FIG. 23 is a flowchart showing the details of the processing executed at step T8 in the flowchart of FIG. 19.

When the program enters the routine of FIG. 23, the CPU 8 decreases the address in the RAM 9 by one from ADf to ADg at step T81. By way of example, the addresses ADf and ADg may be respectively obtained by adding the number of pixels (=800) in the effective signal area in the horizontal direction to the starting address ADs detected at step T7 with a certain margin, for example, one tenth (=80). For example, ADf=ADs+880 and ADg=ADs+720.

The address range of ADf to ADg set at step T81 may be coincident with the second range of ADc to ADd shown in FIG. 20(*b*). The use of the estimated range of ADf to ADg estimated from the starting address ADs of the effective signal area would reduce the range to be processed and therefore shorten the required processing time.

At subsequent step T82, the CPU 8 subtracts the data at a current address from another data at the preceding address to the left-hand side to obtain a difference. When the data at the preceding address is greater than that at the current address, the difference is positive. A greater variation in data results in a larger difference.

The program then proceeds to step T83, at which the difference is compared with a predetermined threshold value. When the difference is smaller than the threshold value, the program determines that the difference represents a blanking area 302 of the video signal 101 (FIG. 43) or a noise and returns to step T81. When the difference is equal to or larger than the threshold value, on the contrary, the program detects an end of the effective signal area 301 (FIG. 43) and proceeds to step T84, at which a current address Ae is stored as the terminal address ADt into a terminal position register (not shown) of the CPU 8.

As described above, the third embodiment detects the positions at which the level change of the image data becomes equal to or greater than the respective threshold values, thereby detecting the starting position and the terminal position of the effective signal area.

Referring back to the flowchart of FIG. 19, at step T9, the CPU 8 calculates an optimum factor Nd to be set in the PLL circuit 7 from the starting position ADs and the terminal position ADt of the effective signal area thus obtained.

In the above procedure, the video signal 101 representing an effective signal area of 800 pixels has been sampled by the dot clock generated with the provisional factor Nk; the sampled image data have been written into the line memory 4; and the starting address ADs and the terminal address ADt of the effective signal area have been detected based on the image data read out of the line memory 4. The width of the effective signal area can be calculated to be (ADt-ADs+1) pixels from these addresses ADs and ADt. Note that the true width of the effective signal area for this video signal is known to be 800 pixels.

The total number of pixels Nd for one horizontal line of the video signal 101 is calculated by Equation 9 given below:

$$Nd = INT\left[\frac{800}{ADt - ADs + 1} \times Nk + 0.5\right] \quad (9)$$

wherein the operator INT represents the operation of taking integral part of the result while omitting the decimal part. Equation 9 is equivalent to Equation 8 given above. Since the value of 0.5 is added in the brackets at the right-hand side, Equation 9 includes a rounding operation for rounding the result to the nearest whole number. The rounding operation further improves the accuracy of the total number of pixels Nd thus determined, although it may be omitted.

Equation 9 determines the total number of pixels Nd when the effective signal area includes 800 pixels. In general, the following Equation 10 is applied to determine the total number of pixels Nd, wherein ΔAD represents the number of pixels included in the effective signal area:

$$Nd = INT\left[\frac{\Delta AD}{ADt - ADs + 1} \times Nk + 0.5\right] \quad (10)$$

The value Nd obtained here corresponds to the total number of pixels of the video signal 101 in the horizontal direction. The value Nd is then set as the factor Nd in the PLL circuit 7. A resulting video image displayed on the display device 3 will not show any vertical stripes due to the beats.

Referring back again to the flowchart of FIG. 19, at step T10, the CPU 8 sends the factor setting signal 703 to the PLL circuit 7, so as to set the desirable total number of pixels Nd in the horizontal direction calculated at step T9 as the factor Nd in the PLL circuit 7.

At subsequent step T11, an actual starting position of the effective signal area is calculated from the starting address ADs. Since the starting address ADs represents the address at a starting position set for the provisional factor Nk, some correction is required to determine the actual starting position for the true factor Nd. An address ADp at the actual starting position of the effective signal area set for the true factor Nd is calculated according to Equation 11 given below:

$$ADp = INT\left[\frac{Nd}{Nk} \times ADs + 0.5\right] \quad (11)$$

In other words, the desirable address ADp of the starting position is obtained by multiplying the address ADs of the starting position set for the provisional factor Nk by a ratio (Nd/Nk) of the desirable factor Nd to the provisional factor Nk. The rounding operation in Equation 11 further improves the accuracy of the address ADp thus determined.

The program then proceeds to step T12, at which the CPU 8 sets the obtained starting position ADp in the display timing control circuit 5 that functions as the display timing means. This procedure makes a video image represented by the video signal 101 to be displayed at an optimum position in the horizontal direction on the display device 3.

If the driving circuit 2 has a internal memory, the line memory 4 may be replaced by this memory and thereby omitted.

The storage capacity of the line memory 4 may be less than the number of pixels of the display device 3 in the horizontal direction as long as the starting position and the terminal position of the effective signal area in the horizontal direction can be detected. The line memory 4 is required to have the capacity for storing at least image data of the first range ADa to ADb and the second range ADc to ADd shown in FIG. 20(*b*). The RAM 9 can thus be readily integrated with other circuits on one LSI.

Since the variety of operations in the flowchart of FIG. 19 are carried out asynchronously with the dot clock 201, a low-speed CPU can be sufficiently applied for the CPU 8.

The CPU 8 is not required to be a specific processor for carrying out the various operations and setting the factor as described above, but may be replaced by any microprocessor, such as those for adjusting the screen conditions including brightness and contrast of the display device.

In the third embodiment described above, the length (or width) of the effective signal area is calculated from the starting position and the terminal position of the effective signal area. Alternatively, the length of the effective signal area may be directly determined without obtaining the addresses of the starting position and the terminal position of the effective signal area. The alternative method may check the level change of each pixel on one line, and start the counting-up of pixels at the starting position of the effective signal area and terminate the counting-up at the terminal position of the effective signal area based on the level change, thereby determining the length of the effective signal area.

As described above, the third embodiment can automatically determine the total number of pixels Nd in the horizontal direction without any specific hardware structure but by simply analyzing the sampled image data, even when the blanking area and the total number of pixels Nd of the effective signal area in the horizontal direction are unknown. A dot clock can be generated by multiplying the frequency of the horizontal synchronizing signal by the total number of pixels Nd so that the sampled video image will not shows any vertical stripes due to the beats.

D. Fourth Embodiment

Figure 24:
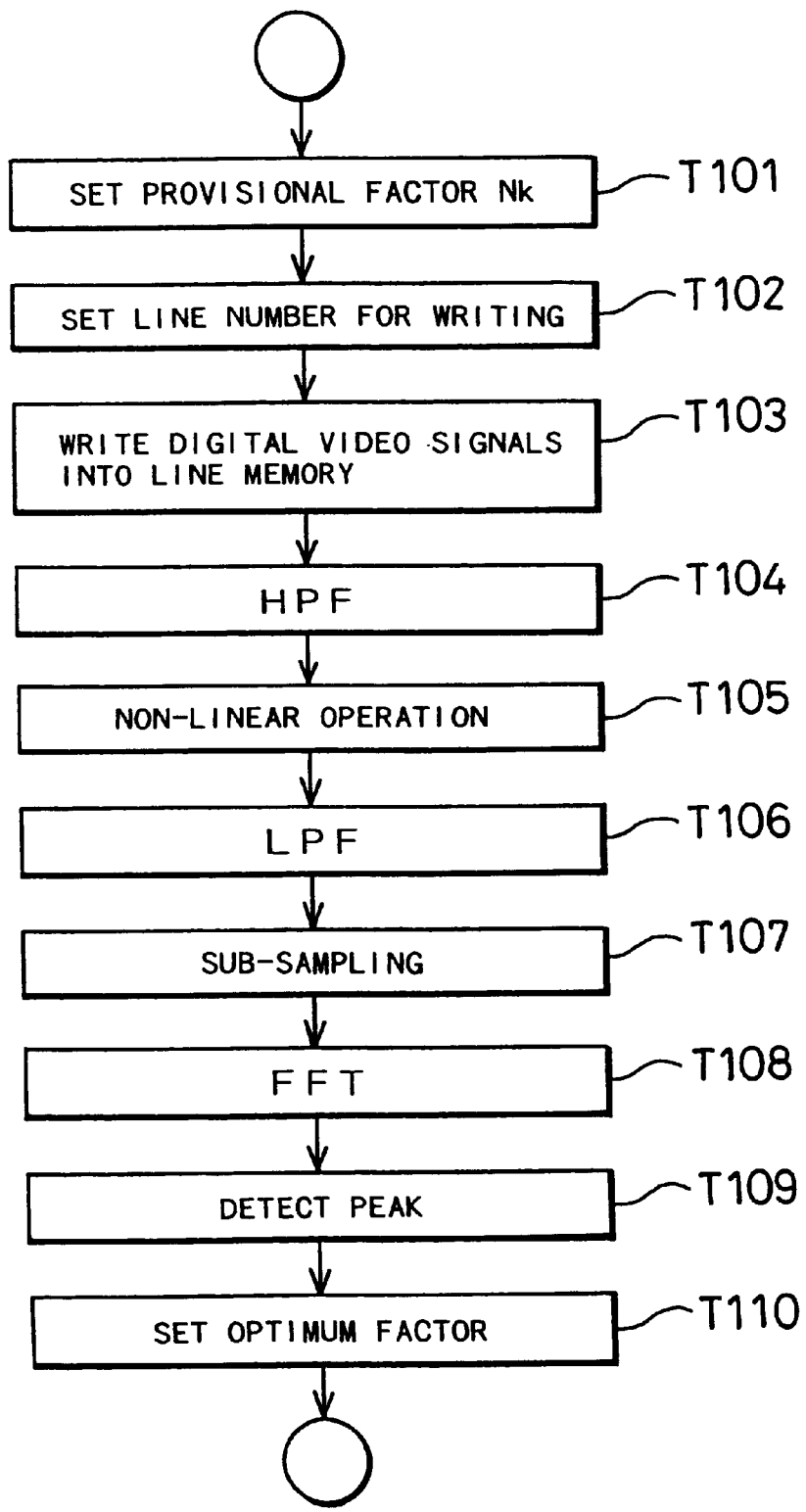
FIG. 24 is a flowchart showing a processing routine executed in a fourth embodiment according to the present invention.

FIG. 24 is a flowchart showing a processing routine executed in a fourth embodiment according to the present invention. The fourth embodiment utilizes the video image display apparatus of the third embodiment shown in FIG. 17. When the program enters the routine of FIG. 24, the CPU 8 first sets a provisional factor Nk in the frequency divider 64 in the PLL circuit 7 at step T101. A plurality of factors corresponding to a variety of video image output apparatuses, such as commercially-available popular personal computers, are registered in advance in the nonvolatile memory 14. An appropriate factor corresponding to the type of the video image output apparatus connected to the video image display apparatus is selected among the registered factors and used as the provisional factor Nk. The type of the video image output apparatus connected to the video image display apparatus can be identified by analyzing the frequencies and polarities of the horizontal synchronizing signal and the vertical synchronizing signal.

At step T102, the CPU 8 instructs the write timing control circuit 6 to set the line number of the digital video signals 110 to be written into the line memory 4.

The program then proceeds to step T103, at which the CPU 8 sends the write arm signal 701 to the write timing control circuit 6. The write timing control circuit 6 outputs the write enable signal 502 at a timing when the line position of the digital video signals 110 coincides with the line number set at step T102, so as to start the writing of image data into the line memory 4. Image data corresponding to the line number are thereby stored into the line memory 4.

At subsequent step T104, the CPU 8 reads the image data stored in the line memory 4 and removes a low-band component of the image data through a high-pass filtering process, thus enabling the frequency component of the beats to be readily separated from the image data. The image data after the filtering process are written at the corresponding address in the RAM 9. The high-pass filtering process is realized by a convolution operation with filtering coefficients of, for example, (−0.25, 0.5,−0.25). The convolution operation is executed by: multiplying the image data at the current address by the coefficient of 0.5; multiplying the image data at the preceding and next addresses by the coefficient of −0.25, respectively; summing up the three resulting data; and setting the sum as the new image data at the current address.

The program then proceeds to step T105, at which a non-linear operation described below is used to process the image data stored in the RAM 9. FIGS. 25(a) and 25(b) show the contents of the non-linear operation. Closed circles in FIG. 25(a) represent image data 802 sampled by the dot clock 201, which has a non-appropriate frequency, from the analog video signal 101 representing an image alternately varying in white and black by every two pixels. In the drawing of FIG. 25(a), thin vertical lines represent sequence of the pixels, and thick wave-like lines represent beats 801 observed in a video image displayed on the display device 3. The data levels in FIGS. 25(a) and 25(b) are expressed in the analog form for clear understanding.

Although the actual image data varies in sequence following the closed circles of the sampled data 802, a luminance distribution of the beats 801 having a longer period indicated by the thick lines would be conspicuous in the video image displayed on the display device 3.

The number of beats 801 shown in FIG. 25(a) is equal to the difference between the desirable factor Nd for regenerating the appropriate dot clock 201 and the provisional factor Nk. It is accordingly desirable to extract the number of beats 801 (or the frequency of the beats 801) from the sampled data 802 in FIG. 25(a).

As clearly seen from FIG. 25(a), not the data of adjoining pixel positions but the data of separated pixel positions generate the beats 801. Accordingly, a simple low-pass filtering process for the sampled data 802 would not be useful because it would reduce the beat component 801 as well as the high-frequency component of the sampled data 802.

Figure 26A:
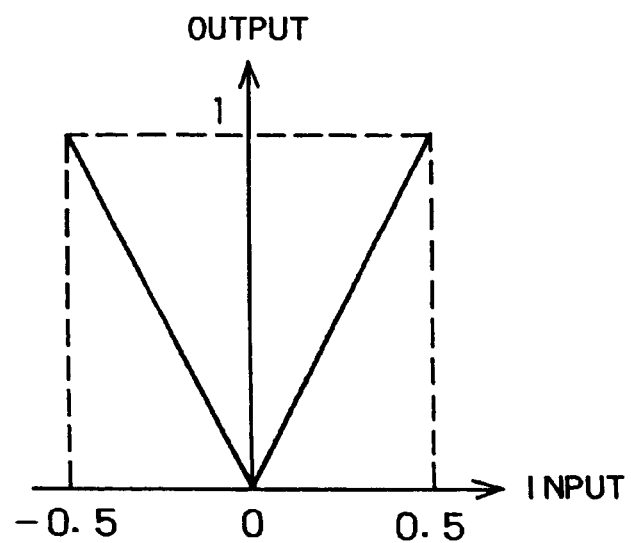
FIGS. 26(a) and 26(b) are graphs showing functions applicable for the non-linear operation.
Figure 26B:
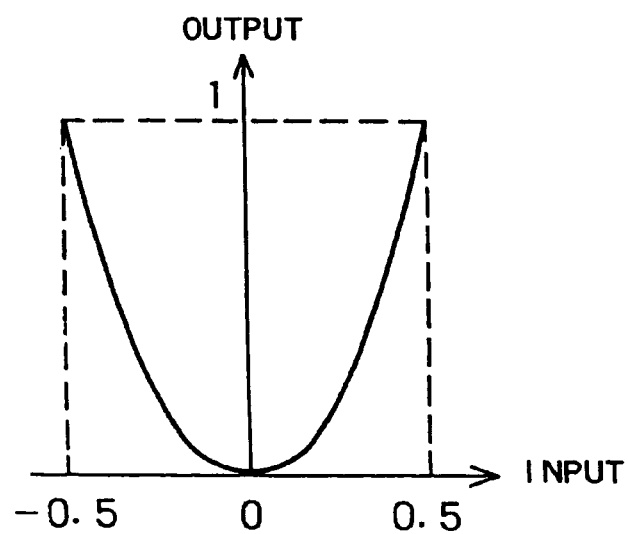

At step T105 in the flowchart of FIG. 24, a non-linear operation is thus used to process the sampled data 802 shown in FIG. 25(a) to generate data as shown in FIG. 25(b), which is suitable for detection of the beats. The graphs of FIGS. 26(a) and 26(b) show functions applicable for the non-linear operation executed at step T105. FIG. 26(a) shows the function defined as Equation 12 given below:

$$y=|2x| \quad (12)$$

wherein y and x respectively denote an output (data after the operation) and an input (data before the operation). The non-linear operation according to Equation 12 doubles the level of each data and changes the sign of the minus-level data to plus. Equation 12 is not linear as a whole, although the input-output relationship is linear on either sides of the 0-input level as shown in FIG. 26(a). The term 'non-linear' in this specification implies that the input-output relationship is not linear as a whole. Data after the non-linear operation shown by the closed circles in FIG. 25(b) are results of the non-linear operation according to Equation 12.

Referring back to the flowchart of FIG. 24, at step T106, a low-pass filtering process is carried out for the data after the non-linear operation shown in FIG. 25(b) so as to extract the beat component expressed as a mean value 803 in FIG. 25(b). Like the high-pass filtering process executed at step T104, the low-pass filtering process is realized by a convolution operation. The beat component expressed as the mean value 803 in FIG. 25(b) has the number of waves that coincides with the number of beats 801 in FIG. 25(a) and the frequency that is twice the frequency of the beats 801.

A quadratic function defined by Equation 13 given below and shown in FIG. 26(b) may be used for the non-linear operation executed at step T105.

$$y=4x^2 \quad (13)$$

If one of the two waveforms of the beats 801 shown in FIG. 25(a) is expressed as x=cosθ, the data after the non-linear operation according to the function of Equation 13 is given as y=2(1+cos 2θ). The data y after the non-linear operation according to the quadratic function advantageously includes only the frequency component that is twice the frequency of the beats 801 and has no undesired higher harmonic components.

A variety of monotone transformation functions having a symmetrical output level across a predetermined input level are applicable for the non-linear operation to transform the sampled data 802 shown in FIG. 25(a). Both the first transformation function defined by Equation 12 and FIG. 26(a) and the second transformation function defined by Equation 13 and FIG. 26(b) are monotone functions having a symmetrical output with respect to the 0-level input. The input level which is the center of symmetry of the transformation function may be set at any level other than the zero level. For example, the mean value of the maximum and the minimum of the sampled data 802 may be set as the center of symmetry of the transformation function.

In the fourth embodiment, the fast Fourier transform is carried out to process the data shown in FIG. 25(b) to obtain the frequency of the beat component (that is, the number of beats) as described below. The number of beats on one scanning line is equal to the difference between the total number of pixels Nd of the analog video signal 101 in the horizontal direction and the provisional factor Nk set at step T101 in the flowchart of FIG. 24. Since the provisional factor Nk is selected from a plurality of proper values for various representative apparatuses, the number of beats would be about 30 or smaller. In order to obtain the number of beats, the fast Fourier transform (FFT) should be carried out for the data at least twice the number of beats. If the number of beats is in a range of about 20 to 30, the sufficient number of data to be processed by FFT is either 64 or 128. Referring back to the flowchart of FIG. 24, at step T107, the CPU 8 sub-samples the data shown in FIG. 25(b), so as to reduce the number of data to the level suitable for determining the number of beats. The number of data obtained by sampling the analog video signals 101 (which is equal to the provisional factor Nk) is approximately 1040. The sub-sampling process by the ratio of 16:1 reduces the 1040 pieces of data to 65 pieces, and the sub-sampling by the ratio of 8:1 would make it 130 pieces. In this embodiment, the sub-sampling process at the ratio of either 16:1 or 8:1 gives the sufficient number of data that are processed by FFT to determine the number of beats. The sub-sampling process effectively shortens the operation time of FFT, although it is not essential.

At step T108 in the flowchart of FIG. 24, the FFT operation is carried out for the sub-sampled data. The output of FFT generally has a cycle defined by an integral power of '2'. In this embodiment, the output of FFT has a cycle of 1024 pixels while the original analog video signal 101 has a cycle of 1040 pixels. Although the output of FFT is deviated from the analog video signal 101 by a ratio of 1024/1040, it is negligibly small. Such a deviation can be corrected in case of VGA or like signals.

At subsequent step T109, the CPU 8 determines the frequency at which the FFT spectrum shows a maximum. This frequency is twice the number of beats Nb, which is equal to the difference between the total number of pixels Nd for one horizontal line and the provisional factor Nk.

The program then proceeds to step T110, at which the factor setting unit 18 corrects the provisional factor Nk with the number of beats Nb to obtain an optimum factor, and outputs the factor setting signal 703 to the frequency divider 64 in the PLL circuit 7 to set the optimum factor thus obtained. The 'optimum factor' here implies the factor for generating the desirable dot clock 201 used to sample the image data having no beats.

It is unknown whether the deviation of the provisional factor Nk from the optimum factor is positive or negative. Namely, it is unknown whether the number of beats Nb determined at step T109 is to be added to or subtracted from the provisional factor Nk. In a typical process, for example, the factor (Nk+Nb) is set in the frequency divider 64 and repeats the processing of steps T108 and T109. If the factor (Nk+Nb) is not the optimum factor, the FFT spectrum has a peak at the frequency corresponding to twice the number of beats Nb. In this case, the factor (Nk−Nb) is set as the optimum factor in the frequency divider 64.

As described above, the fourth embodiment carries out the fast Fourier transform to obtain the number of beats (that is, the frequency of the beats) included in the image data that are sampled by the dot clock generated with the provisional factor Nk, and determines the factor Nd for sampling the desirable image data having no beat. Accordingly, a video image without vertical stripes due to the beats will be displayed on the display device 3.

E. Fifth Embodiment

Figure 27:
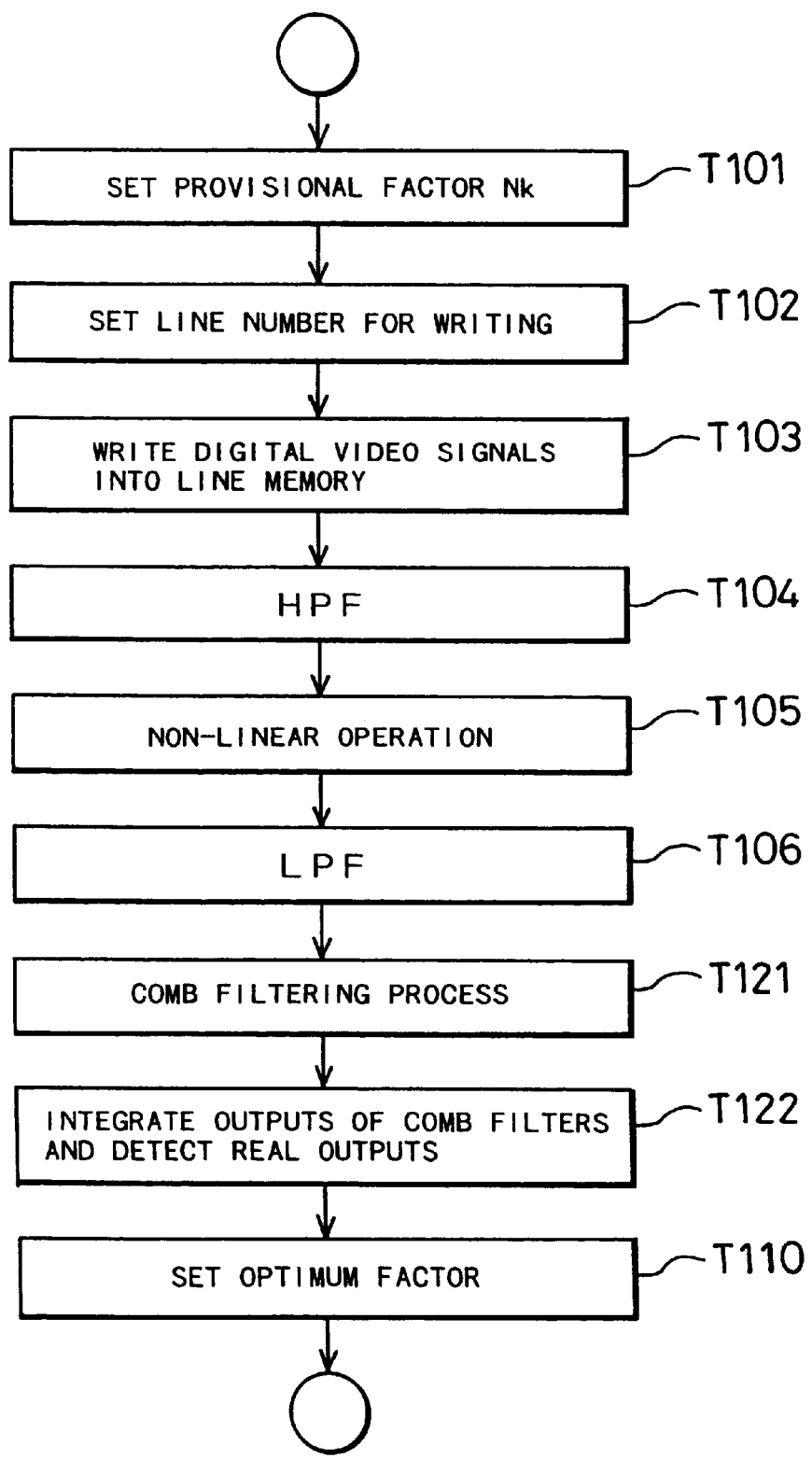
FIG. 27 is a flowchart showing a processing routine executed in a fifth embodiment according to the present invention.

FIG. 27 is a flowchart showing a processing routine executed in a fifth embodiment according to the present invention. The fifth embodiment utilizes the video image display apparatus of FIG. 17 like the third and the fourth embodiments. Steps T101 through T106 in the flowchart of FIG. 27 are identical with those of the fourth embodiment shown in the flowchart of FIG. 24. The fifth embodiment carries out a frequency analysis using comb filters at step T121, instead of the fast Fourier transform, to obtain the number of beats.

Figure 28:
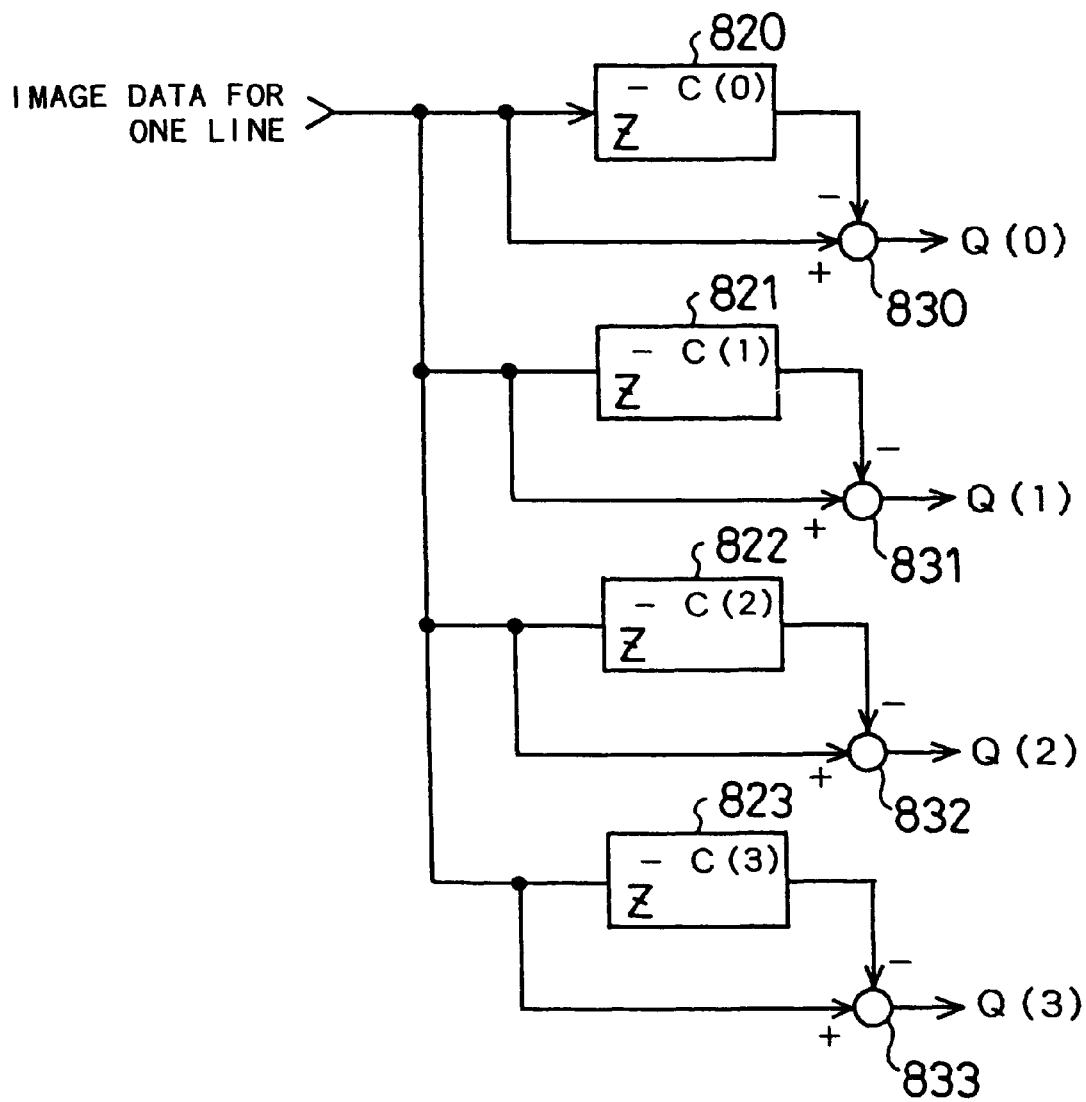
FIG. 28 is a block diagram illustrating an equivalent circuit of the comb-filter assembly used in the fifth embodiment.

FIG. 28 is a block diagram illustrating an equivalent circuit of the comb-filter assembly used at step T121 in the flowchart of FIG. 27. The comb-filter assembly comprises five comb filters; the comb filters include delay circuits 820–823 having delays of C(j) (j=0 to 3) and adder circuits 830–833.

J-th comb filter has a delay of C(j), which is defined by Equations 14 given below:

$$C(0)=N\times 2^0=N$$

$$C(1)=N\times 2^1=2N$$

$$C(2)=N\times 2^2=4N$$

$$C(3)=N\times 2^3=8N \tag{14}$$

wherein N is a natural number.

The comb filters are realized by a convolution operation. The value of the natural number N is determined so as to make the largest delay C(3) of the passing band equal to or less than half the number of data sampled for one line (that is, the provisional factor Nk). In the fifth embodiment, the number of sampled data is 1040, and the natural number N is set equal to 65. A peak frequency of the passing band of the comb filter is given by the provisional factor Nk divided by twice the delay C(j).

At step T122 in the flowchart of FIG. 27, the CPU 8 integrates outputs Q(0) to Q(4) of the respective comb filters and detects real outputs from the comb filters, thereby determining the number of beats Nb. Although the comb filters having the passing band defined by integral powers of 2 are used in combination in the fifth embodiment, comb filters of another specification may be used in combination. The number of beats Nb thus obtained represents the difference between the optimum factor Nd and the provisional factor Nk.

As described above, the fifth embodiment carries out the comb filtering process to determine the number of beats (that is, the frequency of the beats) included in the data sampled for one line, and corrects the provisional factor Nk with the number of beats Nb, thereby determining the desirable factor Nd. Like the fourth embodiment, a video image without vertical stripes due to the beats will be displayed on the display device 3 according to the fifth embodiment.

The fourth embodiment and the fifth embodiment described above respectively adopt the techniques of the fast Fourier transform and the comb filtering process for the frequency analysis. A variety of other frequency analyzing techniques may, however, be applied to determine the number of beats included in the sampled data.

F. Sixth Embodiment

Figure 29:
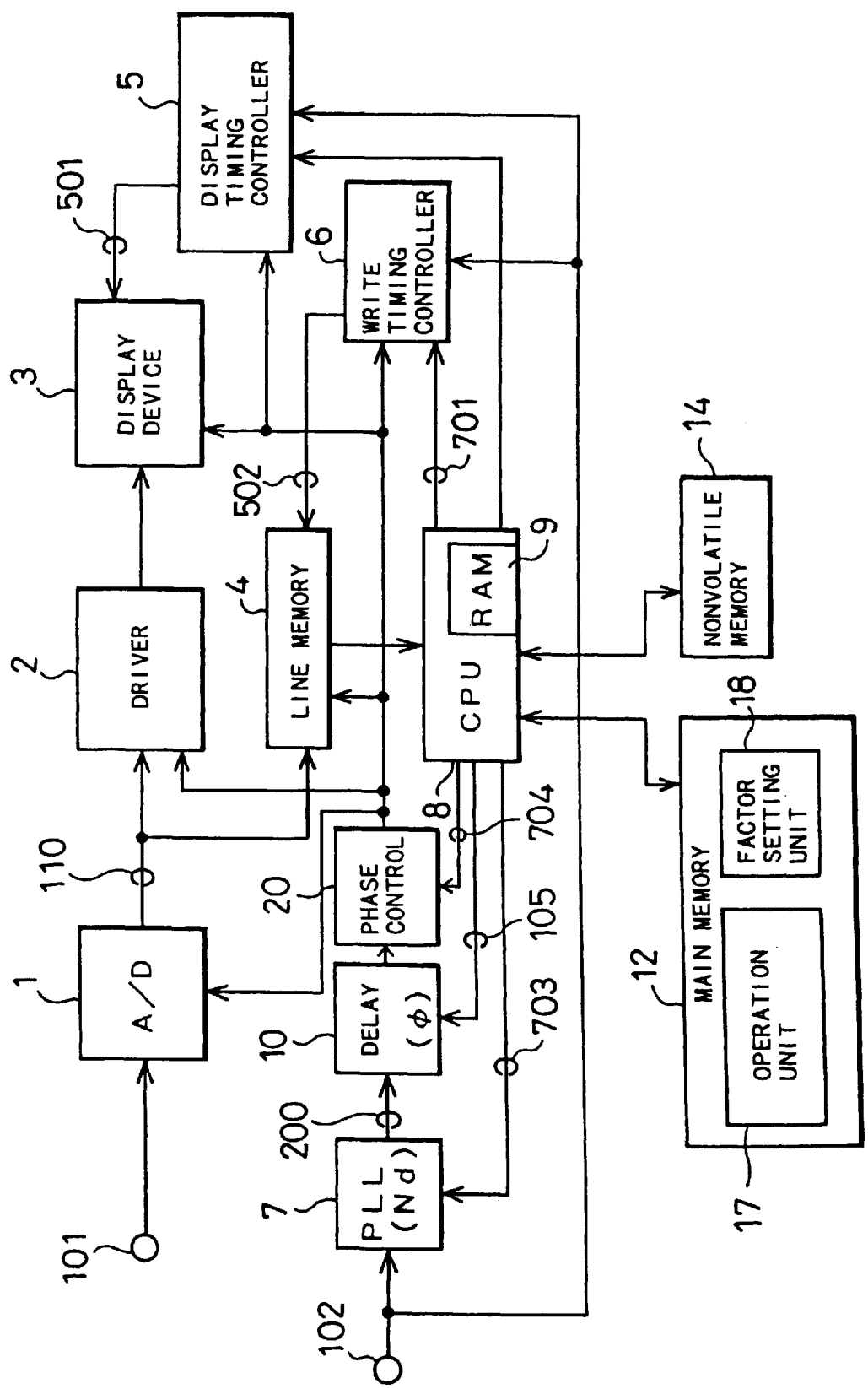
FIG. 29 is a block diagram illustrating the structure of a video image display apparatus for carrying out adjustment of the frequency of a dot clock, as a sixth embodiment according to the present invention.

FIG. 29 is a block diagram illustrating the structure of a video image display apparatus for carrying out adjustment of the frequency of a dot clock, as a sixth embodiment according to the present invention. The video image display apparatus of the sixth embodiment shown in FIG. 29 has a similar structure to that of the third embodiment shown in FIG. 17, except that a phase control circuit 20 is disposed after the delay circuit 10.

Figure 30:
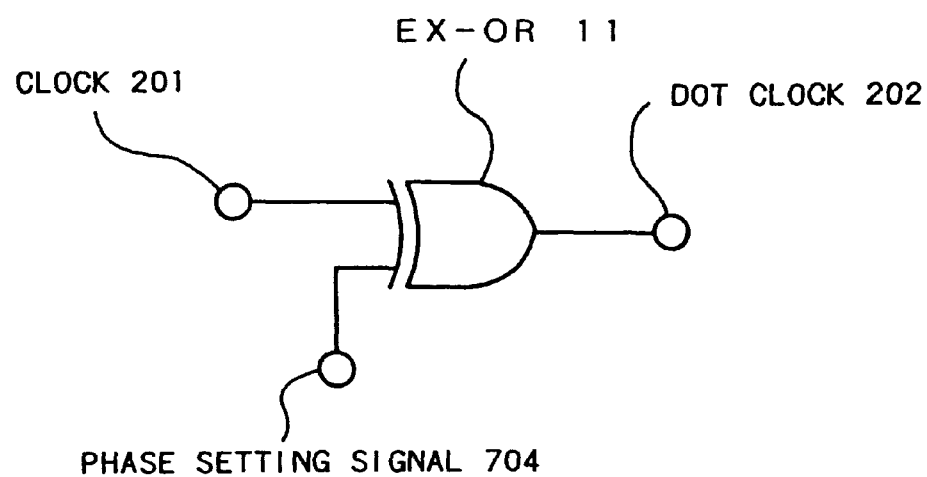
FIG. 30 is a block diagram illustrating a simplest structure of the phase control circuit 20.

FIG. 30 is a block diagram illustrating a simple structure of the phase control circuit 20, which consists of one exclusive-OR circuit 11. The dot clock 201 output from the delay circuit 10 is given to one input of the exclusive-OR circuit 11, while a phase control signal 704 output from the CPU 8 is given to the other input of the exclusive-OR circuit 11. When the level of the phase control signal 704 is equal to zero, the input clock 201 is directly output as an output clock 202. When the level of the phase control signal 704 is equal to one, on the other hand, the input clock 201 is inverted to be output as the output clock 202. Namely the phase control signal 704 changes the phase of the output clock 202 by π. The output clock 202 is used as a dot clock for sampling the video signal in the video image display apparatus of FIG. 29.

Figure 31:
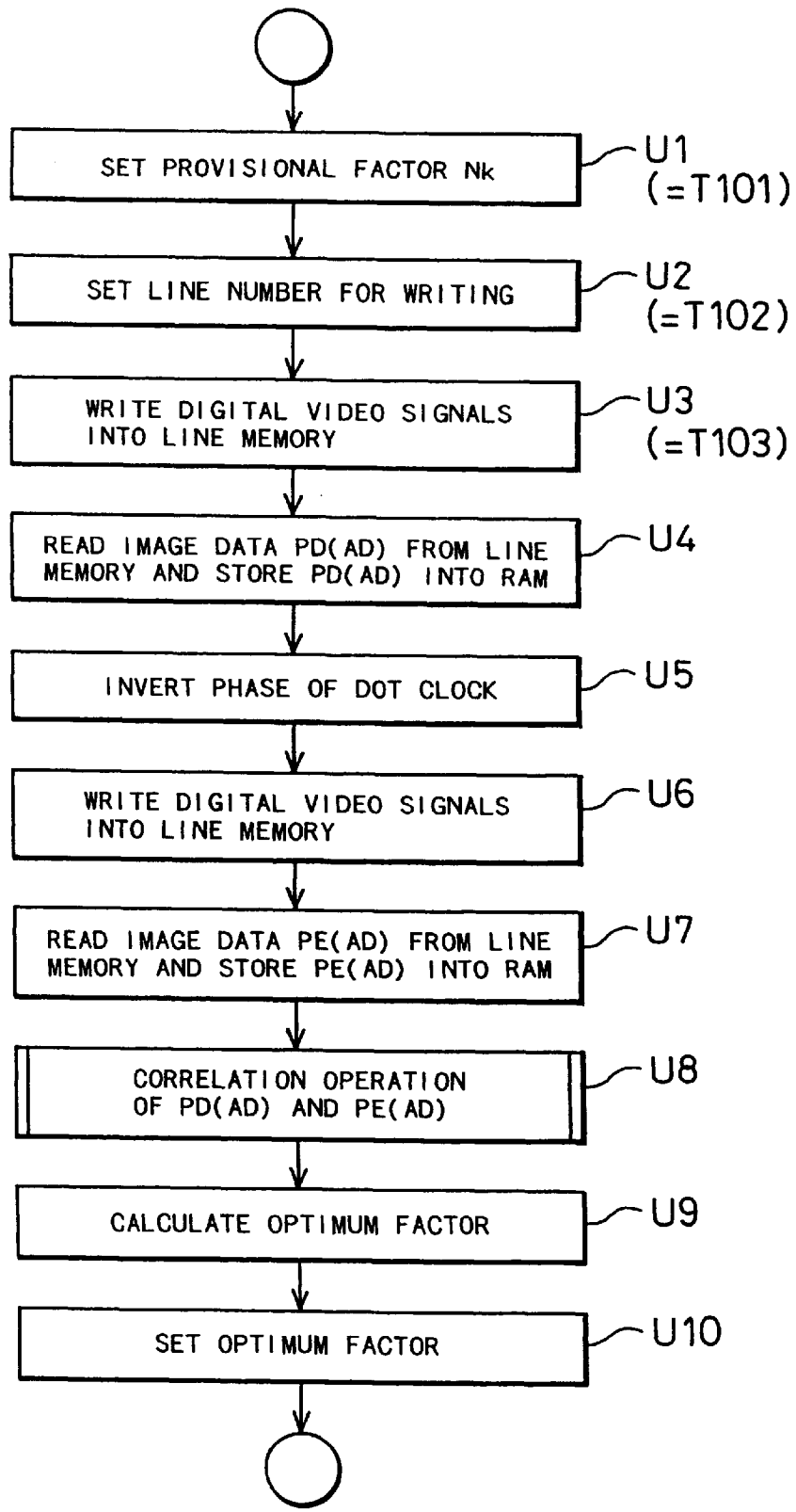
FIG. 31 is a flowchart showing a processing routine executed by the operation unit 17 and the factor setting unit 18 in the sixth embodiment.

FIG. 31 is a flowchart showing a processing routine executed by the operation unit 17 and the factor setting unit 18 in the sixth embodiment. Steps U1 through U3 in the flowchart of FIG. 31 are identical with steps T101 through T103 of the fourth embodiment shown in the flowchart of FIG. 24. The CPU 8 sets a provisional factor Nk in the frequency divider 64 at step U1, instructs the write timing control circuit 6 to set the line number of the digital video signals 110 to be written into the line memory 4 at step U2, and stores image data corresponding to the line number into the line memory 4 at step U3.

At subsequent step U4, the CPU 8 reads out image data PD(AD) from the line memory 4 and stores the image data PD(AD) into the RAM 9, wherein AD denotes the address in the line memory 4. The RAM 9 has the addresses one-to-one mapped to the addresses in the line memory 4. The image data PD(AD) stored in the line memory 4 is sampled by the dot clock, which is generated with the non-desirable provisional factor Nk. The image data PD(AD) accordingly have a phase deviated from that of desirable image data sampled by a desirable dot clock.

Figure 32:
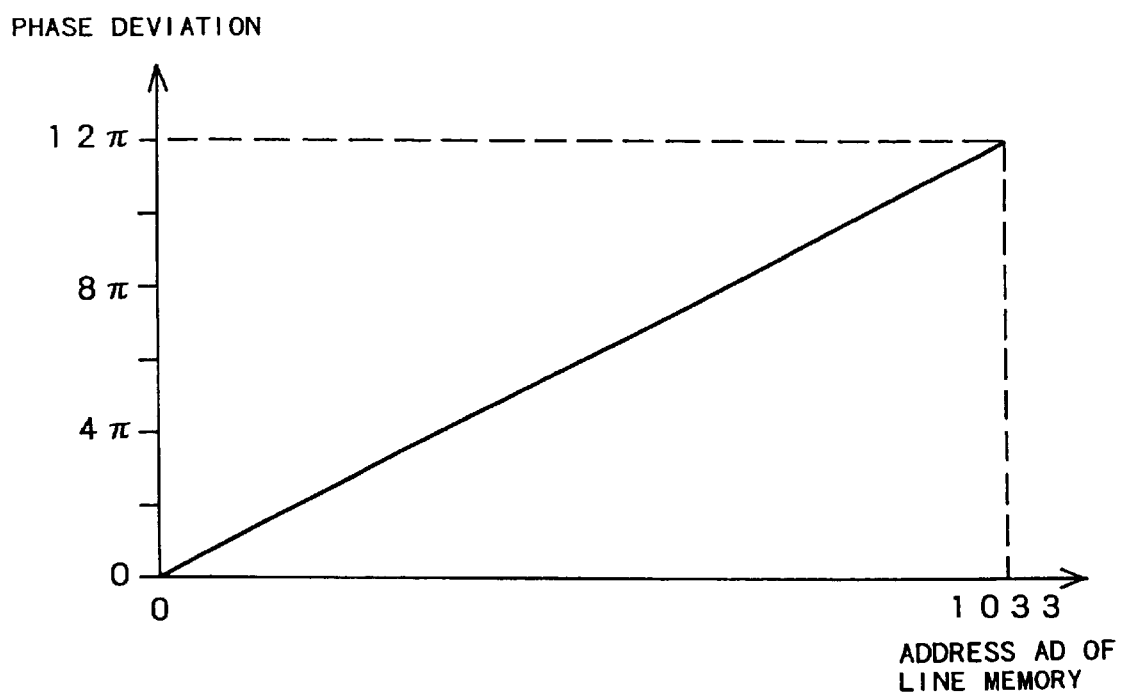
FIG. 32 is a graph showing the relationship between the address AD in the line memory 4 and the phase deviation of the image data PD(AD)

FIG. 32 is a graph showing the relationship between the address AD in the line memory 4 and the phase deviation of the image data PD(AD). It is assumed that the total number of pixels on each line for the true, desirable dot clock of the analog video signal 101 (that is, the desirable factor Nd to be set in the PLL circuit 7) is equal to 1040 and that the provisional factor Nk set in the PLL circuit 7 is 1034. When there is a difference between the provisional factor Nk and the desirable factor Nd, the relative phase of the image data PD(AD) obtained with the actual dot clock relative to the desirable image data obtained with the desirable dot clock is in proportion to the address AD of the image data PD(AD) as shown in FIG. 32. In this embodiment, the difference between the desirable factor Nd (=1040) and the provisional factor Nk (=1034) is equal to 6, and the relative phase of the actual image data PD(AD) to the desirable image data is to be deviated by six cycles ($12\pi$) over one line. In the graph of FIG. 32, the phase deviation at the address 0 is set to be a reference deviation of zero for the ordinate.

FIG. 33($a$) is a graph where the phase deviation shown in FIG. 32 is replaced with a corresponding address deviation. The phase of $2\pi$ corresponds to one address step. The ordinate of FIG. 33($a$) represents the address deviation of the actual image data PD(AD) from a virtual address of the desirable image data. It is here assumed that the address AD in the line memory 4 starts from zero. Image data to be written in the address range of 0 to 1039 are written in the actual address range of 0 to 1033. As shown by the solid line in FIG. 33($a$), the relative address deviation varies from 0 to 6 in proportion to the actual address AD.

FIGS. 34($a$)–34($g$) show a variety of image data processed in the sixth embodiment. FIG. 34($a$) shows a level change of the image data PD(AD) stored in the RAM 9 at step U4 in the flowchart of FIG. 31. The image data PD(AD) have been sampled from a video signal representing characters created in a personal computer. There are some "beats" seen in FIG. 34($a$). Although the beats are generated such that its number is equal to the difference between the desirable factor Nd and the provisional factor Nk, FIG. 34($a$) only shows some beats in the effective signal area. The total number of pixels in the horizontal direction, that is, the optimum factor Nd, can be obtained by counting the number of beats over one line including the blanking area.

Referring back to the flowchart of FIG. 31, at step U5, the CPU 8 sends the phase control signal 704 to the phase control circuit 20 to invert the phase of the dot clock 202. At subsequent step U6, the CPU 8 stores the image data for one line into the line memory 4, in the same manner as step U3. The CPU 8 then reads out image data PE(AD) from the line memory 4 and stores the image data PE(AD) into the RAM 9 at step U7 in the same manner as step U4. FIG. 34($b$) shows a level change of the image data PE(AD) stored in the RAM 9 at step U7.

Figure 35A:
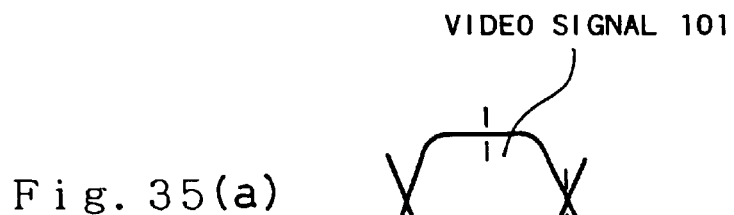
FIGS. 35(a)–35(c) show the phase relationship between the video signal and the dot clocks in the sixth embodiment.
Figure 35B:
Figure 35C:

FIG. 33($b$) is a graph showing the address deviation with respect to the image data PE(AD) obtained at step U7. Comparison of FIGS. 33($a$) and 33($b$) at a specific address ADs1 will indicate the following facts. The image data PD(AD) at a point 203 in the graph of FIG. 33($a$) is obtained by sampling the stable range of the video signal 101 at a rise of the dot clock as shown in FIG. 35($b$) while the image data PE(AD) at a point 204 in the graph of FIG. 33($b$) is, on the other hand, obtained by sampling the transient range of the video signal 101 at a rise of the dot clock as shown in FIG. 35($c$). At another specific address ADs2, on the contrary, the image data PD(AD) at a point 205 in the graph of FIG. 33($a$) is obtained by sampling the transient range of the video signal 101 while the image data PE(AD) at a point 206 in the graph of FIG. 33($b$) is obtained by sampling the stable range of the video signal 101.

The image data PD(AD) shown in FIG. 34($a$) appears to have two sets of intersecting data. This is ascribed to a decrease in amplitude that is caused by sampling the transient range of the video signal 101 like the point 205 in the graph of FIG. 33($a$). The same phenomenon is observed in the image data PE(AD) of FIG. 34($b$). The intersection are observed as noises like vertical lines in the video image displayed on the display device 3.

Figure 36:
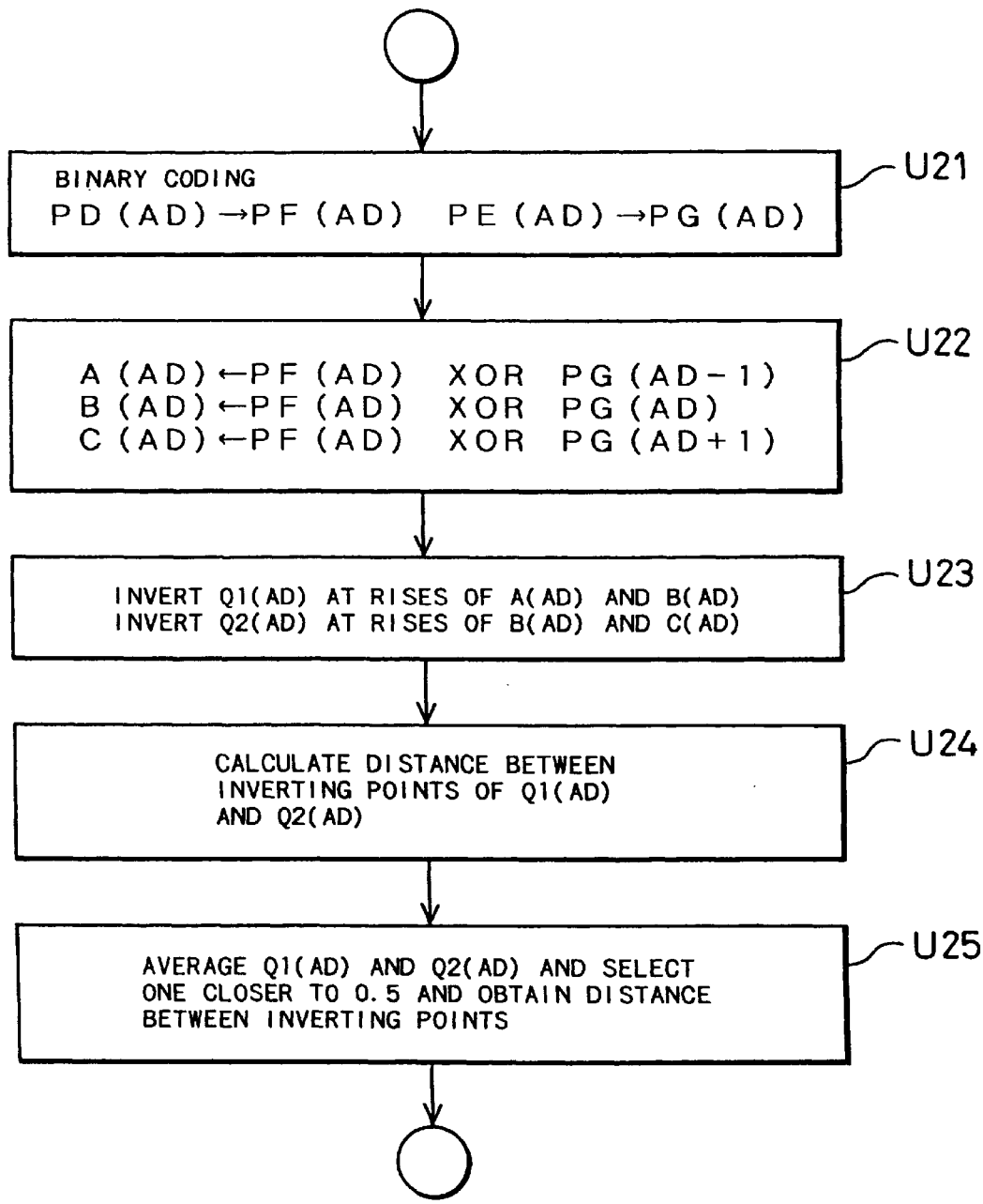
FIG. 36 is a flowchart showing details of the processing executed at step U8 in the flowchart of FIG. 31.

At step U8 in the flowchart of FIG. 31, the CPU 8 carries out a correlation analysis operation on the two image data PD(AD) and PE(AD) to determine the number of beats included in one line. FIG. 36 is a flowchart showing details of the processing executed at step U8.

When the program enters the routine of FIG. 36, the CPU 8 executes binary coding on the two image data PD(AD) and PE(AD), respectively, to generate binary data PF(AD) and PG(AD) at step U21. The binary coding process is executed, for example, by setting half the maximum amplitude of image data as a threshold value and allocating the value of one to image data exceeding the threshold value while allocating the value of zero to image data less than the threshold value.

At step U22, the CPU 8 obtains an exclusive OR of the two binary data PF(AD) and PG(AD). When the two binary data PF(AD) and PG(AD) coincide with each other for each address AD, the value of zero is output. Otherwise the value of one is output. In other words, when data regarding a certain pixel of the analog video signal 101 are written at an identical address position in the image data PD(AD) and PE(AD), the output of the exclusive OR operation is equal to zero at the address position. When the data are written at different address positions, on the contrary, the output of the exclusive OR operation is equal to one. In the latter case, if data regarding the adjoining pixels of the analog video signal 101 incidentally coincide with each other, the output of the exclusive OR operation is equal to zero.

FIGS. 37($a$)–37($e$) show the relationship between level changes of the two binary data PF(AD) and PG(AD) and the output of the exclusive OR operation. Like the graph of FIG. 32, the graph of FIG. 37($a$) shows the relationship between the phase deviation and the address AD, although the phase range is 0 to $2\pi$ in FIG. 37($a$). FIG. 37($b$) shows a level change of the analog video signal 101, which represents an image having a relatively high level (that is, high luminance) in stable ranges FIG. 37($c$) shows sampling timing (at rises of the clock) of the image data PD(AD) and the values of the binary data PF(AD) obtained by binary coding the image data PD(AD).

The waveforms of the two dot clocks shown in FIGS. 37($c$) and 37($d$) have a phase deviation of $\pi$. The first output value of the exclusive OR operation shown in FIG. 37($e$) is equal to one because it is based on the two binary data PF(AD) and PG(AD) which have been obtained by sampling different pixels of the video signal, respectively. The second output of the exclusive OR operation in FIG. 37($e$) is equal to zero because it is based on the binary data PF(AD) and PG(AD) both obtained by sampling an identical pixel of the video signal 101. The third output of the exclusive OR operation in FIG. 37(*e*) has the same result. Comparison between FIGS. 37(*b*) and 37(*c*) shows that the phase of the dot clock gradually deviates from the phase of the video signal 101 in proportion to the address AD. The correlation of the binary data PF(AD) with PG(AD) (that is, the output of the exclusive OR operation in this embodiment) accordingly varies with the address AD. A starting point and a terminal point of an address range corresponding to the phase deviation of $2\pi$ as shown in FIG. 37(*a*) show an identical phase relationship between the video signal 101 (FIG. 37(*b*)) and the dot clocks (FIGS. 37(*c*) and 37(*d*)) while the phase relationship linearly varies with the address AD within the specified address range. An output pattern of the exclusive OR operation shown in FIG. 37(*e*) depends on the content of the video signal, but it includes the same cycle as that of the beat component included in the image data PD(AD) (or PE(AD)).

Since the phase relationship between the analog video signal 101 and the horizontal synchronizing signal 102 is not defined, the relative phase of the dot clock 202 generated from the horizontal synchronizing signal 102 relative to the digital video signal 110 is also not defined. Accordingly, as shown by the broken lines in FIGS. 33(*a*) and 33(*b*), the address deviation of the image data PD(AD) and PE(AD) may be shifted by +1 or −1.

Referring back to the flowchart of FIG. 36, when executing the exclusive OR of the two binary data PF(AD) and PG(AD) at step U22, the CPU 8 uses the following three kinds of the second binary data PG: PG(AD) at the same address as that of the first binary data PF(AD); PG(AD−1) at a preceding address; and PG(AD+1) at a next address. Namely three outputs of, A(AD), B(AD), and C(AD), defined by Equations 15 given below are obtained by the exclusive OR operation:

$$A(AD)=PF(AD)\, XOR\, PG(AD-1)$$

$$B(AD)=PF(AD)\, XOR\, PG(AD)$$

$$C(AD)=PF(AD)\, XOR\, PG(AD+1) \quad (15)$$

These outputs of the exclusive OR operation, A(AD), B(AD), and C(AD), represent the correlation of the two image data PD(AD) with PE(AD), and thereby can also be referred to as 'correlation data'.

FIGS. 34(*c*) through 34(*e*) show examples of these three outputs of the exclusive OR operation, A(AD), B(AD), and C(AD). The output A(AD) shown in FIG. 34(*c*) is not related to the beats of the image data PD(AD) and PE(AD) shown in FIGS. 34(*a*) and 34(*b*), and it has 0-levels only when the image data PD(AD) and PE(AD) happen to coincide with each other.

The outputs B(AD) and C(AD) shown in FIGS. 34(*d*) and 34(*e*), on the other hand, have 0-level ranges at the positions corresponding to the beats of the image data PD(AD) and PE(AD). One-level ranges tend to appear in the same cycle as the 0-level output ranges, but incidental coincidence of the image data PD(AD) and PE(AD) cuts the continuation of the 1-level range. An incidental 0-level range sometimes appears in the middle of a 1-level output range accordingly.

The number of beats included in the two image data PD(AD) and PE(AD) is determined by analyzing at least either one of the two outputs of the exclusive OR operation, B(AD) and C(AD), shown in FIGS. 34(*d*) and 34(*e*) and detecting the cycle (or frequency) of appearance of the 0-level ranges and the 1-level ranges. The number of beats (that is, the frequency of beats) can be determined relatively easily from the two outputs of the exclusive OR operation, B(AD), and C(AD), as described below.

Referring back to the flowchart of FIG. 36, at step U23, the CPU 8 carries out a toggle operation for the two outputs of the exclusive OR operation, B(AD) and C(AD), and writes the results of the toggle operation into an internal register (not shown) thereof. In accordance with a concrete procedure, the CPU 8 increases the address AD by one from zero and sets the register in response to a rise of one of the two outputs of the exclusive OR operation, B(AD) and C(AD) while resetting the register in response to a rise of the other, thereby detecting the beats.

It is unknown which one of the three outputs of the exclusive OR operation, A(AD), B(AD), and C(AD), obtained at step U22 has a pattern representing the beats. It is thus preferable to provide two registers, into which the result of the toggle operation is written. A first register output Q1(AD) shown in FIG. 34(*f*) is alternately inverted at rises of the first and the second outputs of the exclusive OR operation, A(AD) and B(AD). A second register output Q2(AD) shown in FIG. 34(*g*) is, on the other hand, alternately inverted at rises of the second and the third outputs of the exclusive OR operation, B(AD), and C(AD).

As shown in FIG. 34(*g*), the second register output Q2(AD) has a pattern representing the beats. Referring back again to the flowchart of FIG. 36, at step U24, the CPU 8 calculates the cycle of the beats from the cycle of the inverting points of the data level of the two register outputs Q1(AD) and Q2(AD).

FIG. 38 shows address points at which the level of the second register output Q2(AD) is inverted. There are eleven inverted points #1 through #11. The first inverted point #1 results from the start of an effective signal area, and is thereby omitted as an ineffective inverted point. The mean value of the distances between the adjoining addresses among the residual ten inverting points is calculated. In the example of FIG. 38, the mean value of the distances between the adjoining inverting points is calculated as (853−87)/9= 85.1. This value corresponds to half the cycle of the beats.

It is required to determine which of the two register outputs Q1(AD) and Q2(AD) shown in FIGS. 34(*f*) and 34(*g*) has a pattern representing the beats. Observation of FIGS. 34(*f*) and 34(*g*) proves that the mean value of the output level is close to 0.5 when the waveform of the register output has a level pattern varying in the cycle of the beats. When the level pattern does not represent the beats, on the other hand, either setting or resetting of the register is caused at a significantly higher frequency, and the mean value of the output level is accordingly close to either 1 or 0.

Referring back again to the flowchart of FIG. 36, at step U25, the CPU 8 calculates the mean value of the level for the two register outputs Q1(AD) and Q2(AD), and selects the register output having the mean value closer to 0.5. In the example of FIGS. 34(*f*) and 34(*g*), the first register output Q1(AD) has the mean value of the level equal to 0.91, whereas the second register output Q2(AD) has the mean value of the level equal to 0.51. It is thus determined that the second register output Q2(AD) has a level pattern representing the beats. The mean value (=85.1) of the distances between the adjoining inverted points of the second register output Q2(AD) is accordingly selected as the data representing half the cycle of the beats.

Even when the register output Q2(AD) (or Q1(AD)) has the waveform corresponding to the cycle of the beats, level inversion may occur in as small as one tenth the cycle of the beats in the transient area where the stepwise address deviation occurs. Taking into account such possible level inversion, it is preferable to perform the steps of: calculating the mean value of the distances between the adjoining inverted points at step U24 in the flowchart of FIG. 36: setting a mask to invalidate those setting and resetting operations where an address difference between the adjacent setting and resetting points is smaller than about one fifth the mean value; and repeating the processing of steps U23 and U24. This procedure effectively prevents the cycle of the beats from being mistakenly determined.

Referring back to the flowchart of FIG. 31, at step U9, the CPU 8 calculates the optimum factor Nd. In this embodiment, the provisional factor Nk is equal to 1034, and the mean value of the distances between the adjoining inverting points obtained at step U8 is equal to 85.1. The mean value of the distances between the adjoining inverting points represents an address difference corresponding to half the cycle of the beats. The number of beats in one horizontal line, which corresponds to the total number of pixels in the horizontal direction, is accordingly calculated to be 1034/(85.1*2)=6.08. The number of beats should, however, be an integral value and is thereby set equal to 6. In general, the optimum factor Nd is given by Equation 16 below:

$$Nb = \text{INT}\left[\frac{Nk}{Lav} + 0.5\right] \quad (16)$$

wherein Nb denotes the number of beats, Lav denotes the mean value of the distances between the adjoining inverting points, and INT[ ] denotes a operation taking an integral-part of the figure while omitting its decimal part. The value of 0.5 is added within the brackets for the rounding operation, which rounds the result to the nearest whole number. The integral-part taking operation of simply omitting the decimal part may be used without the rounding operation.

The desirable factor Nd is obtained by correcting the provisional factor Nk (=1034) with the number of beats Nb (=6), that is, by adding or subtracting Nb to or from Nk. In this example, the desirable factor will be equal to 1040 or 1028. At subsequent step U10 in the flowchart of FIG. 31, the optimum factor Nd thus obtained is set in the frequency divider 64 of the PLL circuit 7.

Since two values of 1028 and 1040 are obtained at step U9 as the possible optimum factor Nd, the CPU 8 sets one of the two values in the PLL circuit 7 and repeats the processing of steps U2 through U9 again. Determination of the optimum factor is not difficult because the non-optimum factor would double the number of beats in the sampled image data. When the selected factor is not optimum, the other factor is set in the PLL circuit 7.

As described above, the sixth embodiment carries out the correlation analysis operation on the two image data respectively sampled by the two dot clocks having the inverted phases, thereby determining the number of beats (or the frequency of beats) in one line. Correction of the provisional factor Nk with the number of beats gives the desirable factor Nd for generating an appropriate dot clock for sampling the video signals 101.

G. Seventh Embodiment

A seventh embodiment according to the present invention carries out the processing of steps U1 through U7 and U9 of the sixth embodiment shown in the flowchart of FIG. 31, but follows a different procedure for the processing of step U8. As described previously, the correlation analysis operation of the two image data PD(AD) and PE(AD), which are respectively sampled by the two dot clocks having different phases, is carried out at step U8 to determine the number of addresses of the beat cycle.

Figure 33A:
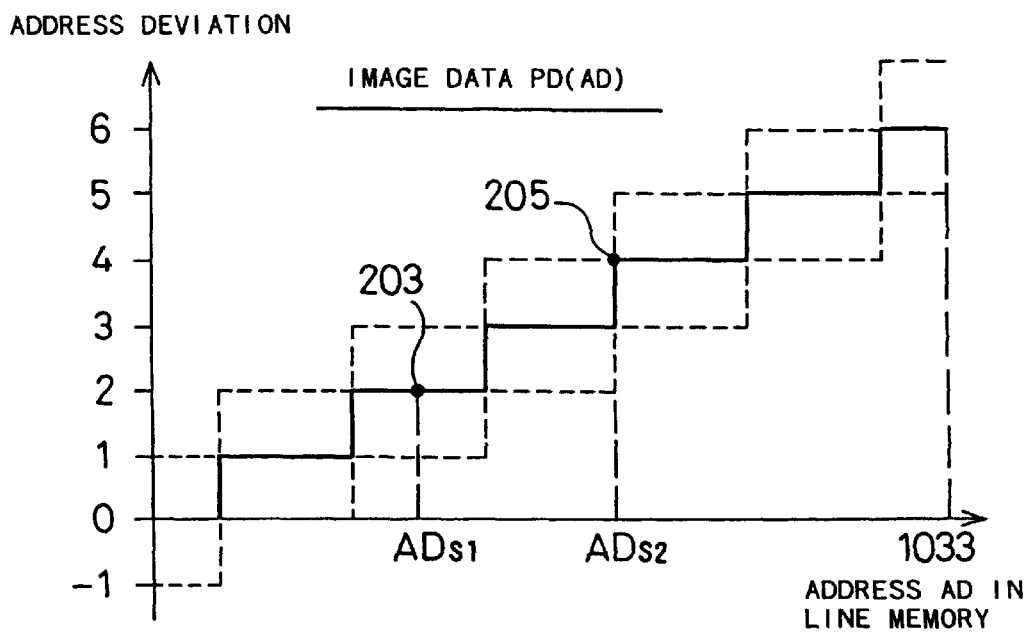
FIGS. 33(a) and 33(b) are graphs showing the relationship between the address AD in the line memory 4 and the deviation of the address of the image data PD(AD) (or PE(AD))
Figure 33B:
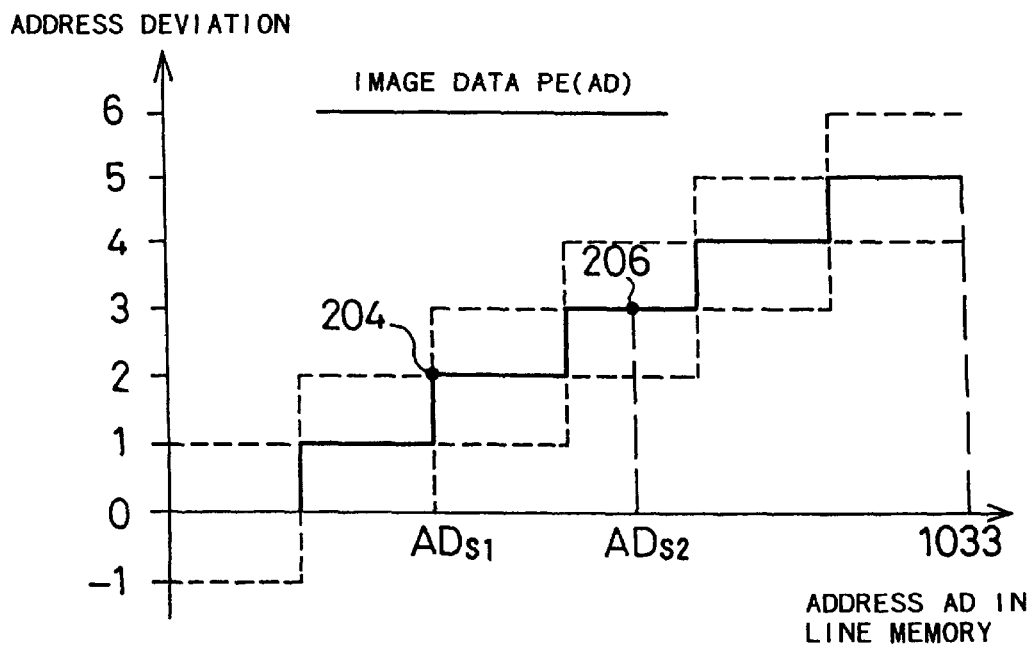
Figure 39:
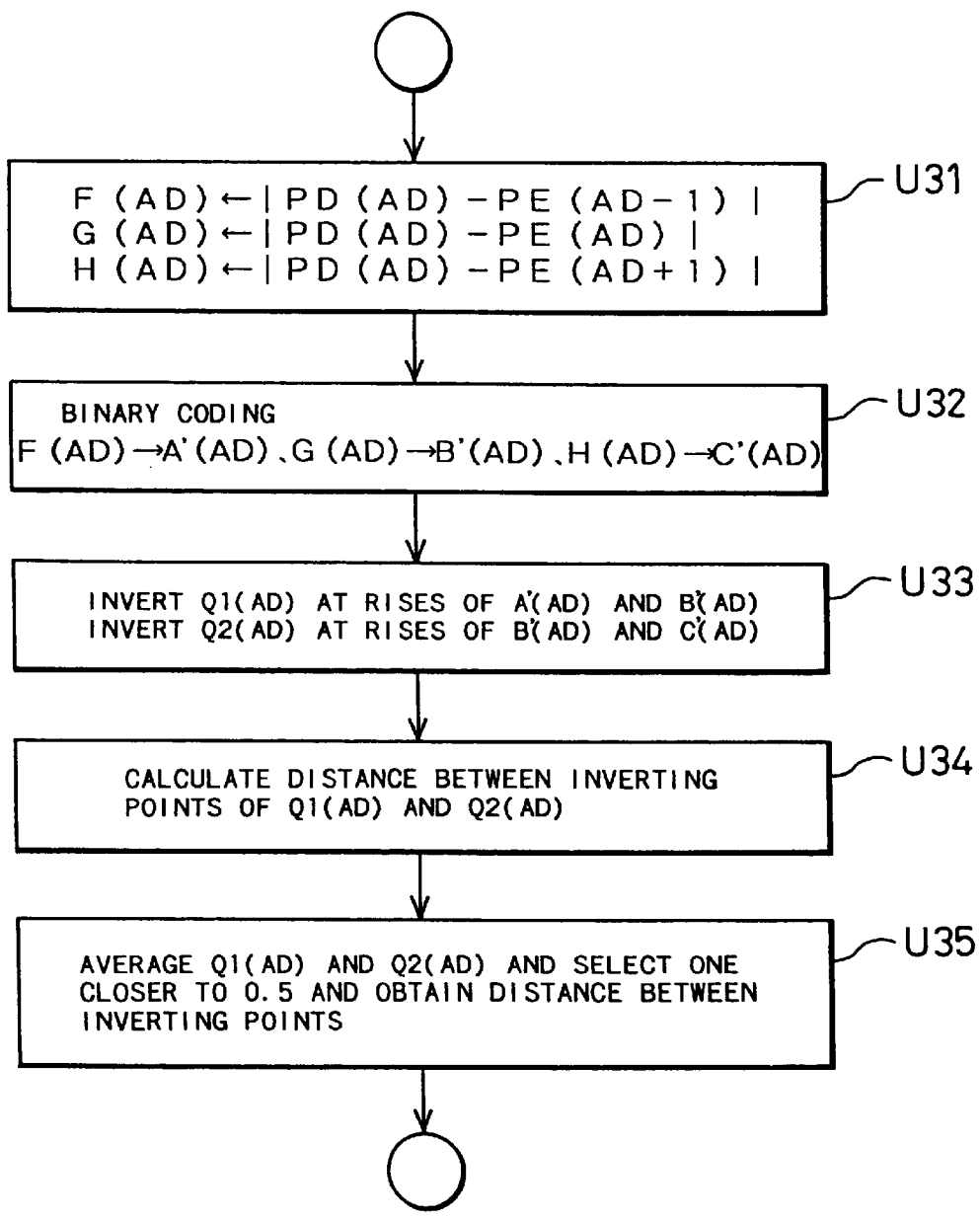
FIG. 39 is a flowchart showing details of the processing executed at step U8 in a seventh embodiment according to the present invention.
Figure 40:
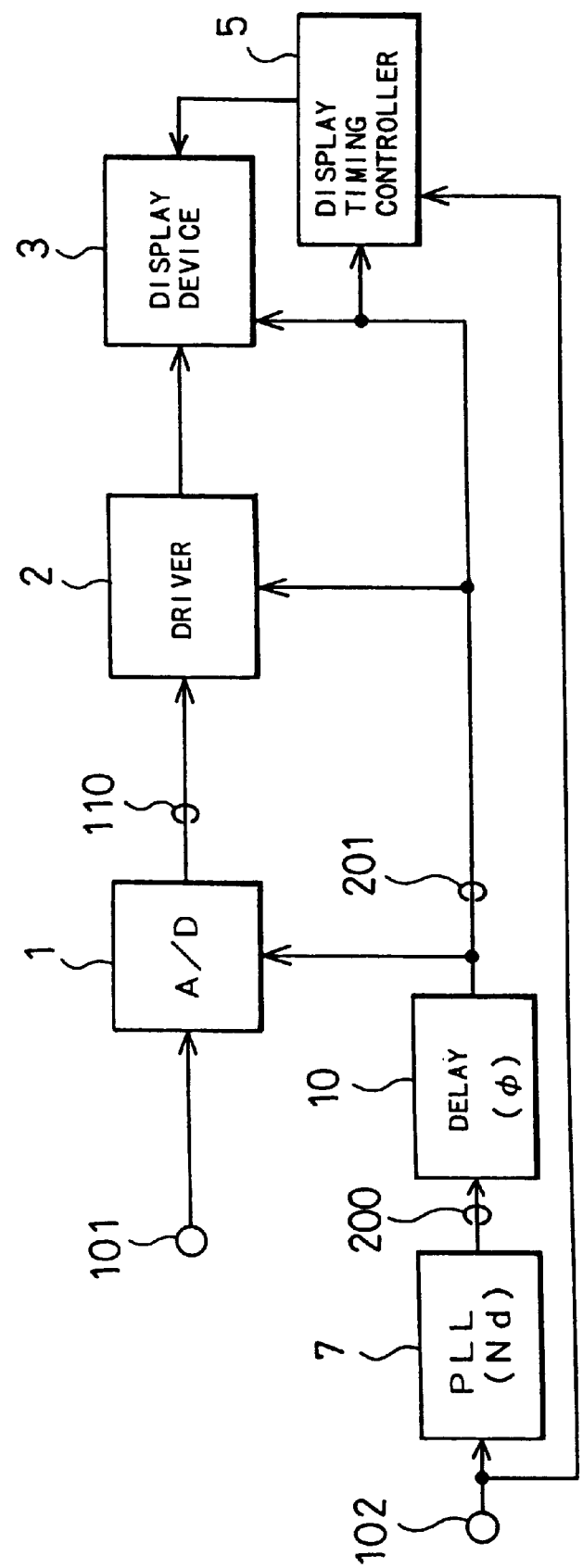
FIG. 40 is a block diagram illustrating a conventional video image display apparatus.
Figure 41:
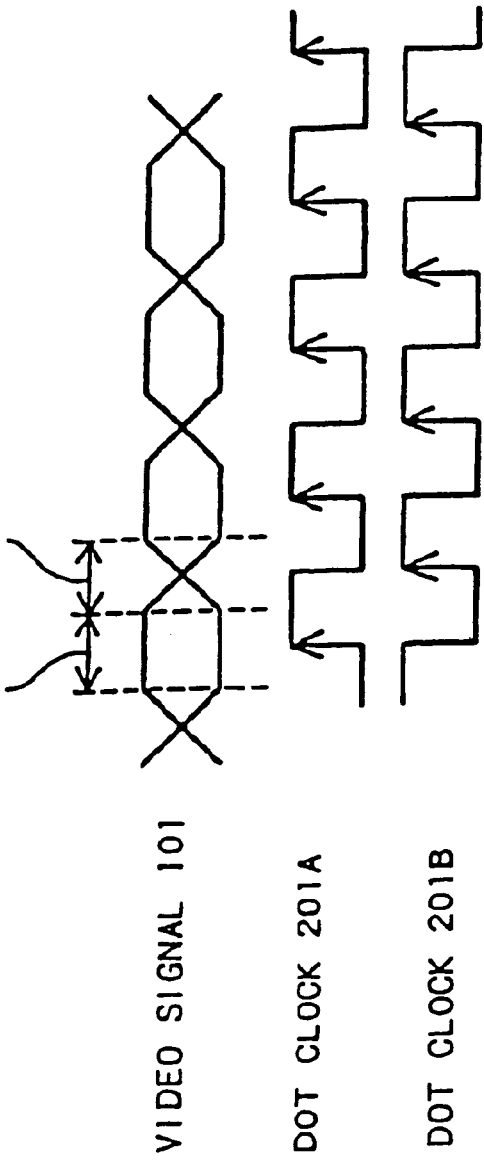
FIGS. 41(a)–41(c) are timing charts showing the relationship between the video signal 101 and the dot clock 201.
Figure 42:
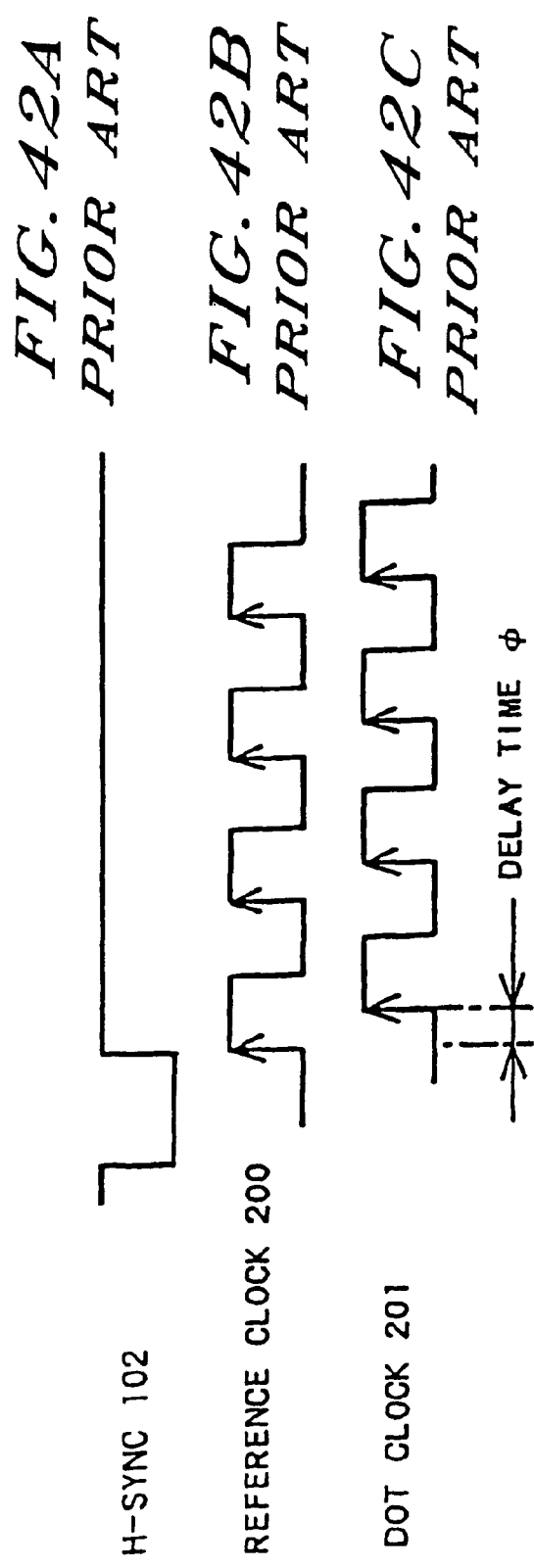
FIGS. 42(a)–42(c) are timing charts showing the relationship between the horizontal synchronizing signal 102, the reference clock 200, and the dot clock 201.

FIG. 39 is a flowchart showing details of the processing executed at step U8 in the seventh embodiment. When the program enters the routine of FIG. 39, at step U31, the CPU 8 obtains an absolute value of the difference between the two image data PD(AD) and PE(AD). When the values of the two image data PD(AD) and PE(AD) coincide with each other at each address AD, the output becomes zero. When they do not coincide with each other, on the contrary, the output may become up to a full-scale value of the digital video signal 110. Comparison between FIGS. 33(a) and 33(b) shows that step-like variations of the address deviation appear at different positions in the two image data PD(AD) and PE(AD). More concretely, the step-like variations of these two image data are shifted from each other by a period corresponding to half the address deviation. The areas in which the magnitudes of the address deviations of the two image data coincide with each other appear in the same cycle as that of the beats. The difference between the two image data PD(AD) and PE(AD) accordingly becomes zero in the cycle of the beats.

As described previously in the sixth embodiment, the phase relationship between the analog video signal 101 and the horizontal synchronizing signal 102 is not defined, and the relative phase of the dot clock 202 to the digital video signal 110 is also not defined. As shown by broken lines in FIGS. 33(a) and 33(b), the address deviation of the image data PD(AD) and PE(AD) might be actually shifted by +1 or −1.

Referring back to the flowchart of FIG. 39, when obtaining the difference between the two image data PD (AD) and PE(AD) at step U31, the CPU 8 uses the following three kinds of the second image data PE: PE(AD) at the same address as that of the first image data PD(AD); PE(AD−1) at a preceding address; and PE(AD+1) at a next address. Namely three difference data F(AD), G(AD), and H(AD) defined by Equations 17 given below are obtained.

$$F(AD) = |PD(AD) - PE(AD - 1)| \quad (17)$$

$$G(AD) = |PD(AD) - PE(AD)|$$

$$H(AD) = |PD(AD) - PE(AD + 1)|$$

At subsequent step U32, the CPU 8 executes binary coding on the three difference data F(AD), G(AD), and H(AD) obtained at step U31 to generate three binary data A'(AD), B'(AD), and C'(AD).

The three difference data A'(AD), B'(AD), and C'(AD) thus obtained are correlation data equivalent to the three output data of the exclusive OR operation, A(AD), B(AD), and C(AD) obtained in the sixth embodiment. Namely the three difference data A'(AD), B'(AD), and C'(AD) have substantially the same patterns as those shown in FIGS. 34(c), 34(d), and 34(e).

Steps U33 through U35 in the flowchart of FIG. 39 are identical with steps U23 through U25 of the sixth embodiment shown in the flowchart of FIG. 36. In accordance with a concrete procedure, the CPU 8 carries out a toggle operation for the two sets of difference data {A'(AD), B'(AD)} and {B'(AD), C'(AD)} and writes the results of the toggle operation into two registers. The CPU 8 then calculates the number of beats Nb from the mean value of the distances between the adjoining inverted points in the data patterns of the register outputs Q1(AD) and Q2(AD).

The seventh embodiment (FIG. 39) calculates the correlation of the two image data PD(AD) with PE(AD) (that is, their difference) at step U31 before binary coding the correlation data F(AD), G(AD), and H(AD) at step U32. The sixth embodiment (FIG. 36) described previously, on the other hand, executes binary coding on the two image data at step U21 before carrying out the correlation analysis operation of the two binary data (that is, the exclusive OR operation) at step U22. Namely the sixth embodiment and the seventh embodiment execute a correlation analysis operation in a narrower sense, such as calculating the difference or exclusive OR, and a binary coding process in different sequences, so as to realize substantially equivalent correlation analysis operations in a broader sense including the binary coding process. A variety of other techniques may be adopted to carry out the correlation analysis operation on the two image data PD(AD) and PE(AD). The correlation analysis operation described above, that is, taking a difference or an exclusive OR, is, however, very simple and thus advantageously gives the results in a very short time.

In both of the sixth and the seventh embodiments described above, the two combinations among the three correlation data A(AD), B(AD), and C(AD) shown in FIGS. 34(c), 34(d), and 34(e) are used to determine the number of beats Nb. The determination of the number of beats Nb may, however, be based on at least one of the three correlation data A(AD), B(AD), and C(AD).

For example, an alternative process includes the steps of: considering the first correlation data A(AD) as binary image data for one line, and expanding pixels having a level of one by a predetermined width (for example, 10 pixels); and choking the same pixels by the same predetermined width. This procedure eliminates small level variations in the correlation data A(AD). The process then calculates the mean distance between the adjoining inverting points in the level pattern from the correlation data thus obtained, in the same manner as step U24 in the flowchart of FIG. 36, so as to determine the number of beats Nb. In a similar manner, the number of beats Nb can be obtained using the second correlation data B(AD) and the third correlation data C(AD), respectively. If the first correlation data A(AD) gives a reliable value of the number of beats Nb (for example, when an average of the correlation data after the spreading and choking process is about 0.5), the processing may be omitted for the second and the third correlation data B(AD) and C(AD).

Another possible process for determining the number of beats Nb neglects level variations equal to or less than a predetermined interval (for example 10 pixels) in the first correlation data A(AD), thereby extracting only the level variations greater than the predetermined interval. This procedure is a kind of filtering process in a broader sense. This alternative process then calculates the mean distance between the adjoining inverted points in the level pattern from the correlation data thus obtained, in the same manner as step U24 in the flowchart of FIG. 36, so as to determine the number of beats Nb.

The sixth and the seventh embodiments described above can automatically determine the optimum multiplication factor in the PLL circuit by processing the image data even when the total number of pixels for one scanning line (that is, the total number of pixels in the horizontal direction including the number of pixels of the blanking area and that of the effective signal area) is unknown, and subsequently generate the desirable dot clock based on the optimum multiplication factor. By sampling the analog video signals 101 by the desirable dot clock, a favorable video image can be displayed on the display device 3 without undesired vertical lines due to the beats or a lack of information.

The above embodiments can be further modified as follows.

A part of the elements realized by hardware in the above embodiments may be implemented by software. Alternatively, a part of the elements realized by software may be implemented by hardware.

The present invention is not restricted to adjustment of the dot clock used for displaying video images represented by the video signals 101 on the display device 3, but it is also applicable to a variety of adjustment procedures of dot clock signals used for processing video signals. For example, the present invention can be applied to adjustment of a dot clock signal used for storing video signals into a memory and to adjustment of a dot clock signal used for outputting video images represented by video signals to a printer.

The phase adjustment process of the dot clock described in the first and the second embodiments and the frequency adjustment process of the dot clock described in the third through the seventh embodiments may be executed separately or in combination. If the phase adjustment process and the frequency adjustment process are to be combined, a preferable procedure first carries out the frequency adjustment process to generate the dot clock having a desirable frequency and then performs the phase adjustment process. This procedure can automatically set the appropriate frequency and phase of the dot clock based on the image data sampled by the dot clock.

The desirable phase of the dot clock depends upon environmental conditions of the apparatus, such as a temperature. The environmental conditions of the apparatus significantly varies especially at the time of starting the apparatus, and the desirable phase of the dot clock varies accordingly. In one preferable embodiment, the phase adjustment process is automatically carried out at constant time intervals (for example, 10 minutes) for a predetermined time period (for example, 30 minutes) after the start of the apparatus. This enables the phase of the dot clock to be automatically re-adjusted with a variation in environmental conditions of the apparatus.

It should be clearly understood that the above embodiments are only illustrative and not restrictive in any sense. The scope and spirit of the present invention are limited only by the terms of the appended claims.

What is claimed is:

1. A method of adjusting a phase of a dot clock signal for a video signal, said method comprising the steps of:

(a) sampling said video signal by a plurality of dot clock signals that are expected to have different phase relationships to said video signal, thereby obtaining plural sets of image data;

(b) carrying out a prescribed operation for each set of image data to obtain a phase-related representing the phase relationship of said each set of image data, and determining a desirable phase for said dot clock signal based on said phase-related indexes of said plural sets of image data; and (c) applying an optimum delay to said dot clock signal to have the desirable phase;

wherein said step (a) comprises the steps of:

multiplying a frequency of a horizontal synchronizing signal of said video signal by a first factor to generate a first dot clock signal, said first factor being different from an appropriate second factor that is to be used for multiplying the frequency of said horizontal synchronizing signal to generate said dot clock signal having the desirable phase, said first dot signal including a plurality of signal phases which can be considered as said plurality of dot signals; and sampling said video signal by said first dot clock signal to obtain first image data on a specific line of the screen; and wherein said step (b) comprises the steps of:
  dividing said first image data into a plurality of first image data blocks;
  calculating values of said function representing sharpness of said plurality of first image data blocks as said phase-related indexes of said plurality of first image data blocks, respectively;
  determining the extreme of said values of said function with respect to said plurality of first image data blocks; and
  selecting a delay corresponding to a specific first image data block related to the extreme of said values of said function as the optimum delay to attain the desirable phase.

2. A method in accordance with claim 1, wherein the delay corresponding to said specific first image data block related to the extreme of said values of said function is determined based on the difference between said first and second factors and on a position of said specific first image data block in said plurality of first image data blocks.

3. A method in accordance with claim 1, wherein
  said optimum delay can be adjusted by a predetermined delay step in said step (c); and
  said step (b) comprises the step of: dividing said first image data over an entirety of said specific line by a divisional number into said plurality of first image data blocks, said divisional number being equal to an integral multiple of a quotient obtained by dividing a difference between said first and second factors by a product of a frequency of said first dot clock signal and the delay step.

4. A method in accordance with claim 1, wherein an absolute value of the difference between said first and second factors is equal to two.

5. A method in accordance with claim 1, wherein said step (a) further comprises the steps of:
  multiplying the frequency of said horizontal synchronizing signal of said video signal by said second factor to generate a second dot clock signal; and
  sampling said video signal by said second dot clock signal to obtain second image data on the specific line of the screen; and wherein
  said step (b) further comprises the steps of:
    dividing said second image data into a plurality of second image data blocks in the same manner as the division of said first image data;
    calculating values of said function representing sharpness of said plurality of second image data blocks; and
    dividing said values of said function for said plurality of first image data blocks by said values of said function for said plurality of second image data blocks, respectively, and setting respective quotients obtained by said dividing as said phase-related indexes corresponding to said plurality of first image data blocks.

6. A method in accordance with claim 5, wherein said step (b) further comprises the step of:
  when said plurality of first image data blocks includes a block whose value of said function is less than a threshold value, carrying out an interpolation on the value of said function for said block with respect to said plurality of first image data blocks and said plurality of second image data blocks prior to said dividing said values of said function.

7. A method of adjusting frequency of a dot clock signal for a video signal, said method comprising the steps of:

(a) multiplying a frequency of a horizontal synchronizing signal of said video signal by a first factor to generate a first dot clock signal;

(b) sampling said video signal by said first dot clock signal to obtain image data;

(c) obtaining a number of beats over one line of said image data;

(d) correcting said first factor with said number of beats, thereby obtaining a desirable second factor; and (e) multiplying the frequency of said horizontal synchronizing signal by said second factor to generate a second dot clock signal that can be used to sample image data without beats, wherein said step (c) comprises the steps of:
  (i) transforming said image data to transformed image data using a symmetrical monotone transformation function that has a symmetrical output level with respect to a predetermined input level; and
  (ii) determining said number of beats based on said transformed image data.

8. A method in accordance with claim 7, wherein said transformation function is non-linear on both sides of said predetermined input level.

9. A method in accordance with claim 8, wherein said transformation function is a quadratic function.

10. A method in accordance with claim 7, wherein said step (i) comprises the step of:
  carrying out a filtering process with a high-pass filter prior to said transformation with said transformation function; and wherein
  said step (ii) comprises the step of:
    carrying out a filtering process with a low-pass filter for said transformed image data prior to said determination of said number of beats.

11. A method in accordance with claim 7, wherein said step (ii) comprises the step of:
  carrying out a frequency analysis on said transformed image data to determine said number of beats.

12. A method in accordance with claim 11, wherein said step of carrying out frequency analysis comprises the step of carrying out fast Fourier transform of said transformed image data to determine a frequency of said beats.

13. A method in accordance with claim 11, wherein said step of carrying out frequency analysis comprises the step of: processing said transformed image data with a plurality of comb filters, and determining a frequency of said beats based on a frequency passing through said plurality of comb filters.

14. A method of adjusting frequency of a dot clock signal for a video signal, said method comprising the steps of:

(a) multiplying a frequency of a horizontal synchronizing signal of said video signal by a first factor to generate a first dot clock signal;

(b) sampling said video signal by said first dot clock signal to obtain image data;

(c) obtaining a number of beats over one line of said image data;

(d) correcting said first factor with said number of beats, thereby obtaining a desirable second factor; and (e) multiplying the frequency of said horizontal synchronizing signal by said second factor to generate a second dot clock signal that can be used to sample image data without beats, wherein said step (b) comprises the step of obtaining first image data and second image data by two kinds of said first dot clock signal having a first phase and a second phase that are different from each other; and wherein said step (c) comprising the step of carrying out a correlation analysis on said first image data and said second image data to determine said number of beats.

15. A method in accordance with claim 14, wherein the difference between said first phase and said second phase is about half a cycle of said first dot clock signal.

16. A method in accordance with claim 14, wherein said step of carrying out correlation analysis comprises the steps of:

(i) allocating a first value to pixel positions having a relatively large difference between said first image data and said second image data while allocating a second value to pixel positions having a relatively small difference between said first image data and said second image data, thereby generating binary data consisting of said first value and said second value; and (ii) processing said binary data to determine said number of beats.

17. A method in accordance with claim 16, wherein said step (i) comprises the step of:

generating at least one of first binary data, second binary data, and third binary data, wherein said first binary data is to be generated by allocating said first value to pixel positions having a relatively large difference between said first image data and forward-shifted second image data obtained by shifting a pixel position of said second image data forward by one pixel and by allocating said second value to pixel positions having a relatively small difference between said first image data and said forward-shifted second image data;

said second binary data is to be generated by allocating said first value to pixel positions having a relatively large difference between said first image data and said second image data and allocating said second value to pixel positions having a relatively small difference between said first image data and said second image data; and said third binary data is to be generated by allocating said first value to pixel positions having a relatively large difference between said first image data and backward-shifted second image data obtained by shifting a pixel position of said second image data backward by one pixel, and by allocating said second value to pixel positions having a relatively small difference between said first image data and said backward-shifted second image data; and wherein said step (ii) comprises the step of determining said number of beats using at least one of said first through third binary data.

18. A method in accordance with claim 17, wherein said step (ii) comprises the steps of:

providing a first pair of binary data including said first and second binary data and a second pair of binary data including said second and third binary data;

executing a toggle operation, with respect to each of said first and second pairs of binary data, using a rise of one binary data of each pair and a rise of the other of each pair to generate two toggled binary data for said first and second pairs of binary data;

selecting one of said two toggled binary data which has an average closer to 0.5; and measuring a number of pulses included in one line of said selected toggled binary data, thereby determining said number of beats.

19. A method in accordance with claim 18, wherein said step of measuring a number of pulses comprises the step of obtaining a mean distance between variation points of said selected toggled binary data and calculating said number of pulses from said mean distance.

20. A method in accordance with claim 17, wherein said step (ii) comprises the steps of:

selecting at least one of said first through third binary data, and deleting an interval between a rise and a fall of said selected binary data that is less than a predetermined value, thereby generating modified binary data;

selecting at lease least one modified binary data which has an average close to 0.5; and measuring a number of pulses included in one line of said selected modified binary data, thereby determining said number of beats.

21. A method in accordance with claim 20, wherein said operation of generating said modified binary data comprises the step of:

carrying out a one-dimensional expansion process on one line of said selected binary data, for expanding one of said first and second values by a predetermined width; and carrying out a one-dimensional contraction process on said binary data after said one-dimensional expansion process, for contracting said one of said first and seconds value by said predetermined width.

22. A method in accordance with claim 20, wherein said step of measuring a number of pulses comprises the step of computing a mean distance between variation points of said modified binary data and calculating said number of pulses from said mean distance.

23. A method in accordance with claim 16, wherein said operation of generating said binary data is implemented by binary-coding two image data used in generating said binary data, respectively, and by obtaining an exclusive OR of the two binary-coded image data.

24. A method in accordance with claim 16, wherein said operation of generating said binary data is implemented by obtaining a difference between two image data used in generating said binary data, and by binary-coding said difference with a predetermined threshold value.

25. A dot clock regeneration circuit for regenerating a dot clock signal to be supplied to a sampling circuit for sampling a video signal, said dot clock regeneration circuit comprising:

a PLL circuit for multiplying a frequency of a horizontal synchronizing signal of said video signal by a predetermined factor to generate a reference clock signal;

a delay circuit for delaying said reference clock signal by a predetermined time to generate said dot clock signal;

memory means for storing at least one line of image data supplied from said sampling circuit; and delay time setting means for controlling a writing process of said image data into said memory means, reading one line of said image data stored in said memory means to carry out a prescribed operation, and setting a delay time in said delay circuit based on the result of said prescribed operation to attain a desirable phase relationship between said video signal and said dot clock signal;

addition means for increasing or decreasing said predetermined factor by a preset value to give an offset, wherein said delay time setting means carries out said prescribed operation for each value of the increased or decreased factor and comprises:
- means for carrying out said prescribed operation on first image data and second image data to determine an optimum delay time to give an optimum phase to said dot clock signal, said first image data being obtained on the basis of a first factor set in said PLL circuit by said addition means, said second image data being obtained on the basis of a second factor set in said PLL circuit; and
- means for carrying out an interpolating operation on said first image data and said second image data with respect to a pixel position which has an image data value no more than a specified level in said first image data;
- wherein said prescribed operation is carried out on a plurality of blocks which is divided from said one line of image data by a divisional number, said divisional number being equal to an integral multiple of a quotient obtained by dividing a difference between said first factor and said second factor by the product of a frequency of said dot clock signal and a delay step in said delay circuit.

26. A method of regenerating a dot clock in a video signal display apparatus, said video signal display apparatus comprising: sampling means for sampling a video signal; clock generation means for multiplying a horizontal synchronizing signal by a predetermined frequency division factor to generate a dot clock; driving means for processing an output of said sampling means; a display device for displaying an image in response to an output of said driving means; display timing means for controlling a display timing of said display device; memory means for storing one line of data output from said sampling means; write timing means for outputting a write enable signal to said memory means; and control means for outputting a write arm signal to said write timing means to cause said memory means to store data of a specific line, reading out said data of the specific line stored in said memory means, carrying out a prescribed operation, and setting a factor in said clock generation means based on the result of said prescribed operation, said method comprising the steps of:
- processing said data read out from said memory means with a high-pass filter;
- carrying out a non-linear operation and subsequently performing fast Fourier transform on the data after the high-pass filter processing;
- obtaining a peak in the result of said fast Fourier transform to determine a frequency of a beat component; and
- setting a factor in said clock generation means so that a frequency of said beat component becomes equal to zero.

27. A method of regenerating a dot clock in a video signal display apparatus, said video signal display apparatus comprising: sampling means for sampling a video signal; clock generation means for multiplying a horizontal synchronizing signal by a predetermined frequency division value to generate a dot clock; driving means for processing an output of said sampling means; a display device for displaying an image in response to an output of said driving means; display timing means for controlling a display timing of said display device; memory means for storing one line of data output from said sampling means; write timing means for outputting a write enable signal to said memory means; and control means for outputting a write arm signal to said write timing means to cause said memory means to store data of a specific line, reading out said data of the specific line stored in said memory means, carrying out a prescribed operation, and setting a factor in said clock generation means based on the result of said prescribed operation, said method comprising the steps of:
- processing the data read out from said memory means with a high-pass filter;
- carrying out a non-linear operation on the data after said high-pass filter processing and subsequently performing an operation with a plurality of comb filters;
- determining a frequency of a beat component based on a combination of integral values of the result of said operation with said plurality of comb filters; and
- setting a factor in said clock generation means so that a frequency of said beat component becomes equal to zero.

28. A method in accordance with claim 26, wherein said non-linear operation is a squaring operation.

29. A method of regenerating a dot clock in a video signal display apparatus, said video signal display apparatus comprising: a PLL circuit for multiplying a horizontal synchronizing signal by a predetermined frequency division factor to generate a dot clock; phase control means for regulating a phase of said dot clock; driving means for processing an output of said sampling means; a display device for displaying an image in response to an output of said driving means; display timing means for controlling a display timing of said display device; memory means for storing one line of data output from said sampling means; write timing means for outputting a write enable signal to said memory means; and control means for outputting a write arm signal to said write timing means to cause said memory means to store data of a specific line, reading out said data of the specific line stored in said memory means, carrying out a prescribed operation, and setting a factor in said clock generation means based on the result of said prescribed operation, said method comprising the steps of:
- setting a provisional factor in said PLL circuit, writing data into said memory means, and subsequently reading out first data from said memory means;
- changing a phase control value in said phase control means, writing data into said memory means, and subsequently reading out second data from said memory means;
- carrying out a correlation analysis on said first data and said second data;
- carrying out a factor determining operation for determining a total number of pixels corresponding to one line of said video signal based on the result of said correlation analysis; and
- setting said total number of pixels as the frequency division factor in said clock generation means.

30. A method in accordance with claim 29, wherein said correlation analysis includes calculating an exclusive OR of third data and fourth data to generate fifth data, said third data being obtained by binary-coding said first data, said fourth data being obtained by binary-coding said second data.

31. A method in accordance with claim 29,wherein said correlation analysis includes calculating a difference between said first data and said second data to generate third data, and binary-coding said third data to generate fourth data.

32. A method in accordance with claim 29, wherein said factor determining operation is executed by the steps of:

calculating a mean distance between adjoining variation points of the resulting data of said correlation operation;

dividing said provisional factor set in said PLL circuit by twice the mean distance and rounding the result of said division to determine a number of beats included in said one line; and calculating the total number of pixels corresponding to said one line from either of a sum of and a difference between said provisional factor set in said PLL circuit and said number of beats.

33. A method in accordance with claim 30, wherein said correlation analysis of said first data and said second data is executed by the steps of:

carrying out a first operation in which said second data whose address is less than an address of said first data by one is used, a second operation in which said second data whose address is equal to the address of said first data is used, and a third operation in which said second data whose address is greater than the address of said first data by one is used;

inverting a virtual register based on variation points of the result of said first operation and the result of said second operation to generate said third data;

inverting another virtual register based on variation points of the result of said second operation and the result of said third operation to generate said fourth data;

selecting one of said third and fourth data which has a mean value closer to half a maximum of said third data and said fourth data, as fifth data; and wherein said factor determining operation includes calculating the total number of pixels corresponding to said one line of said video signal from a mean distance between variation points of said fifth data and said provisional factor set in said PLL circuit.

* * * * *